US012550546B2

(12) United States Patent
Du et al.

(10) Patent No.: US 12,550,546 B2
(45) Date of Patent: Feb. 10, 2026

(54) DISPLAY PANEL AND DISPLAY APPARATUS

(71) Applicants: Chengdu BOE Optoelectronics Technology Co., Ltd., Sichuan Province (CN); BOE Technology Group Co., Ltd., Beijing (CN)

(72) Inventors: Mengmeng Du, Beijing (CN); Biao Liu, Beijing (CN); Junxi Wang, Beijing (CN); Yixiang Yang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 735 days.

(21) Appl. No.: 17/759,701

(22) PCT Filed: Mar. 18, 2020

(86) PCT No.: PCT/CN2020/080079
§ 371 (c)(1),
(2) Date: Jul. 28, 2022

(87) PCT Pub. No.: WO2021/184274
PCT Pub. Date: Sep. 23, 2021

(65) Prior Publication Data
US 2023/0060341 A1    Mar. 2, 2023

(51) Int. Cl.
*H10D 86/60*    (2025.01)
*H10D 86/40*    (2025.01)
*H10K 59/131*   (2023.01)

(52) U.S. Cl.
CPC ......... *H10K 59/131* (2023.02); *H10D 86/451* (2025.01); *H10D 86/60* (2025.01); *H10D 86/441* (2025.01)

(58) Field of Classification Search
CPC .. H10K 59/131; H10K 59/121; H10K 59/124; H10D 86/451; H10D 86/60;
(Continued)

(56) References Cited

U.S. PATENT DOCUMENTS

2014/0002427 A1    1/2014  Yeo et al.
2017/0294502 A1*  10/2017  Ka ....................... H10K 59/131
(Continued)

FOREIGN PATENT DOCUMENTS

CN    105468202 A    4/2016
CN    107293567 A    10/2017
(Continued)

OTHER PUBLICATIONS

Chinese First Office Action, mailed Jan. 15, 2025, from Chinese Pat. App. No. 202080000297.5, 13 pages.
(Continued)

*Primary Examiner* — Sheikh Maruf
(74) *Attorney, Agent, or Firm* — Workman Nydegger

(57) ABSTRACT

Disclosed are a display panel and a display apparatus. The display panel includes: a base substrate including a notch area, a display area and a first non-display area between the notch area and the display area; a first conductive layer on the base substrate; a target insulating layer between the first conductive layer and the base substrate; and a functional layer between the target insulating layer and the base substrate. The display area includes a plurality of sub-pixels, and at least one of the plurality of sub-pixels includes a connecting through hole, wherein the connecting through hole runs through the target insulating layer, and the first conductive layer is electrically connected to the functional layer by the connecting through hole. The first non-display
(Continued)

area includes at least one auxiliary through hole which runs through the target insulating layer and is not filled with a conductive material.

22 Claims, 24 Drawing Sheets

(58) Field of Classification Search
CPC .. H10D 86/441; H10D 86/411; G09G 3/3233; G09G 2300/0426; G09G 2300/0819; G09G 2300/0842; G09G 2300/0861; G09G 2320/0238
USPC .......................................................... 257/72
See application file for complete search history.

(56) References Cited

U.S. PATENT DOCUMENTS

| | | | |
|---|---|---|---|
| 2018/0080121 A1* | 3/2018 | Longrie | C23C 16/56 |
| 2018/0188839 A1* | 7/2018 | Wang | G06F 3/044 |
| 2018/0315840 A1* | 11/2018 | Chui | H01L 21/02312 |
| 2018/0337040 A1* | 11/2018 | Kao | H01L 21/0332 |
| 2020/0211477 A1* | 7/2020 | Lai | G09G 3/3258 |
| 2020/0235194 A1* | 7/2020 | Ito | H10K 59/8731 |
| 2020/0403171 A1* | 12/2020 | Park | H10K 59/38 |
| 2021/0090514 A1* | 3/2021 | Wu | G09G 3/3607 |
| 2021/0173274 A1* | 6/2021 | Shiina | G09F 9/30 |
| 2021/0193757 A1* | 6/2021 | Kim | H10K 50/844 |
| 2021/0211564 A1* | 7/2021 | Liu | G02F 1/136286 |
| 2021/0343823 A1* | 11/2021 | Tanaka | G09F 9/30 |
| 2022/0020960 A1* | 1/2022 | Choi | H10K 59/122 |
| 2022/0115468 A1* | 4/2022 | Huang | H10K 59/1201 |
| 2022/0131106 A1* | 4/2022 | Kwon | H10K 50/15 |
| 2022/0199943 A1* | 6/2022 | Zhang | H10K 59/88 |
| 2022/0328569 A1* | 10/2022 | Park | H10K 77/111 |
| 2022/0328587 A1* | 10/2022 | Lee | H10K 71/00 |
| 2023/0006174 A1* | 1/2023 | Park | H10K 59/8731 |
| 2023/0043478 A1* | 2/2023 | Suzuki | G02F 1/136286 |
| 2023/0089447 A1* | 3/2023 | Yeh | G02F 1/136286 345/206 |
| 2023/0337497 A1* | 10/2023 | Kim | H10K 59/122 |

FOREIGN PATENT DOCUMENTS

| | | |
|---|---|---|
| CN | 109308145 A | 2/2019 |
| CN | 109857279 A | 6/2019 |
| WO | 2019073678 A1 | 4/2019 |

OTHER PUBLICATIONS

European Extended Search Report, dated May 17, 2023, from EP App. 20925377.2, 9 pages.

* cited by examiner

DISPLAY PANEL AND DISPLAY APPARATUS

CROSS REFERENCE TO RELATED APPLICATIONS

This application is a national phase entry under 35 U.S.C. § 371 of International Application No. PCT/CN2020/080079, filed on Mar. 18, 2020, the entire content of which is incorporated herein by reference.

FIELD

Embodiments of the disclosure relate to the technical field of display, in particular to a display panel and a display apparatus.

BACKGROUND

Electroluminescent diodes such as Organic Light Emitting Diodes (OLEDs), Quantum Dot Light Emitting Diodes (QLEDs) and Micro Light Emitting Diodes (Micro LEDs) are self-luminous with low energy consumption, etc., thereby becoming one of hotspots in the field of application research of electroluminescent display apparatuses at present.

SUMMARY

A display panel according to embodiments of the disclosure includes:
  a base substrate, including a notch area, a display area and a first non-display area, wherein the first non-display area is located between the notch area and the display area;
  a first conductive layer, disposed on the base substrate;
  a target insulating layer, disposed between the first conductive layer and the base substrate; and
  a functional layer, located between the target insulating layer and the base substrate;
  where the display area includes a plurality of sub-pixels, a plurality of data lines, a plurality of scanning lines and a plurality of light-emitting control lines, wherein at least one of the plurality of sub-pixels includes: a connecting through hole, the connecting through hole runs through the target insulating layer, and the first conductive layer is electrically connected to the functional layer through the connecting through hole;
  the first non-display area includes: at least one auxiliary through hole, a plurality of data transmission lines, a plurality of scanning transmission lines and a plurality of light-emitting transmission lines, wherein at least one of the plurality of data lines is electrically connected to at least one of the plurality of data transmission lines, at least one of the plurality of scanning lines is electrically connected to at least one of the plurality of scanning transmission lines, and at least one of the plurality of light-emitting control lines is electrically connected to at least one of the plurality of light-emitting transmission lines; and
  in the first non-display area, an auxiliary region is formed by rounding of at least two types of transmission lines among the plurality of data transmission lines, the plurality of scanning transmission lines and the plurality of light-emitting transmission lines, and the auxiliary through hole is located in the auxiliary region, runs through the target insulating layer and is not filled with a conductive material.

Optionally, in embodiments of the disclosure, the display panel includes:
  a semiconductor layer, located between the base substrate and the first conductive layer;
  a first gate insulating layer, located between the semiconductor layer and the first conductive layer;
  a third conductive layer, located between the first gate insulating layer and the first conductive layer;
  a second gate insulating layer, located between the third conductive layer and the first conductive layer;
  a fourth conductive layer, located between the second gate insulating layer and the first conductive layer; and
  an interlayer dielectric layer, located between the fourth conductive layer and the first conductive layer;
  where at least one of the plurality of sub-pixels includes: a first connecting through hole, a second connecting through hole and a third connecting through hole. The first connecting through hole runs through the first gate insulating layer, the second gate insulating layer and the interlayer dielectric layer; the second connecting through hole runs through the second gate insulating layer and the interlayer dielectric layer; the third connecting through hole runs through the interlayer dielectric layer;
  the first conductive layer is electrically connected to the semiconductor layer through the first connecting through hole;
  the first conductive layer is electrically connected to the third conductive layer through the second connecting through hole;
  the first conductive layer is electrically connected to the fourth conductive layer through the third connecting through hole; and
  the auxiliary through hole is filled with an insulating material.

Optionally, in embodiments of the disclosure, the display panel further includes:
  an interlayer insulating layer, disposed on a side of the first conductive layer facing away from the base substrate; and
  the auxiliary through hole is filled with a material of the interlayer insulating layer.

Optionally, in embodiments of the disclosure, the functional layer includes the semiconductor layer;
  the target insulating layer includes: the first gate insulating layer, the second gate insulating layer and the interlayer dielectric layer;
  the connecting through hole includes the first connecting through hole; and
  the auxiliary through hole includes a first auxiliary through hole, wherein the first auxiliary through hole runs through the first gate insulating layer, the second gate insulating layer and the interlayer dielectric layer, and a material filling the first auxiliary through hole runs through the first gate insulating layer, the second gate insulating layer and the interlayer dielectric layer.

Optionally, in embodiments of the disclosure, a distribution density of the first auxiliary through hole is smaller than or approximately equal to a distribution density of the first connecting through hole.

Optionally, in embodiments of the disclosure, an orthographic projection of the first auxiliary through hole on the base substrate does not overlap with orthographic projections of the semiconductor layer, the third conductive layer, the fourth conductive layer and the first conductive layer on the base substrate.

Optionally, in embodiments of the disclosure, the functional layer includes the third conductive layer;
the target insulating layer includes: the second gate insulating layer and the interlayer dielectric layer;
the connecting through hole includes the second connecting through hole; and
the auxiliary through hole includes a second auxiliary through hole, wherein the second auxiliary through hole runs through the second gate insulating layer and the interlayer dielectric layer, and a material filling in the second auxiliary through hole runs through the second gate insulating layer and the interlayer dielectric layer.

Optionally, in embodiments of the disclosure, a distribution density of the second auxiliary through hole is smaller than or approximately equal to a distribution density of the second connecting through hole.

Optionally, in embodiments of the disclosure, an orthographic projection of the second auxiliary through hole on the base substrate does not overlap with the orthographic projections of the third conductive layer, the fourth conductive layer and the first conductive layer on the base substrate.

Optionally, in embodiments of the disclosure, the functional layer includes the fourth conductive layer;
the target insulating layer includes: the interlayer dielectric layer;
the connecting through hole includes the third connecting through hole; and
the auxiliary through hole includes a third auxiliary through hole, wherein the third auxiliary through hole runs through the interlayer dielectric layer, and a material filling the third auxiliary through hole runs through the interlayer dielectric layer.

Optionally, in embodiments of the disclosure, a distribution density of the third auxiliary through hole is smaller than or approximately equal to a distribution density of the third connecting through hole.

Optionally, in embodiments of the disclosure, an orthographic projection of the third auxiliary through hole on the base substrate does not overlap with the orthographic projections of the fourth conductive layer and the first conductive layer on the base substrate.

Optionally, in embodiments of the disclosure, the plurality of data transmission lines include a plurality of first data transmission lines; the first conductive layer includes the plurality of data lines and the plurality of first data transmission lines; and the interlayer insulating layer has a plurality of first data through holes.

The display panel further includes:
a second conductive layer, disposed on one side of the interlayer insulating layer facing away from the base substrate and including a plurality of first data connecting portions;
at least one of the plurality of first data connecting portions is electrically connected to at least one of the plurality of data lines and at least one of the plurality of first data transmission lines respectively through the first data through holes.

Optionally, in embodiments of the disclosure, the plurality of data transmission lines include a plurality of second data transmission lines;
the second conductive layer further includes: the plurality of second data transmission lines, wherein the plurality of second data transmission lines and the first data connecting portions are arranged at intervals;
the interlayer insulating layer further includes: a plurality of second data through holes; and
the plurality of data lines include a plurality of first data lines and a plurality of second data lines, wherein one of the first data lines is electrically connected to one of the first data transmission lines through the corresponding first data connecting portion, and one of the second data lines is electrically connected to one of the second data transmission lines through the corresponding second data through hole.

Optionally, in embodiments of the disclosure, the third conductive layer includes the plurality of scanning lines and the plurality of light-emitting control lines, and the plurality of scanning lines include a plurality of first scanning lines and a plurality of second scanning lines;
the display area further includes the plurality of sub-pixels, wherein one row of sub-pixels corresponds to one of the first scanning lines and one of the second scanning lines, and in every two adjacent rows of sub-pixels, the second scanning line to which a first row of sub-pixels corresponds is electrically connected to the first scanning line to which the second row of sub-pixels corresponds; and
one row of sub-pixels corresponds to one of the light-emitting control lines; and the light-emitting control lines to which two adjacent rows of sub-pixels correspond are electrically connected to each other.

Optionally, in embodiments of the disclosure, the first conductive layer further includes: a plurality of first scanning connecting portions which are insulated and spaced from the data lines and the first data transmission lines; the second scanning line to which a $(q-1)^{th}$ row of sub-pixels corresponds and the first scanning line to which a $q^{th}$ row of sub-pixels corresponds are electrically connected through at least one of the first scanning connection portions, and q is an integer;
a second insulating layer includes a plurality of first scanning through holes and a plurality of second scanning through holes; and
a first terminal of each first scanning connecting portion is electrically connected to the corresponding first scanning line through at least one of the plurality of first scanning through holes, and a second terminal of the each first scanning connecting portion is electrically connected to the corresponding second scanning line through at least one of the plurality of second scanning through holes.

Optionally, in embodiments of the disclosure, all rows of sub-pixels include rows of sub-pixels of a first type; at least one row of sub-pixels among the rows of sub-pixels of the first type corresponds to at least one of the first data connecting portions; and
as for the first scanning line, the second scanning line and the first data connecting portion to which the same row of sub-pixels corresponds, an orthographic projection of the first data connecting portion on the base substrate does not overlap with orthographic projections of the first scanning connection portion to which the first scanning line corresponds on the base substrate and the first scanning connecting portion to which the second scanning line corresponds on the base substrate.

Optionally, in embodiments of the disclosure, as for the first scanning line, the second scanning line and the first data connecting portion to which the same row of sub-pixels corresponds, the orthographic projection of the first data connecting portion on the base substrate is located between an orthographic projection of the first scanning through hole to which the first scanning line corresponds on the base substrate and an orthographic projection of the second scanning through hole to which the second scanning line corresponds on the base substrate.

Optionally, in embodiments of the disclosure, as for the first scanning line, the second scanning line and the first data connecting portion to which the same row of sub-pixels corresponds, a connected line between a center of the orthographic projection of the first scanning through hole to which the first scanning line corresponds on the base substrate and a center of the orthographic projection of the second scanning through hole to which the second scanning line corresponds on the base substrate overlaps with the orthographic projection of the first data connecting portion on the base substrate.

Optionally, in embodiments of the disclosure, as for the first scanning line and the first data connecting portion to which the same row of sub-pixels corresponds as well as the first data line and the first data transmission line which are electrically connected to each other by using the first data connecting portion, the orthographic projection of the first data connecting portion on the base substrate and the orthographic projection of the first scanning line on the base substrate have an overlapping region, and orthographic projections of the first data line on the base substrate and the first data transmission line on the base substrate do not overlap with the orthographic projection of the first scanning line on the base substrate.

Optionally, in embodiments of the disclosure, as for the first scanning line and the first data connecting portion to which the same row of sub-pixels corresponds, an orthographic projection of an edge region of the first data connecting portion on the base substrate and the orthographic projection of the first scanning line on the base substrate have an overlapping region.

Optionally, in embodiments of the disclosure, as for the first scanning line and the first data connecting portion to which the same row of sub-pixels corresponds, an orthographic projection of a center region of the first data connecting portion and the orthographic projection of the first scanning line on the base substrate have an overlapping region.

Optionally, in embodiments of the disclosure, a part of rows of sub-pixels in the rows of sub-pixels of the first type correspond to two of the first data connecting portions, as for the first scanning line, the second scanning line and the two first data connecting portions to which the same row of sub-pixels corresponds, orthographic projections of the two first data connecting portions on the base substrate and an orthographic projection of the first scanning line on the base substrate have an overlapping region, and the orthographic projections of the two first data connecting portions on the base substrate do not overlap with an orthographic projection of the second scanning line on the base substrate.

Optionally, in embodiments of the disclosure, as for the first scanning line, the second scanning line and the two first data connecting portions to which the same row of sub-pixels corresponds;
- an orthographic projection of a one of the two first data connecting portions on the base substrate is close to an orthographic projection of the first scanning through hole to which the first scanning line corresponds on the base substrate; and/or
- an orthographic projection of a second one of the two first data connecting portions on the base substrate is close to an orthographic projection of the second scanning through hole to which the second scanning line corresponds on the base substrate.

Optionally, in embodiments of the disclosure, the second conductive layer further includes: a plurality of second data connecting portions, wherein one of the second data transmission lines is directly electrically connected to at least one of the second data connecting portions, and the second data connecting portion is electrically connected to one of the second data lines through the corresponding second data through hole.

Optionally, in embodiments of the disclosure, the first data lines and the second data lines are arranged alternately in a first direction; and projections of the first data connecting portions and the second data connecting portions on a straight line extending in the first direction are arranged alternately.

Optionally, in embodiments of the disclosure, all the rows of sub-pixels include rows of sub-pixels of a second type, and the rows of sub-pixels of the second type are different from the rows of sub-pixels of the first type;
- at least one row of sub-pixels among the rows of sub-pixels of the second type corresponds to at least one of the second data connecting portions; and
- as for the first scanning line and the second data connecting portion to which the same row of sub-pixels corresponds as well as the second data line and the second data transmission line which are electrically connected by using the second data connecting portion, an orthographic projection of the second data connecting portion on the base substrate and an orthographic projection of the first scanning line on the base substrate have an overlapping region, and orthographic projections of the second data line and the second data transmission line on the base substrate do not overlap with an orthographic projection of the first scanning line on the base substrate.

Optionally, in embodiments of the disclosure, as for the row of sub-pixels corresponding to two of the first data connecting portions, the row of sub-pixels further correspond to one of the second data connecting portions; and
- as for the first scanning line and the second data connecting portion to which the same row of sub-pixels corresponds as well as the second data line and the second data transmission line which are electrically connected by using the second data connecting portion, the orthographic projection of the second data connecting portion on the base substrate and the orthographic projection of the first scanning line on the base substrate have an overlapping region, and the orthographic projections of the second data line and the second data transmission line on the base substrate do not overlap with the orthographic projection of the first scanning line on the base substrate.

Optionally, in embodiments of the disclosure, the first conductive layer further includes: a plurality of first light-emitting connecting portions insulated and spaced from the data lines and the first data transmission lines, and the light-emitting control lines which are electrically connected to one another correspond to at least one of the first light-emitting connecting portions;
- the second insulating layer includes: a plurality of first light-emitting through holes and a plurality of second light-emitting through holes; and
- a first terminal of the first light-emitting connecting portion is electrically connected to one corresponding light-emitting control line through at least one of the plurality of first light-emitting through holes, and a second terminal of the first light-emitting connecting portion is electrically connected to another corresponding light-emitting control line through at least one of the plurality of second light-emitting through holes.

Optionally, in embodiments of the disclosure, the plurality of scanning transmission lines include: a plurality of first scanning transmission lines and a plurality of second scanning transmission lines, and the light-emitting transmission lines include a plurality of first light-emitting transmission lines and a plurality of second light-emitting transmission lines;

the third conductive layer further includes the plurality of first scanning transmission lines and the plurality of first light-emitting transmission lines located in the first non-display area, and the first scanning transmission lines and the first light-emitting transmission lines are arranged at intervals;

a part of the first scanning lines and the second scanning lines which are electrically connected to one another are directly and correspondingly electrically connected to one of the first scanning transmission lines, and a part of the light-emitting control lines which are electrically connected to one another are directly electrically connected to one of the first light-emitting transmission lines;

the fourth conductive layer further includes the plurality of scanning transmission lines and the plurality of second light-emitting transmission lines located in the first non-display area, and the second scanning transmission lines and the second light-emitting transmission lines are arranged at intervals;

the interlayer dielectric layer further includes a plurality of third scanning through holes and a plurality of third light-emitting through holes;

the rest of first scanning lines and second scanning lines which are electrically connected to one another correspond to one of the second scanning transmission lines, and the first scanning connecting portion is further electrically connected to the second scanning transmission line through the third scanning through hole; and the rest of light-emitting control lines which are electrically connected to one another correspond to one of the second light-emitting transmission lines, and the first light-emitting connecting portion is further electrically connected to the second light-emitting transmission line through the third light-emitting through holes.

Optionally, in embodiments of the disclosure, the plurality of scanning transmission lines include: a plurality of third scanning transmission lines, and the light-emitting transmission lines include a plurality of third light-emitting transmission lines;

the fourth conductive layer includes the plurality of third scanning transmission lines located in the first non-display area;

the interlayer dielectric layer includes a plurality of fourth scanning through holes;

the first scanning lines and the second scanning lines which are electrically connected to one another correspond to one of the third scanning transmission lines, and the first scanning connecting portion is further electrically connected to the third scanning transmission line through the fourth scanning through holes; and the third conductive layer further includes the third light-emitting transmission lines located in the first non-display area, and the light-emitting control lines which are electrically connected to one another are directly electrically connected to one of the third light-emitting transmission lines.

Optionally, in embodiments of the disclosure, the plurality of scanning transmission lines include: a plurality of fourth scanning transmission lines, and the light-emitting transmission lines include a plurality of fourth light-emitting transmission lines;

the fourth conductive layer includes the plurality of fourth light-emitting transmission lines located in the first non-display area;

the interlayer dielectric layer includes a plurality of fourth light-emitting through holes;

the light-emitting control lines which are electrically connected to one another correspond to one of the fourth light-emitting transmission lines, and the first light-emitting connecting portion is further electrically connected to the fourth light-emitting transmission line through the fourth light-emitting through holes; and the third conductive layer further includes the fourth scanning transmission lines located in the first non-display area, and the first scanning lines and the second scanning lines which are electrically connected to one another are directly electrically connected to one of the fourth scanning transmission lines.

Optionally, in embodiments of the disclosure, as for the light-emitting control line, the second scanning line and the second data connecting portion to which the same row of sub-pixels corresponds, the orthographic projection of the second data connecting portion on the base substrate is located between the orthographic projection of the second scanning through hole to which the second scanning line corresponds on the base substrate and an orthographic projection of the first light-emitting through hole to which the light-emitting control line corresponds on the base substrate.

Embodiments of the disclosure further provide a display apparatus, including the above display panel.

DETAILED DESCRIPTION

In order to make the objectives, technical solutions and advantages of the embodiments of the disclosure clearer, the technical solutions of the embodiments of the disclosure will be described clearly and completely below in combination with the accompanying drawings of the embodiments of the disclosure. Obviously, the described embodiments are part of embodiments of the disclosure and not all of the embodiments. Moreover, in the absence of conflict, the embodiments in the disclosure and features in the embodiments may be combined with each other. On the basis of the described embodiments in the disclosure, all other embodiments obtained by those ordinarily skilled in the art without inventive efforts should fall within the protection scope of the disclosure.

Unless otherwise defined, technical or scientific terms used in the disclosure should have a general meaning understood by persons with general skills in the field to which the disclosure belongs. "First", "second" and similar words used in the disclosure do not represent any sequence, quantity or importance, and are only used to distinguish different components. "Include" or "comprise" and similar words imply that an element or item appearing before it covers elements or items and their equivalents listed after the word without excluding other elements or items. "Connect" or "be connected" and similar words are not only limited to physical or mechanical connection, but may include electrical connection, either direct or indirect.

It should be noted that sizes and shapes of all diagrams in the accompanying drawings do not reflect the true proportion, and only aim to illustrate the contents of the disclosure. Moreover, the same or similar labels throughout indicate the same or similar elements or elements having the same or similar functions.

With development of a display technology, compared with a common display screen, a full screen can greatly improve a visual effect of a viewer because of its large screen-to-body ratio and ultra-narrow bezel, thereby being of wide interest. In general, in a display apparatus such as a mobile phone with the full screen, in order to realize functions of taking a selfie and making a call, a front camera, a receiver and the like are usually arranged on the front surface of the display apparatus. A notch area A2 for arranging the front camera, the receiver and other devices is arranged generally in a display panel. However, due to existence of the notch area A2, scanning lines and data lines need to be arranged by winding according to the notch area A2, which causes a coupling effect between the scanning lines and the data lines, thus signal interference easily occurs to influence the display effect.

In view of this, embodiments of the disclosure provide a display panel, which can reduce the coupling effect between the scanning lines and the data lines, reduce signal interference and improve the display effect.

Figure 1:
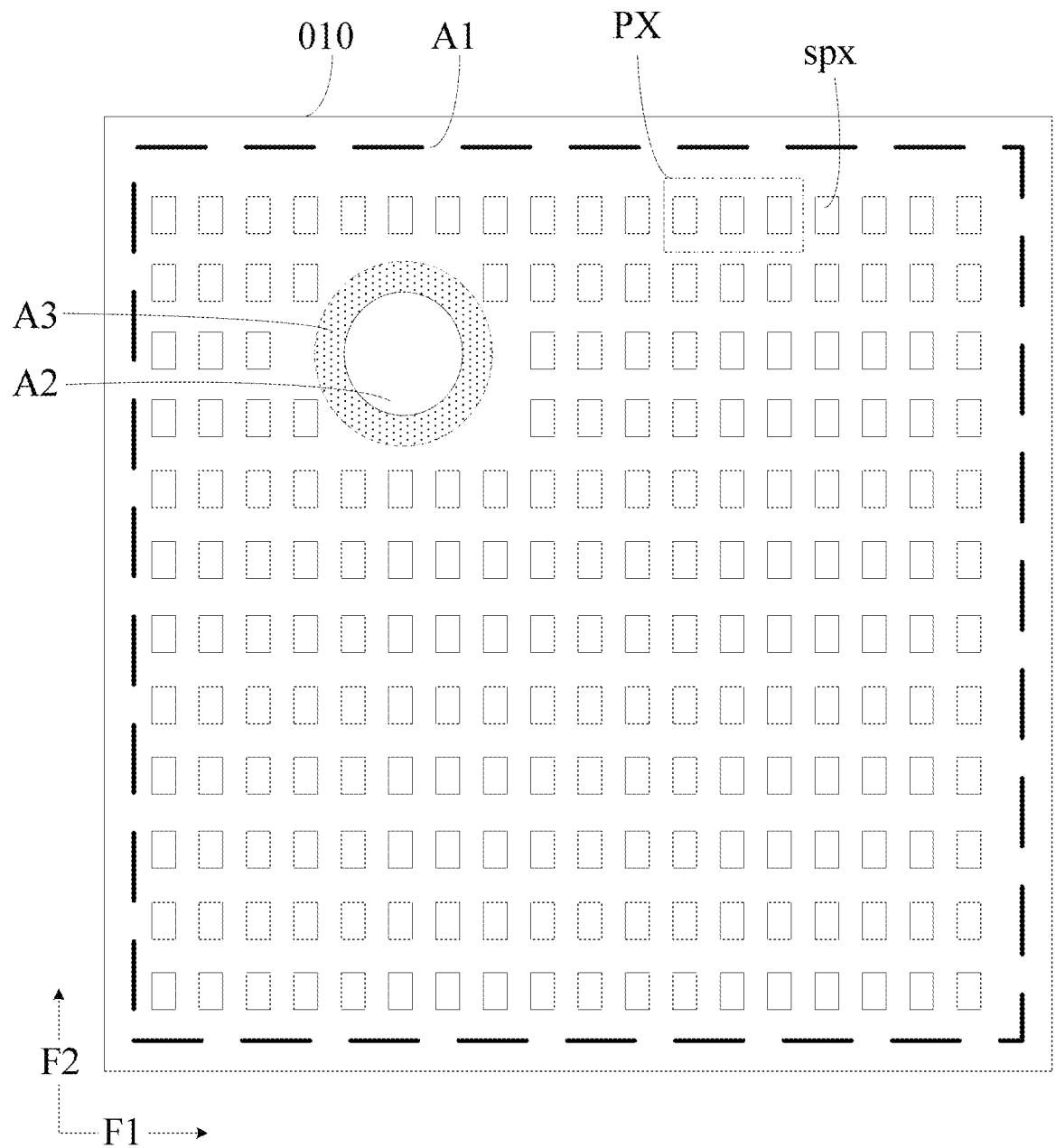
FIG. 1 is a schematic structural diagram of a display panel according to some embodiments of the disclosure.

As shown in FIG. 1, the display panel provided by embodiments of the disclosure may include: a base substrate 010. The base substrate 010 may include a notch area A2, a display area A1 and a first non-display area A3, and the first non-display area A3 is located between the notch area A2 and the display area A1. The base substrate 010 may be a glass substrate, a flexible substrate, a silicon substrate, etc., which is not limited here. When the display panel is applied to the display apparatus, devices such as a camera, a receiver, etc. are usually further provided. Hence, in order to arrange the devices such as the camera, the receiver, etc., the notch area A2 may be a hollow-out region of the base substrate 010. For example, during actual fabrication, a position, corresponding to the notch area A2, in the base substrate 010 is holed in a cutting mode so as to form the hollow-out region for arranging the devices such as the camera, the receiver, etc. in the display apparatus. Or, the base substrate 010 is not cut, lines on the base substrate 010 bypass, so that the position corresponding to the notch area A2 is a transparent region to form the notch area A2.

During actual application, the display panel may generally further include a bezel region surrounding the display area A1. Elements such as an electrostatic discharge circuit and a gate drive circuit may be arranged in the bezel region. Of course, the bezel region may not be arranged in the display panel, which may be designed and determined according to demands of actual application environments and will not be limited here.

Figure 2:
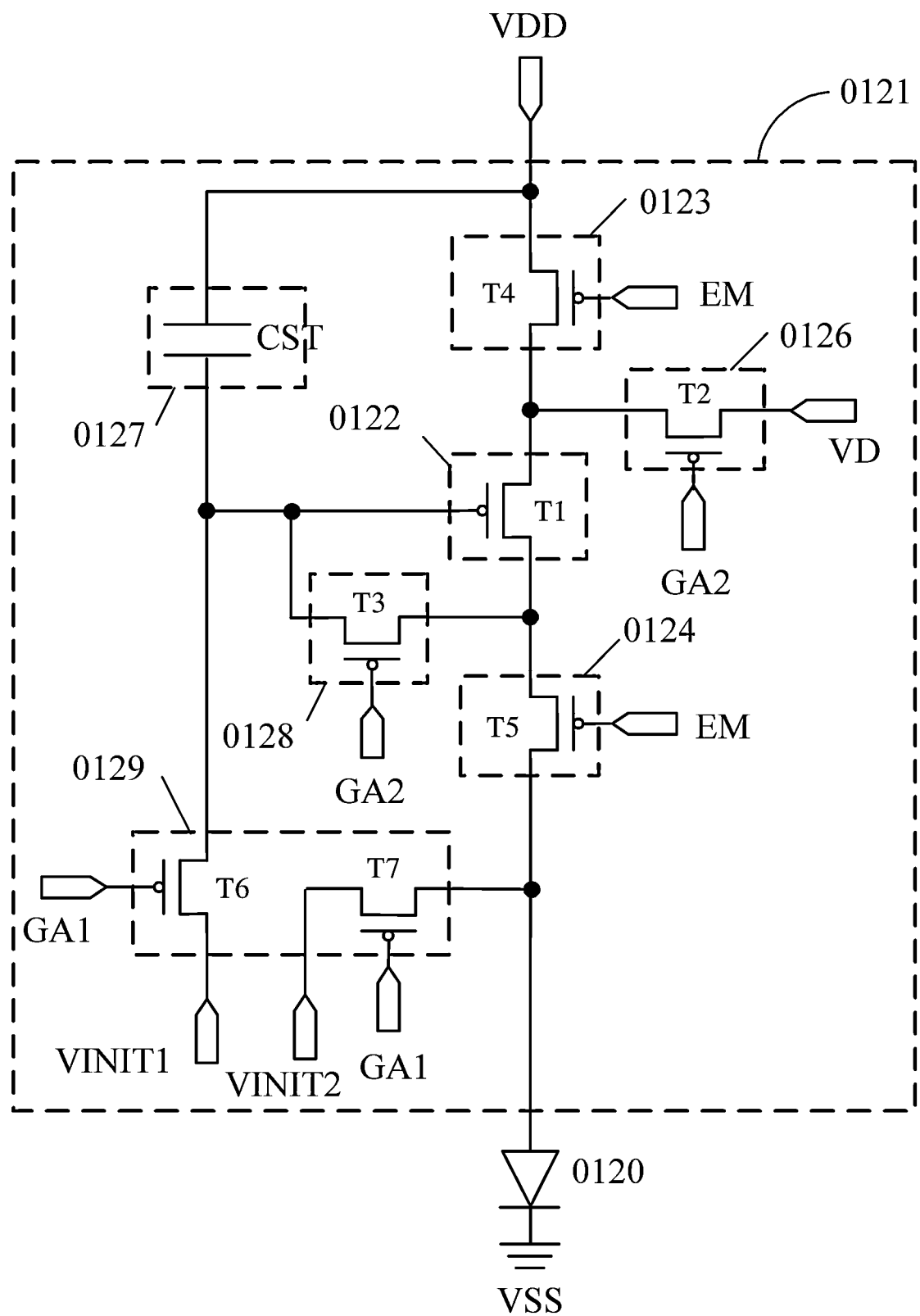
FIG. 2 is a schematic structural diagram of a circuit in some sub-pixels according to some embodiments of the disclosure.

During specific implementation, in embodiments of the disclosure, as shown in FIG. 1, the display area A1 may further include a plurality of pixel units PX arranged in array. The pixel units PX may include a plurality of sub-pixels spx. The sub-pixels spx may be arranged in the display area A1 in array. Exemplarily, as shown in FIG. 1 and FIG. 2, a sub-pixel spx may include: a pixel driving circuit 0121 and a light-emitting device 0120. The pixel driving circuit 0121 has a transistor and a capacitor, an electrical signal is generated through interaction of the transistor and the capacitor, and the generated electrical signal is input into a first light-emitting electrode of the light-emitting device 0120. A corresponding voltage is applied to a second light-emitting electrode of the light-emitting device 0120 so as to drive the light-emitting device 0120 to emit light.

As shown in FIG. 2, the pixel driving circuit 0121 may include: a driving control circuit 0122, a first light-emitting control circuit 0123, a second light-emitting control circuit 0124, a data writing circuit 0126, a storage circuit 0127, a threshold compensation circuit 0128 and a reset circuit 0129.

The driving control circuit 0122 may include a control terminal, a first terminal and a second terminal. The driving control circuit 0122 is configured to provide a driving current for the light-emitting device 0120 which drives the light-emitting device 0120 to emit light. For example, the first light-emitting control circuit 0123 is connected with the first terminal of the driving control circuit 0122 and a first voltage terminal VDD. The driving control circuit 0122 is configured to connect or disconnect the driving control circuit 0122 and the first voltage terminal VDD.

The second light-emitting control circuit 0124 is electrically connected to the second terminal of the driving control circuit 0122 and the first light-emitting electrode of the light-emitting device 0120. The second light-emitting control circuit 0124 is configured to connect or disconnect the driving control circuit 0122 and the light-emitting device 0120.

The data writing circuit 0126 is electrically connected to the first terminal of the driving control circuit 0122. The second light-emitting control circuit 0124 is configured to write a signal on the data line VD into the storage circuit 0127 under control of a signal on the scanning line GA2.

The storage circuit 0127 is electrically connected to the control terminal of the driving control circuit 0122 and the first voltage terminal VDD. The storage circuit 0127 is configured to store a data signal.

The threshold compensation circuit 0128 is electrically connected to the control terminal and the second terminal of the driving control circuit 0122. The threshold compensation circuit 0128 is configured to perform threshold compensation on the driving control circuit 0122.

The reset circuit 0129 is electrically connected to the control terminal of the driving control circuit 0122 and the first light-emitting electrode of the light-emitting device 0120. The reset circuit 0129 is configured to reset the control terminal of the driving control circuit 0122 and the first light-emitting electrode of the light-emitting device 0120 under control of a signal in a gate line GA1.

The light-emitting device 0120 may include the first light-emitting electrode, a light-emitting functional layer and a second light-emitting electrode which are arranged in stack. Exemplarily, the first light-emitting electrode may be an anode and the second light-emitting electrode may be a cathode. The light-emitting functional layer may include a light-emitting layer. Furthermore, the light-emitting functional layer may further include a hole injection layer, a hole transmission layer, the light-emitting layer, an electron transmission layer, an electron injection layer and other film layers. Of course, during actual application, the light-emitting device 0120 may be designed and determined according to demands of actual application environments, which is not limited here.

Exemplarily, as shown in FIG. 2, the driving control circuit 0122 includes: a driving transistor T1, the control terminal of the driving control circuit 0122 includes a gate of the driving transistor T1, the first terminal of the driving control circuit 0122 includes a first electrode of the driving transistor T1, and the second terminal of the driving control circuit 0122 includes a second electrode of the driving transistor T1.

Exemplarily, as shown in FIG. 2, the data writing circuit 0126 includes a data writing transistor T2. The storage circuit 0127 includes a storage capacitor CST. The threshold compensation circuit 0128 includes a threshold compensation transistor T3. The first light-emitting control circuit 0123 includes a first light-emitting control transistor T4. The second light-emitting control circuit 0124 includes a second light-emitting control transistor T5. The reset circuit 0129 includes a first reset transistor T6 and a second reset transistor T7.

Specifically, a first electrode of the data writing transistor T2 is electrically connected to the first electrode of the driving transistor T1, a second electrode of the data writing transistor T2 is electrically connected to the data line VD so as to receive a data signal, and a gate of the data writing transistor T2 is electrically connected to a second scanning line GA2 so as to receive a scanning signal.

A first electrode of the storage capacitor CST is electrically connected to the first voltage terminal VDD, and a second electrode of the storage capacitor CST is electrically connected to the gate of the driving transistor T1.

A first electrode of the threshold compensation transistor T3 is electrically connected to the second electrode of the driving transistor T1, a second electrode of the threshold compensation transistor T3 is electrically connected to the gate of the driving transistor T1, and a gate of the threshold compensation transistor T3 is electrically connected to the second scanning line GA2 so as to receive a compensation control signal.

A first electrode of the first reset transistor T6 is electrically connected to a first reset signal line VINIT1 so as to receive a first reset signal, a second electrode of the first reset transistor T6 is electrically connected to the gate of the driving transistor T1, and the gate of the first reset transistor T6 is electrically connected to a first scanning line GA1 so as to receive a control signal.

A first electrode of the second reset transistor T7 is electrically connected to a second reset signal line VINIT2 so as to receive a second reset signal, a second electrode of the second reset transistor T7 is electrically connected to the first light-emitting electrode of the light-emitting device 0120, and a gate of the second reset transistor T7 is electrically connected to the first scanning line GA1 so as to receive the control signal.

A first electrode of the first light-emitting control transistor T4 is electrically connected to the first voltage terminal VDD, a second electrode of the first light-emitting control transistor T4 is electrically connected to the first electrode of the driving transistor T1, and a gate of the first light-emitting control transistor T4 is electrically connected to a light-emitting control line EM so as to receive a light-emitting control signal.

A first electrode of the second light-emitting control transistor T5 is electrically connected to the second electrode of the driving transistor T1, a second electrode of the second light-emitting control transistor T5 is electrically connected to the first light-emitting electrode of the light-emitting device 0120, and a gate of the second light-emitting control transistor T5 is electrically connected to the light-emitting control line EM so as to receive the light-emitting control signal.

The second light-emitting electrode of the light-emitting device 0120 is electrically connected to a second voltage terminal VSS. The first electrodes and the second electrodes of the above transistors may be determined to be source electrodes or drain electrodes, which is not limited here.

Exemplarily, one of the first voltage terminal VDD and the second voltage terminal VSS is a high-voltage terminal, and the other one of them is a low-voltage terminal. For example, in the embodiment shown in FIG. 2, the first voltage terminal VDD is a voltage source so as to output a first voltage in constant, the first voltage being a positive voltage, and the second voltage terminal VSS may be a voltage source to output a second voltage in constant, and the second voltage being a negative voltage, etc. For example, in some examples, the second voltage terminal VSS may be grounded.

It needs to be noted that in embodiments of the disclosure, the pixel driving circuit in the sub-pixels spx may also be a structure including the other quantity of transistors beside a structure shown in FIG. 2, which is not limited by embodiments of the disclosure.

Figure 3:
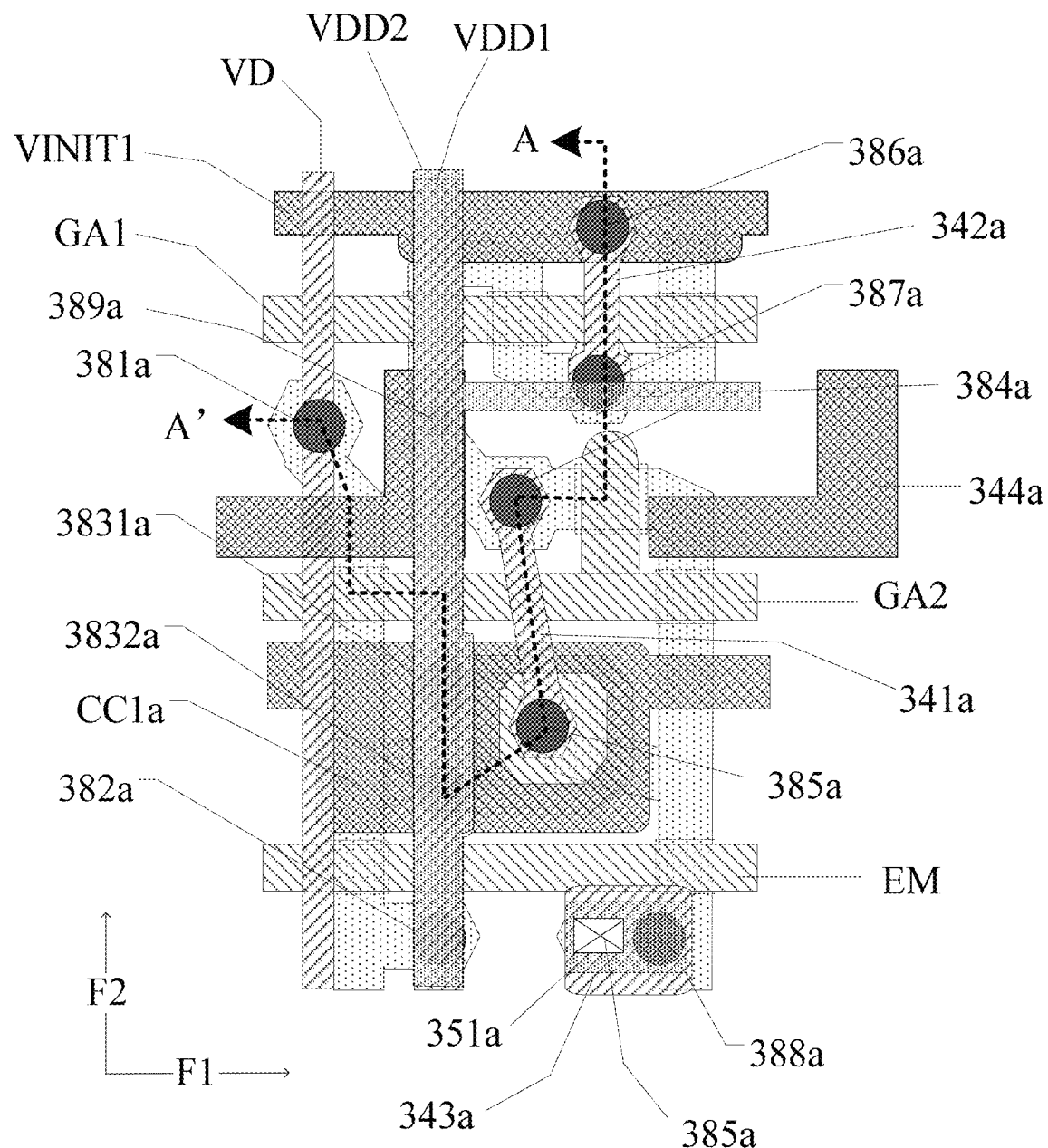
FIG. 3 is a schematic structural diagram showing a layout in some sub-pixels according to some embodiments of the disclosure.

FIG. 3 is a schematic structural diagram of a layout of a pixel driving circuit provided by some embodiments of the disclosure. FIG. 4A to FIG. 4E are schematic diagrams of all layers of the pixel driving circuit provided by some embodiments of the disclosure. The embodiments as shown in FIG. 3 to FIG. 4E take a pixel driving circuit of one sub-pixel spx for example. FIG. 3 to FIG. 4E further show the first scanning line GA1, the second scanning line GA2 and the first reset signal line VINIT1 (the first reset signal line VINIT1 and the second reset signal line VINIT2 are the same signal line, so the first reset signal line VINIT1 is shown) electrically connected to the pixel driving circuit 0121, the light-emitting control line EM, the data line VD, and a first power source signal line VDD1 and a second power source signal line VDD2 electrically connected to the first voltage terminal VDD. The first power source signal line VDD1 and the second power source signal line VDD2 are electrically connected to each other.

Figure 4A:
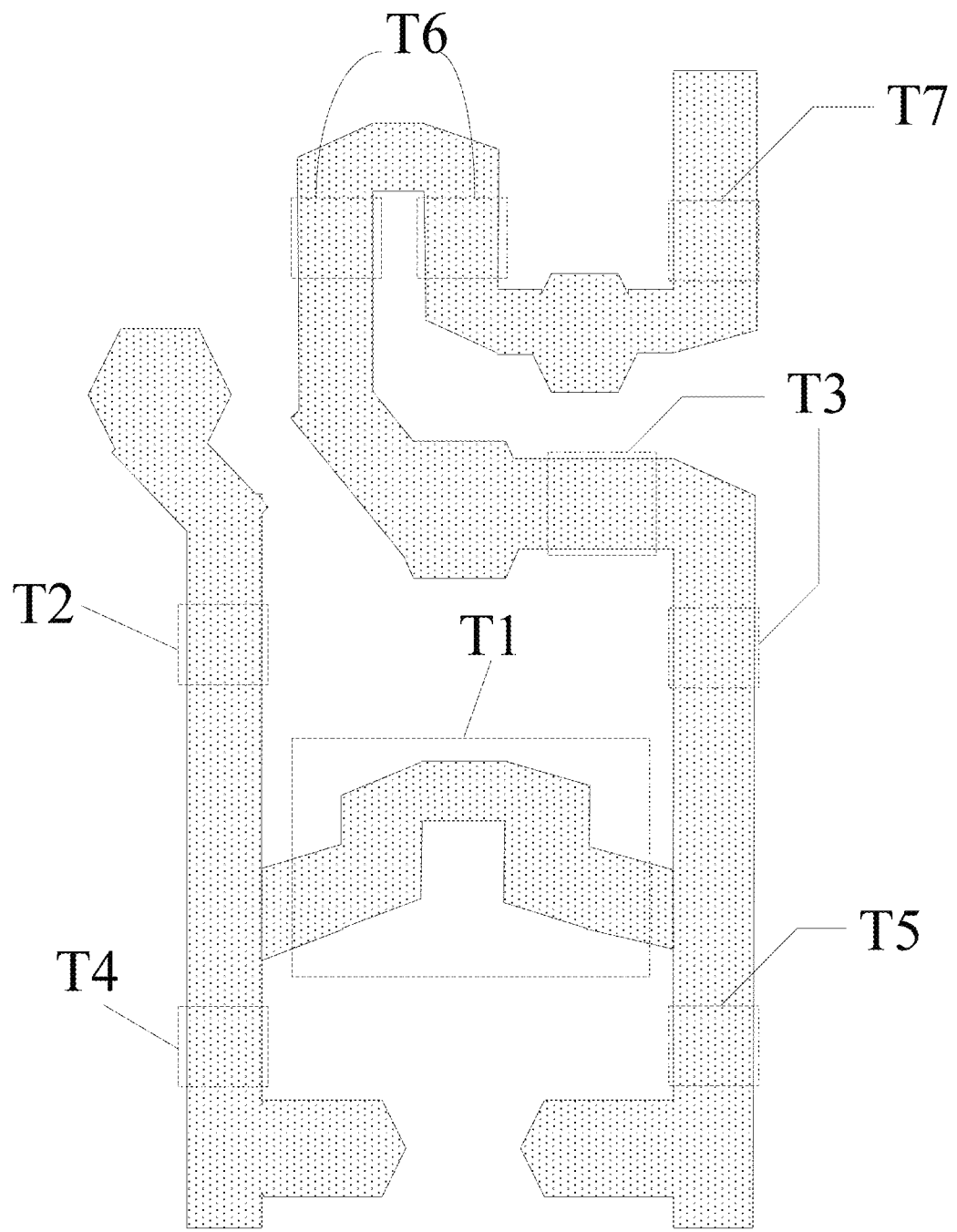
FIG. 4A is a schematic structural diagram showing a layout of a semiconductor layer in some sub-pixels according to some embodiments of the disclosure.

Exemplarily, FIG. 3 and FIG. 4A show a semiconductor layer 500 of the pixel driving circuit 0121. The semiconductor layer 500 may be formed by patterning with a semiconductor material. The semiconductor layer 500 may be used for fabricating active layers of the above driving transistor T1, the data writing transistor T2, the threshold compensation transistor T3, the first light-emitting control transistor T4, the second light-emitting control transistor T5, the first reset transistor T6 and the second reset transistor T7, and each of the active layers may include a source electrode region, a drain electrode region and a channel region between the source electrode region and the drain electrode region. For example, the active layers of all the transistors are integrated.

For example, the semiconductor layer 500 may be fabricated by using amorphous silicon, polycrystalline silicon, an oxide semiconductor material, etc. It needs to be noted that the above source electrode regions and the drain electrode regions may be regions doped with an n-type dopant or a p-type dopant.

It needs to be noted that in the display area A1, the semiconductor layer 500 may be patterned by using a patterning process. A non-patterned semiconductor layer 500 is reserved in the first non-display area A3. Besides, the semiconductor layers 500 in the first non-display area A3 and the display area A1 are arranged with interval. Certainly, the disclosure includes but is not limited to this.

Figure 4B:
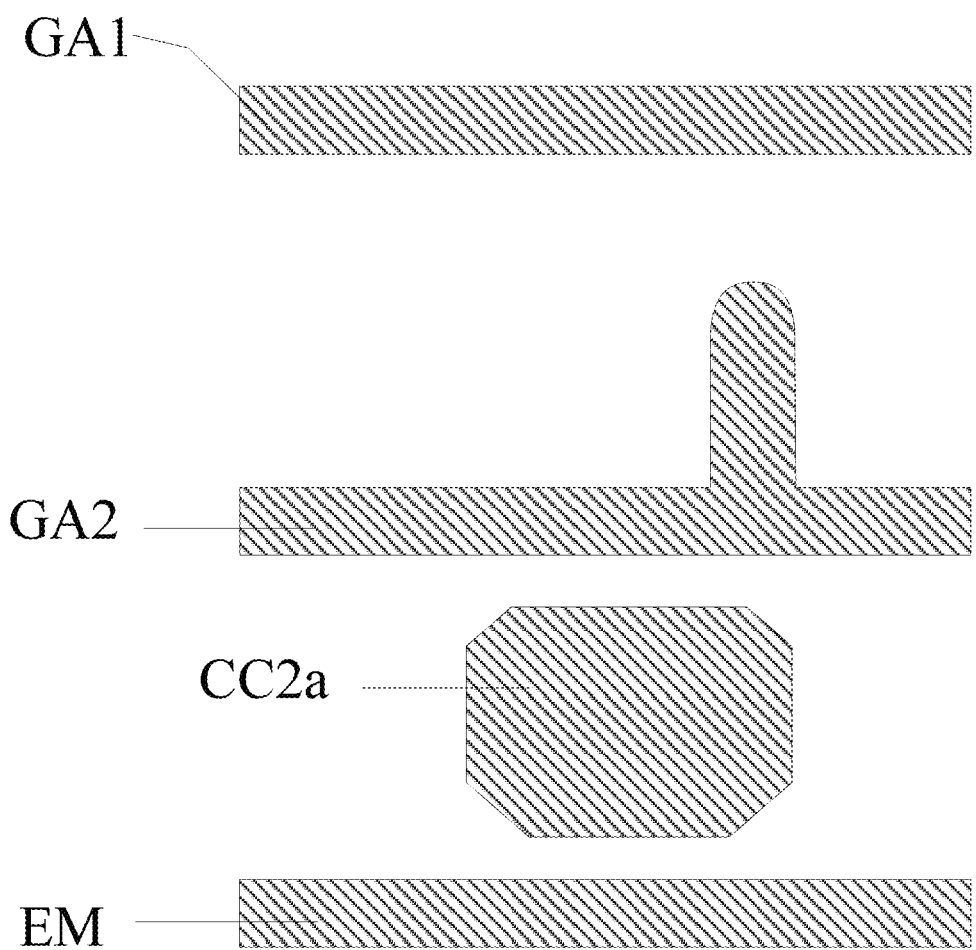
FIG. 4B is a schematic structural diagram showing a layout of a third conductive layer in some sub-pixels according to some embodiments of the disclosure.

Exemplarily, a first gate insulating layer 610 (not shown) is formed on the semiconductor layer 500 and configured to protect the above semiconductor layer 500. FIG. 3 and FIG. 4B show a third conductive layer 300 of the pixel driving circuit 0121. The third conductive layer 300 is arranged on the first gate insulating layer 610 so as to be insulated from the semiconductor layer 500. The third conductive layer 300 may include the second electrode CC2a of the storage capacitor CST, the first scanning line GA1, the second scanning line GA2, the light-emitting control line EM and the gates of the driving transistor T1, the data writing transistor T2, the threshold compensation transistor T3, the first light-emitting control transistor T4, the second light-emitting control transistor T5, the first reset transistor T6 and the second reset transistor T7.

For example, as shown in FIG. 3 to FIG. 4B, the gate of the data writing transistor T2 may be a portion of overlapping of the second scanning line GA2 and the semiconductor layer 500, the gate of the first light-emitting control transistor T4 may be a first portion of overlapping of the light-emitting control line EM and the semiconductor layer 500, the gate of the second light-emitting control transistor T5 may be a second portion of overlapping of the light-emitting control line EM and the semiconductor layer 500, the gate of the first reset transistor T6 is a first portion of overlapping of the first scanning line GA1 and the semiconductor layer 500, the gate of the second reset transistor T7 is a second portion of overlapping of the first scanning line GA1 and the semiconductor layer 500, the threshold compensation transistor T3 may be a thin film transistor of a double-gate structure, a first gate of the threshold compensation transistor T3 may be a first portion of overlapping of the second scanning line GA2 and the semiconductor layer 500, and a second gate of the threshold compensation transistor T3 may be a second portion of overlapping of a protruding portion which protrudes from the second scanning line GA2 and the semiconductor layer 500. As shown in FIG. 3 and FIG. 4B, the gate of the driving transistor T1 may be the second electrode CC2a of the storage capacitor CST.

It needs to be noted that all dotted line rectangular boxes in FIG. 4A show all portions of overlapping of the third conductive layer 300 and the semiconductor layer 500 in the sub-pixel spx. The active layer of the threshold compensation transistor T3 has a first channel region overlapping with the first gate of the threshold compensation transistor T3, a second channel region overlapping with the second gate of the threshold compensation transistor T3, and a source-drain region located between the first channel region and the second channel region. The source-drain region is configured to electrically connect the first channel region to the second channel region.

Exemplarily, as shown in FIG. 3 and FIG. 4B, the first scanning line GA1, the second scanning line GA2 and the light-emitting control line EM are arranged in a second direction F2, and the second scanning line GA2 is located between the first scanning line GA1 and light-emitting control line EM.

Exemplarily, as shown in FIG. 3 and FIG. 4B, in the second direction F2, the second electrode CC2a of the storage capacitor CST is located between the second scanning line GA2 and the light-emitting control line EM. The protruding portion which protrudes from the second scanning line GA2 is disposed on a side of the second scanning line GA2 facing away from the light-emitting control line EM.

Exemplarily, as shown in FIG. 3 and FIG. 4B, in the second direction F2, the gate of the data writing transistor T2, the gate of the threshold compensation transistor T3, the gate of the first reset transistor T6 and the gate of the second reset transistor T7 are all disposed on a first side of the gate of the driving transistor T1, and the gate of the first light-emitting control transistor T4 and the gate of the second light-emitting control transistor T5 are both disposed on a second side of the gate of the driving transistor T1.

For example, in some embodiments, as shown in FIG. 3 and FIG. 4B, in a first direction F1, the gate of the data writing transistor T2 and the gate of the first light-emitting control transistor T4 are both disposed on a third side of the gate of the driving transistor T1, and the first gate of the threshold compensation transistor T3, the gate of the second light-emitting control transistor T5 and the gate of the second reset transistor T7 are all disposed on a fourth side of the gate of the driving transistor T1. The third side and the fourth side of the gate of the driving transistor T1 are two opposite sides of the gate of the driving transistor T1 in the first direction F1.

Figure 4C:
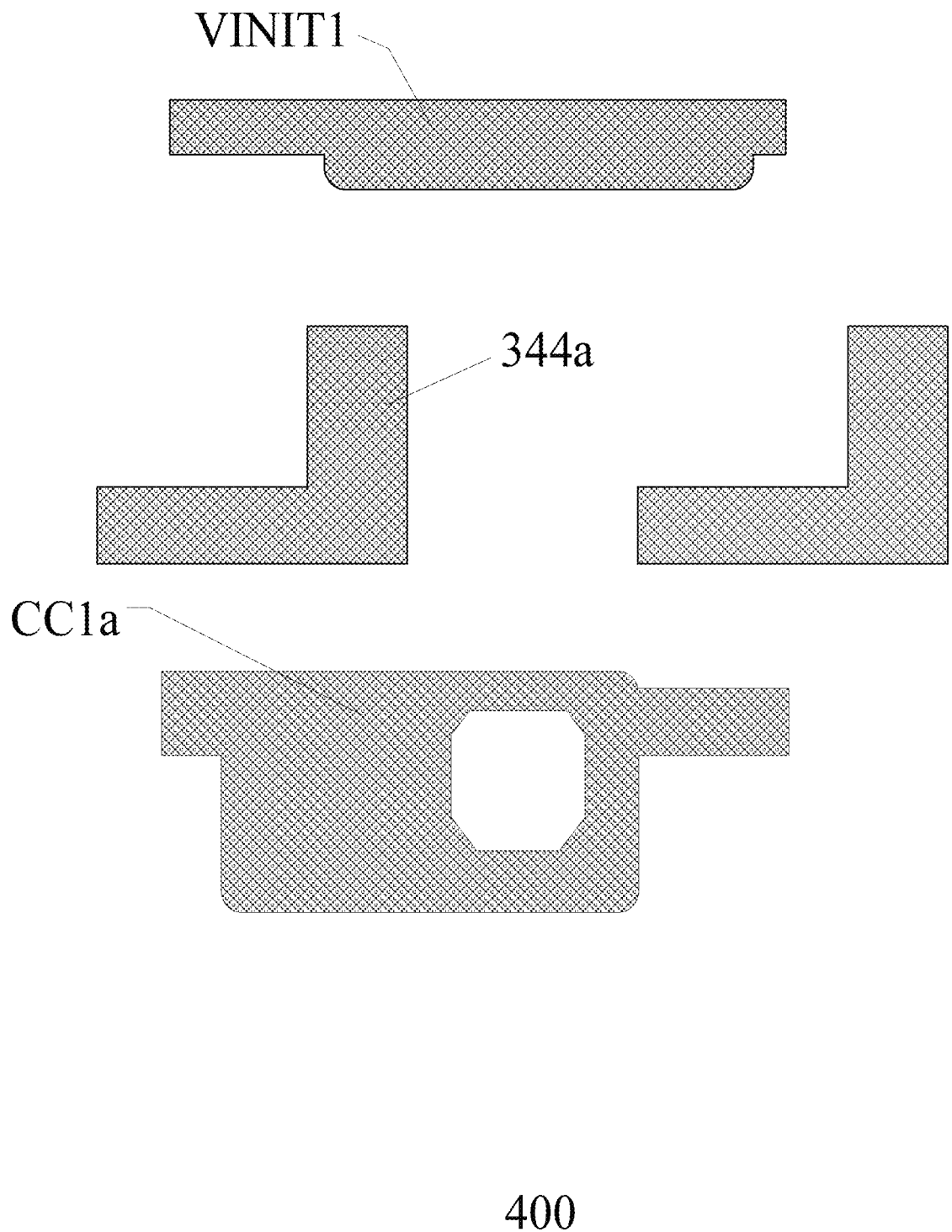
FIG. 4C is a schematic structural diagram showing a layout of a fourth conductive layer in some sub-pixels according to some embodiments of the disclosure.

Exemplarily, a second gate insulating layer 620 (not shown) is formed on the above third conductive layer 300 and configured to protect the above third conductive layer 300. FIG. 3 and FIG. 4C show a fourth conductive layer 400 of the pixel driving circuit 0121. The fourth conductive layer 400 is arranged on the second gate insulating layer 620. The fourth conductive layer 400 may include: the first electrode CC1a of the storage capacitor CST, the first reset signal line VINIT1 and a shading portion 344a. Exemplarily, an orthographic projection of the first electrode CC1a of the storage capacitor CST on the base substrate 010 at least partially overlaps with an orthographic projection of the second electrode CC2a of the storage capacitor CST on the base substrate 010 so as to form the storage capacitor CST. An orthographic projection of the shading portion 344a on the base substrate 010 and an orthographic projection of the source-drain region in the active layer of the threshold compensation transistor T3 on the base substrate 010 have an overlapping region.

Figure 4D:
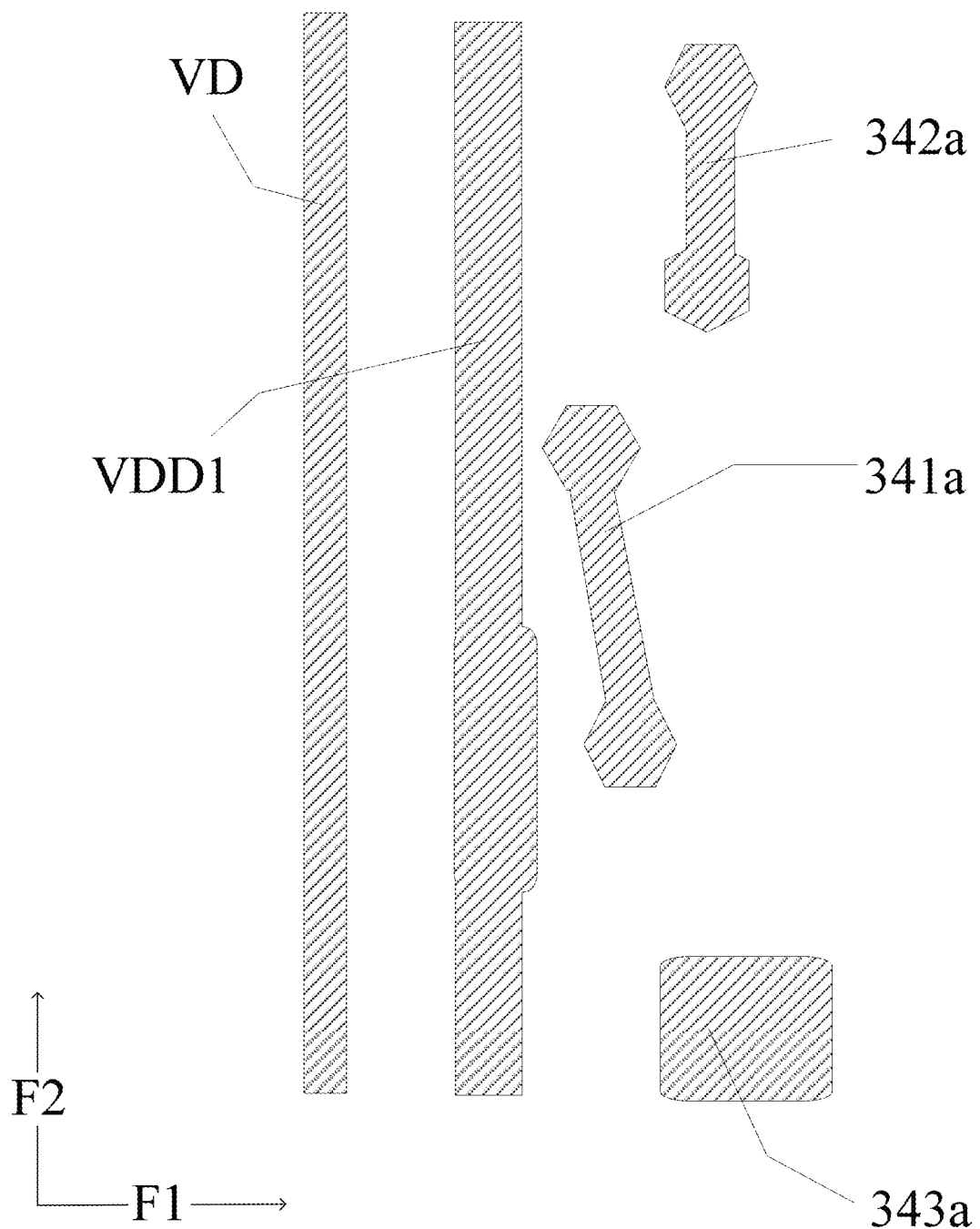
FIG. 4D is a schematic structural diagram showing a layout of a first conductive layer in some sub-pixels according to some embodiments of the disclosure.
Figure 4E:
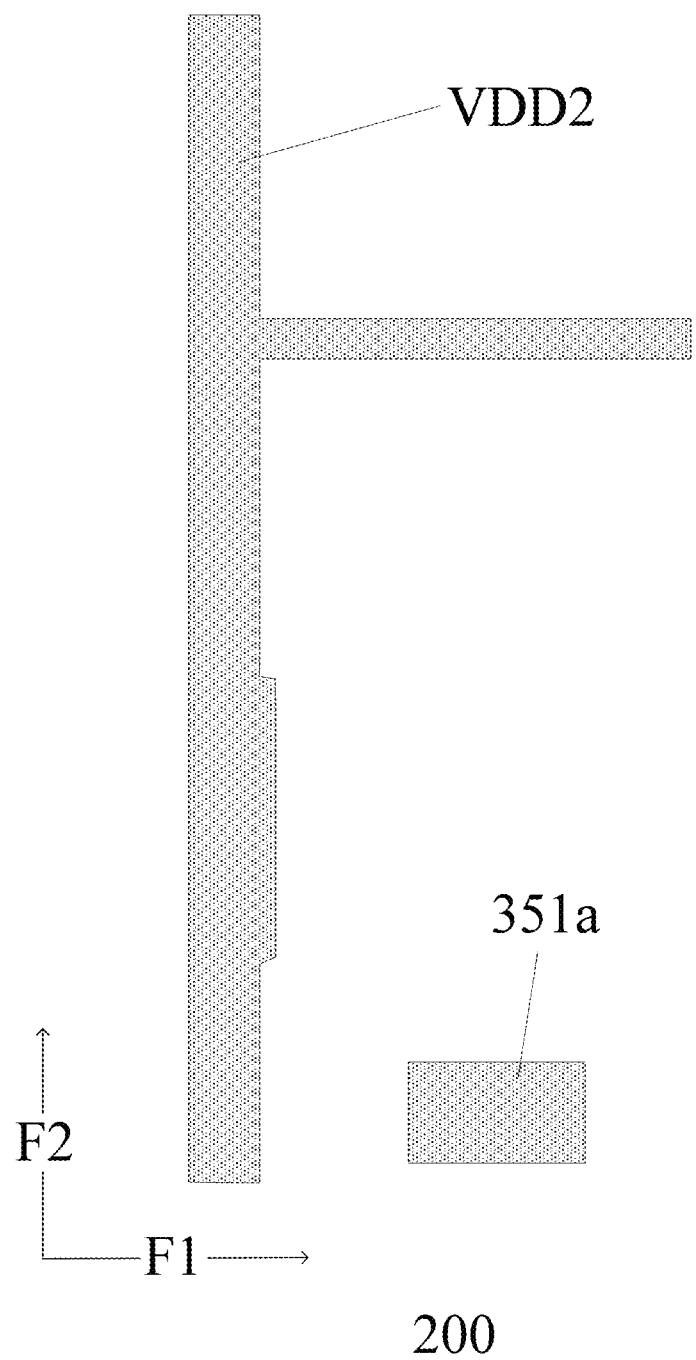
FIG. 4E is a schematic structural diagram showing a layout of a second conductive layer in some sub-pixels according to some embodiments of the disclosure.

Exemplarily, an interlayer dielectric layer 630 (not shown) is formed on the above fourth conductive layer 400 and configured to protect the above fourth conductive layer 400. FIG. 3 and FIG. 4D show a first conductive layer 100 of the pixel driving circuit 0121, and the first conductive layer 100 is arranged on the interlayer dielectric layer 630. The first conductive layer 100 may include: a data line VD, a first power source signal line VDD1 and bridging portions 341a, 342a and 343a.

Exemplarily, an interlayer insulating layer 640 (not shown) is formed on the above first conductive layer 100 and configured to protect the above first conductive layer 100. FIG. 3 and FIG. 4E show a second conductive layer 200 of the pixel driving circuit 0121, and the second conductive layer 200 is disposed on the interlayer insulating layer 640. The second conductive layer 200 includes a second power source signal line VDD2 and an adapter-coupling portion 351a.

Figure 5:
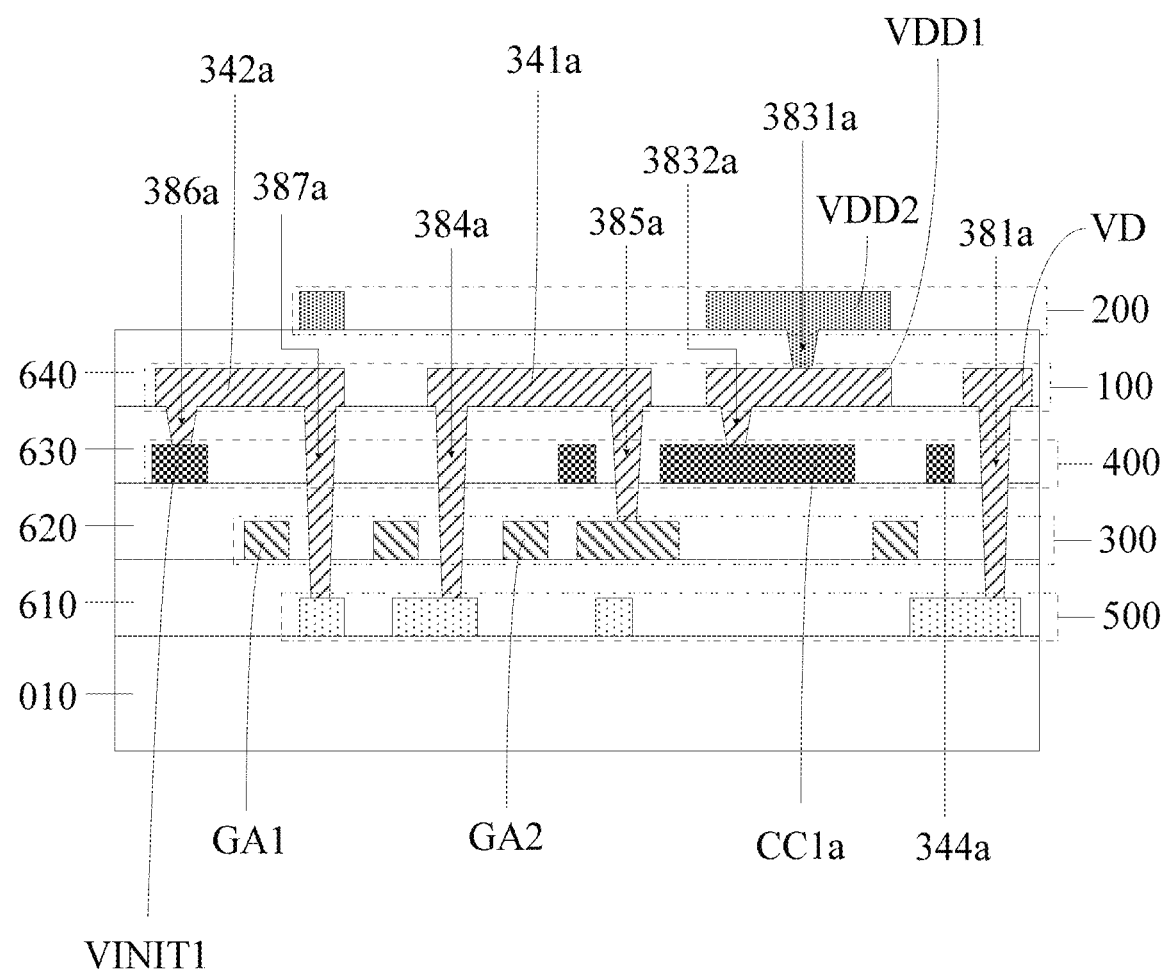
FIG. 5 is a schematic structural sectional view of the structure along a line AA' as shown in FIG. 3.

FIG. 5 is a schematic structural sectional view in a direction AA' of the structure shown in FIG. 3. The first gate insulating layer 610 is between the semiconductor layer 500 and the third conductive layer 300, the second gate insulating layer 620 is between the third conductive layer 300 and the fourth conductive layer 400, the interlayer dielectric layer 630 is between the fourth conductive layer 400 and the first conductive layer 100, and the interlayer insulating layer 640 is between the first conductive layer 100 and the second conductive layer 200.

As shown in FIG. 3 and FIG. 5, the sub-pixel spx includes a first connecting through hole, a second connecting through hole, a third connecting through hole and a fourth connecting through hole. The first connecting through hole runs through the first gate insulating layer 610, the second gate insulating layer 620 and the interlayer dielectric layer 630, the second connecting through hole runs through the second gate insulating layer 620 and the interlayer dielectric layer 630, the third connecting through hole runs through the interlayer dielectric layer 630, and the fourth connecting through hole runs through the interlayer insulating layer 640.

Exemplarily, the sub-pixel spx may include the first connecting through holes 381a, 382a, 384a, 387a and 388a. The sub-pixel spx may include the second connecting through hole 385a. The sub-pixel spx may include the third connecting through holes 386a, 3832a and 389a. The sub-pixel spx may include the fourth connecting through holes 385a and 3831a. The data line VD is electrically connected to the source electrode region of the data writing transistor T2 in the semiconductor layer 500 through at least one first connecting through hole 381a. The first power source signal line VDD1 is electrically connected to the source electrode region of the corresponding first light-emitting control transistor T4 in the semiconductor layer 500 through at least one first connecting through hole 382a. One end of the bridging portion 341a is electrically connected to the drain electrode region of the corresponding threshold compensation transistor T3 in the semiconductor layer 500 through at least one first connecting through hole 384A. The other end of the bridging portion 341a is electrically connected to the gate (namely, the second electrode CC2a of the storage capacitor CST) of the driving transistor T1 in the third conductive layer 300 through at least one second connecting through hole 385a. One end of the bridging portion 342a is electrically connected to the first reset signal line VINIT1 through at least one third connecting through hole 386a, and the other end of the bridging portion 342a is electrically connected to the drain electrode region of the second reset transistor T7 in the semiconductor layer 500 through at least one first connecting through hole 387a. The bridging portion 343a is electrically connected to the drain electrode region of the second light-emitting control transistor T5 in the semiconductor layer 500 through at least one first connecting through hole 388a. The first power source signal line VDD1 is electrically connected to the first electrode CC1a of the storage capacitor CST in the fourth conductive layer 400 through at least one third connecting through hole 3832a. The first power source signal line VDD1 is further electrically connected to the second power source signal line VDD2 in the second conductive layer 200 through at least one fourth connecting through hole 3831a. The bridging portion 351a is electrically connected to the bridging portion 343a by running through at least one fourth connecting through hole 385a. The first power source signal line VDD1 is further electrically connected to the shading portion 344a through at least one first connecting through hole 389a so as to input a fixed voltage into the shading portion 344a.

Exemplarily, each of the first connecting through holes 381a, 382a, 384a, 387a and 388a in the sub-pixel may be one or two and the like respectively, which can be designed and determined according to demands of the actual application environments in actual application and is not limited here.

Exemplarily, the second connecting through hole 385a in the sub-pixels may be one or two and the like, which can be designed and determined according to demands of the actual application environments in actual application and is not limited here.

Exemplarily, each of the third connecting through holes 386a, 3832a and 389a in the sub-pixel may be one or two and the like respectively, which can be designed and determined according to demands of the actual application environments in actual application and is not limited here.

Exemplarily, each of the fourth connecting through holes 385a and 3831a in the sub-pixel may be one or two and the like respectively, which can be designed and determined according to demands of the actual application environments in actual application and is not limited here.

Furthermore, a planarization layer, a layer where the first light-emitting electrode is located, a pixel defining layer, the light-emitting functional layer and a layer where the second light-emitting electrode is located are sequentially disposed on a side of the second conductive layer 200 facing away from the base substrate 010. Besides, the first light-emitting electrode is electrically connected to the adapter-coupling portion 351a through a via hole running through the planarization layer.

For example, as shown in FIG. 3 to FIG. 4E, in the second direction F2, the first scanning line GA1, the second scanning line GA2 and the first reset signal line VINIT1 are all disposed on the first side of the gate of the driving transistor T1, and the light-emitting control line EM is disposed on the second side of the driving transistor T1.

During specific implementation, on a whole display substrate, the first power source signal line VDD1 and the second power source signal line VDD2 are electrically connected, so that a resistance of a signal line electrically connected to the first voltage terminal VDD is small, and its voltage drop is low, and thus stability of a power voltage provided by the first voltage terminal VDD can be improved.

For example, the first scanning line GA1, the second scanning line GA2 and the light-emitting control line EM may be located in the same layer (namely, the third conductive layer 300). The first power source signal line VDD1 and the data line VD are located in the same layer (namely, the first conductive layer 100).

It needs to be noted that a position layout relation of the transistors in each of the sub-pixels spx is not limited to the embodiments shown in FIG. 3 to FIG. 4E, and positions of the above transistors may be arranged specifically according to actual application demands.

It needs to be noted that the first direction F1 may be a row direction of the sub-pixels, and the second direction F2 may be a column direction of the sub-pixels. Or, the first direction F1 may be the column direction of the sub-pixels, and the second direction F2 may be the row direction of the sub-pixels, which can be arranged according to actual application demands in actual application and is not limited here.

During specific implementation, in embodiments of the disclosure, the display area may include a plurality of data lines, a plurality of scanning lines and a plurality of light-emitting control lines. The first non-display area may include a plurality of data transmission lines, a plurality of scanning transmission lines and a plurality of light-emitting transmission lines. At least one of the plurality of data lines is electrically connected to at least one of the plurality of data transmission lines, at least one of the plurality of scanning lines is electrically connected to at least one of the plurality of scanning transmission lines, and at least one of the plurality of light-emitting control lines is electrically connected to at least one of the plurality of light-emitting transmission lines.

Figure 6:
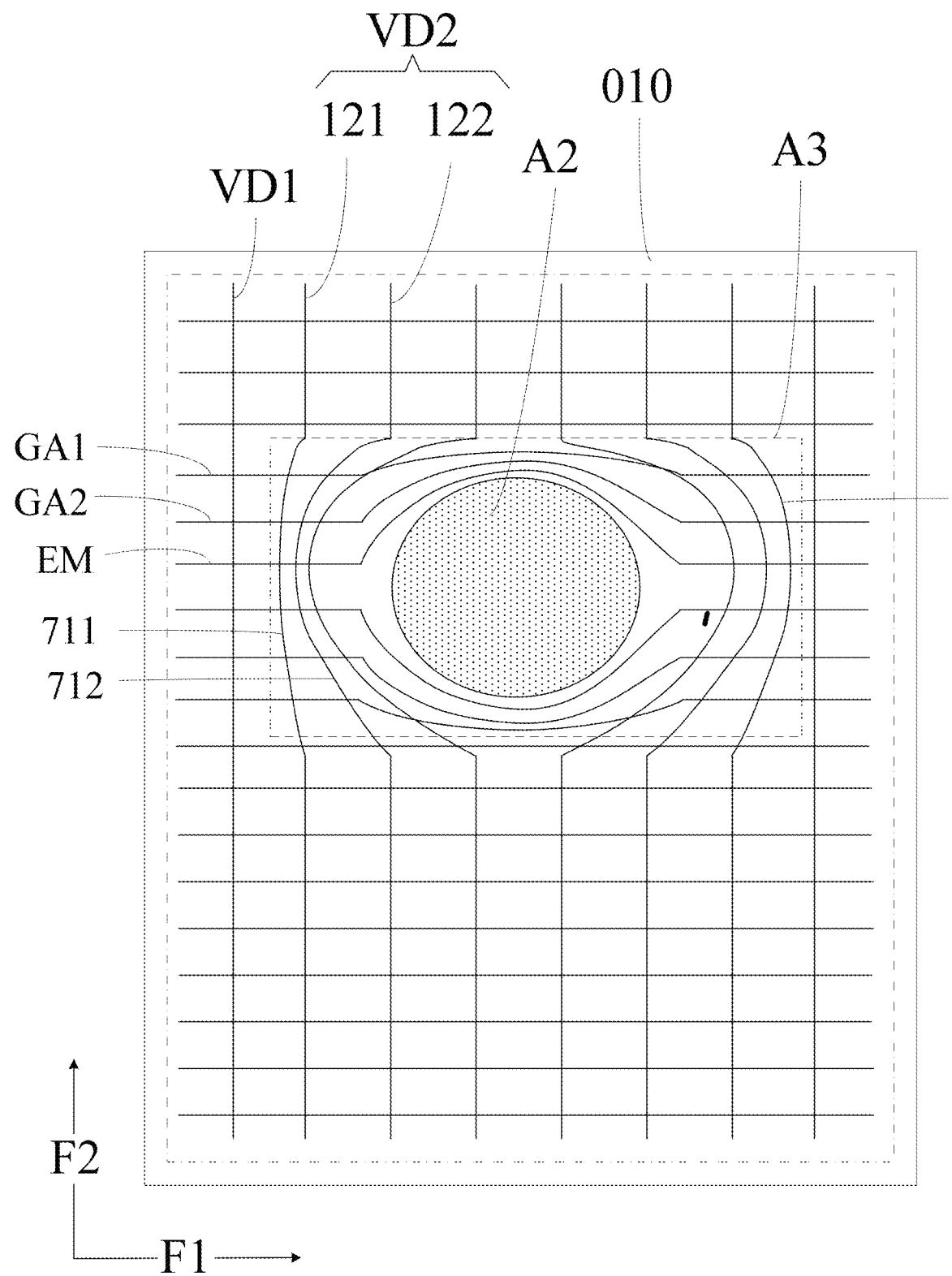
FIG. 6 is a schematic structural diagram of another display panel according to some embodiments of the disclosure.

During specific implementation, in embodiments of the disclosure, as shown in FIG. 6, the plurality of data lines in the first conductive layer 100 may include a data line VD1 and a data line VD2. The data lines VD1 and VD2 are both located in the display area A1, and the data lines VD1 and VD2 are arranged in the first direction F1 respectively. The data lines VD1 extend from a lower side of the display area A1 to an upper side of the display area A1 in the second direction F2 and are arranged in the first direction F1. The data lines VD2 extend in the second direction F2 and are divided by the notch area A2, that is, the data line VD2 may extend from the lower side of the display area A1 to the first non-display area A3, or may extend from an upper side of the display area A1 to the first non-display area A3.

During specific implementation, in embodiments of the disclosure, as shown in FIG. 6 to FIG. 8A, the first conductive layer 100 may further include: a plurality of first data transmission lines 711 arranged at intervals. The second conductive layer 200 may further include: a plurality of first data connecting portions 211 arranged at intervals. The interlayer insulating layer 640 has a plurality of first data through holes. Besides, at least one of the plurality of first data connecting portions 211 is electrically connected to at least one of the plurality of data lines VD2 and at least one of the plurality of first data transmission lines 711 respectively through the first data through holes. In this way, the data lines and the first data transmission lines 711 in the first conductive layer 100 may be mutually electrically connected through the first data connecting portions 211 in the second conductive layer 200. It needs to be noted that the data line VD2 to which the same column of sub-pixels spx corresponds and which is divided by the notch area A2 may be mutually electrically connected through the first data transmission lines 711 so as to form a data line for inputting a data signal into the column of sub-pixels spx.

According to the above display panel provided by embodiments of the disclosure, the first data connecting portions 211 are arranged in the second conductive layer 200, so that the data lines VD2 and the first data transmission lines 711 in the first conductive layer 100 can be mutually electrically connected through the first data connecting portions 211 in the second conductive layer 200. In this way, the data line VD2 to which the same column of sub-pixels spx corresponds and which is divided by the notch area A2 can be electrically connected, furthermore interference with the third conductive layer 300 and the fourth conductive layer 400 due to the first data connecting portions 211 can be reduced, thus signal stability can be improved, and the display effect can be improved.

Besides, as many bridging portions are provided in the first conductive layer 100, if the first data connecting portions 211 are provided in the first conductive layer 100, an area for accommodating the bridging portions, the data lines and the first power source signal lines in the first conductive layer 100 will be reduced, and consequently a situation of a short circuit may possibly happen to the bridging portions, the data lines, the first power source signal lines and the first data connecting portions 211. Therefore, the above display panel provided by embodiments of the disclosure may further reduce a risk of the short circuit, stability of the display panel is further improved, and the competitiveness of the display panel is improved.

During specific implementation, in embodiments of the disclosure, as shown in FIG. 6 to FIG. 8A, the plurality of first data transmission lines 711 are located in the first non-display area A3. Exemplarily, the plurality of first data transmission lines 711 may be arranged around the notch area A2 in an arc shape. The interlayer insulating layer 640 may have: a plurality of first data through holes 641-1 and a plurality of first data through holes 641-2. One of the first data connecting portions 211 corresponds to at least one first data through hole 641-1 and at least one first data through hole 641-2. Besides, one end of the first data connecting portion 211 may be electrically connected to the data line VD2 through the corresponding first data through hole 641-1, and the other end of the first data connecting portion 211 may be electrically connected to the first data transmission line 711 through the corresponding first data through hole 641-2. During actual application, one of the first data connecting portions 211 may correspond to one or two or three or more first data through holes 641-1, or one of the first data connecting portions 211 may correspond to one or two or three or more first data through holes 641-2, which can be designed and determined according to demands of actual application and is not limited here.

During specific implementation, in embodiments of the disclosure, as shown in FIG. 6 to FIG. 8A, the plurality of data lines VD2 may include a plurality of first data lines 121 and a plurality of second data lines 122. Exemplarily, in the first direction F1, the first data lines 121 and the second data lines 122 may be arranged alternately. For example, in a direction indicated by an arrow in the first direction F1, (odd number)$^{th}$ data lines among the plurality of data lines VD2 may serve as the first data lines 121, and (even number)$^{th}$ data lines among the plurality of data lines VD2 may serve as the second data lines 122. Certainly, the first data lines 121 and the second data lines 122 may be designed and determined according to demands of the actual application environments and are not limited here.

During specific implementation, in embodiments of the disclosure, as shown in FIG. 6 to FIG. 8A, one of the first data lines 121 may be electrically connected to one of the first data transmission lines 711 through the first data connecting portion 211. Exemplarily, one of the first data lines 121 may correspond to one of the first data connecting portions 211 and one of the first data transmission lines 711. Besides, the first data lines 121 may be electrically connected to the corresponding first data transmission lines 711 through the corresponding first data connecting portions 211, so that the first data lines 121 to which the same column of sub-pixels spx corresponds and which are divided by the notch area A2 can be electrically connected to the first data transmission lines 711 through the corresponding first data connecting portions 211.

During specific implementation, in embodiments of the disclosure, as shown in FIG. 6 to FIG. 8A, the second conductive layer 200 may further include: a plurality of second data transmission lines 712 which are arranged spaced from the first data connecting portions 211, and the interlayer insulating layer 640 may further include: a plurality of second data through holes 642. One of the second data lines 122 is electrically connected to one of the second data transmission lines 712 through the second data through hole 642. Exemplarily, one of the second data lines 122 may correspond to one of the second data transmission lines 712, and one of the second data transmission lines 712 may correspond to at least one second data through hole 642, so that the second data lines 122 can be electrically connected to the corresponding transmission lines of the second data lines 122 through the corresponding second data through holes 642. During actual application, one of the second data transmission lines 712 may correspond to one or two or three or more second data through holes 642, which can be designed and determined according to demands of actual application and is not limited here.

Figure 7A:
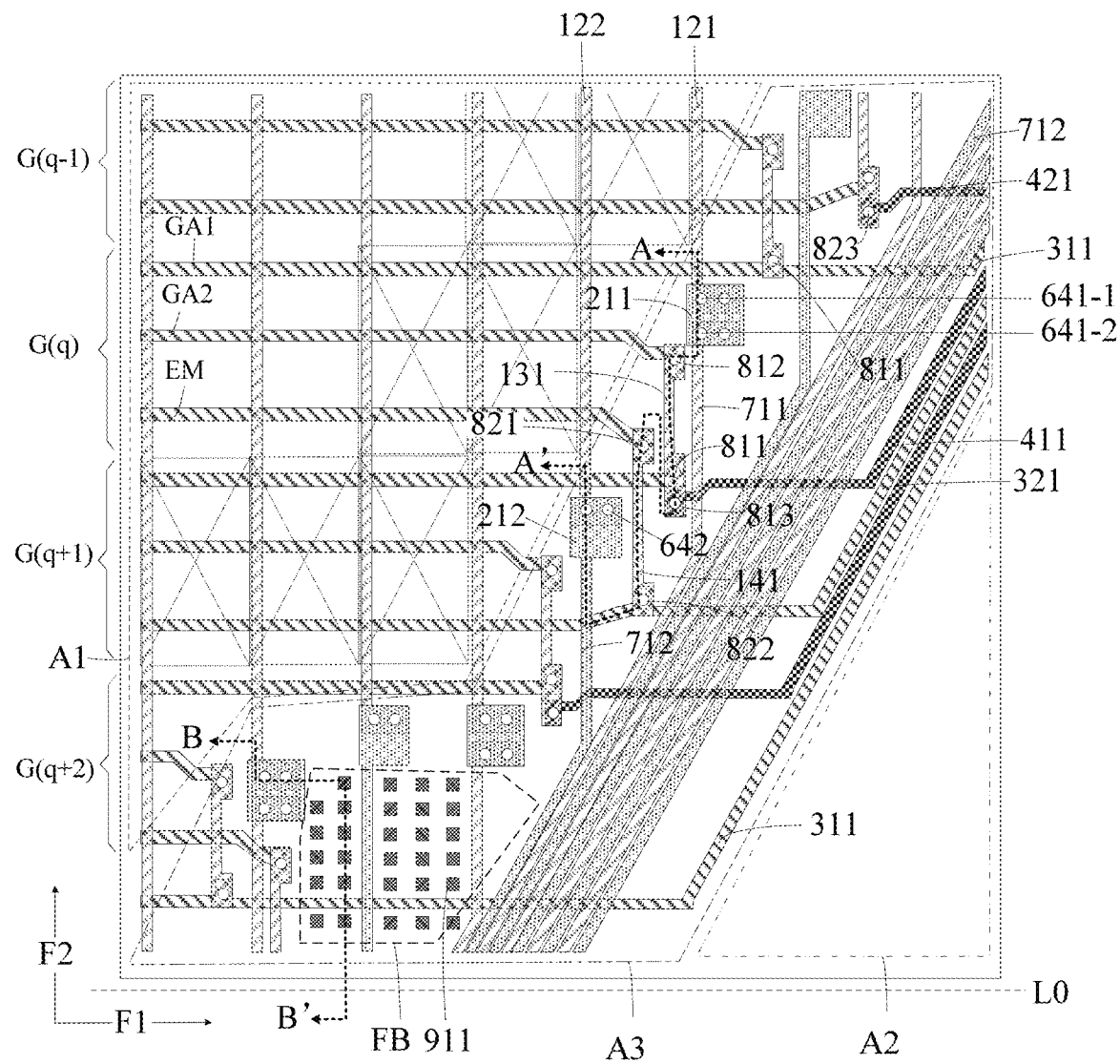
FIG. 7A is a schematic structural diagram of a layout of a partial region of a display panel according to some embodiments of the disclosure.
Figure 7B:
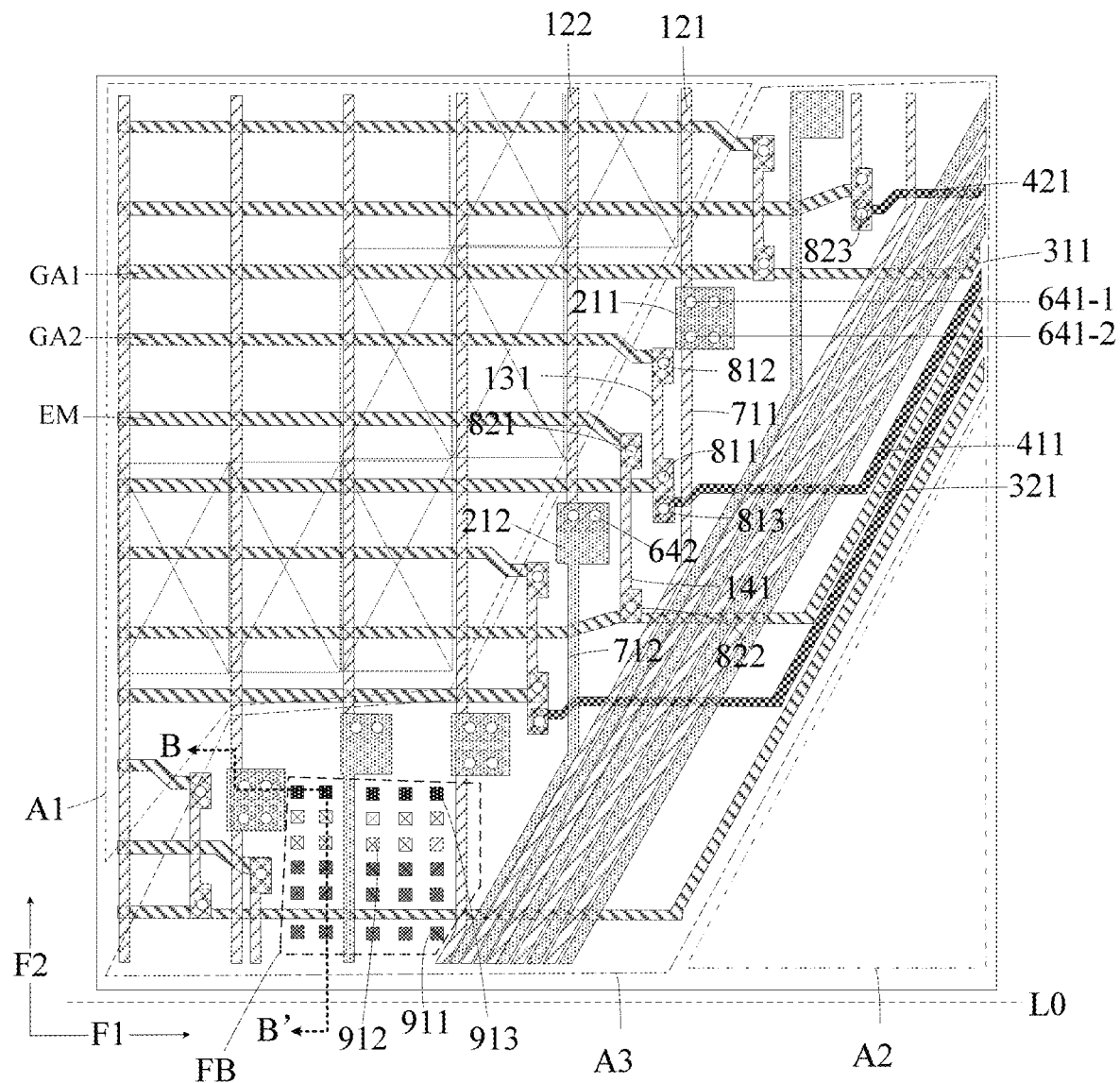
FIG. 7B is a schematic structural diagram of a layout of a partial region of another display panel according to some embodiments of the disclosure.

During specific implementation, in embodiments of the disclosure, as shown in FIG. 6 to FIG. 7B, the plurality of second data transmission lines 712 are located in the first non-display area A3. Exemplarily, the plurality of second data transmission lines 712 may be arranged around the notch area A2 in an arc shape. Furthermore, orthographic projections of the second data transmission lines 712 on the base substrate 010 may be spaced from the orthographic projections of the first data transmission lines 711 on the base substrate 010. Exemplarily, as shown in FIG. 6 to FIG. 7B, the orthographic projections of the first data transmission lines 711 on the base substrate 010 and the orthographic projections of the second data transmission lines 712 on the base substrate 010 may be arranged alternately. The first data transmission lines 711 and the second data transmission lines 712 are disposed on different planes so that a distance between the first data transmission lines 711 and the second data transmission lines 712 can be increased, and then signal interference between the first data transmission lines 711 and the second data transmission lines 712 can be further reduced.

Exemplarily, in order to reduce an occupying area, the orthographic projection of one of the second data transmission lines 712 on the base substrate 010 and the orthographic projection of one of the first data transmission lines 711 on the base substrate 010 have an overlapping region. Furthermore, the orthographic projection of the one of the second data transmission lines 712 on the base substrate 010 may partially overlap with the orthographic projection of one of the first data transmission lines 711 on the base substrate 010, so that occupying areas of the first data transmission lines 711 and the second data transmission lines 712 can be reduced to the maximum degree, and then an occupying area of the first non-display area A3 is reduced.

During specific implementation, in embodiments of the disclosure, as shown in FIG. 6 to FIG. 7B, the plurality of scanning lines may include a plurality of first scanning lines GA1 and a plurality of second scanning lines GA2 located in the display area A1, that is, the third conductive layer 300 may include the plurality of first scanning lines GA1 and the plurality of second scanning lines GA2 located in the display area A1, and one row of sub-pixels spx corresponds to one of the first scanning lines GA1 and one of the second scanning lines GA2. Besides, in every two adjacent rows of sub-pixels spx, the second scanning line GA2 to which the $(q-1)^{th}$ row of sub-pixels $G(q-1)$ corresponds is electrically connected to the first scanning line GA1 to which the $q^{th}$ row of sub-pixels $G(q)$ corresponds. For example, FIG. 7A and FIG. 7B show four rows of sub-pixels spx arranged in the second direction F2, in a direction opposite to an arrow of the second direction F2, it may have $(q-1)^{th}$ row of sub-pixels $G(q-1)$, $q^{th}$ row of sub-pixels $G(q)$, $(q+1)^{th}$ row of sub-pixels $G(q+1)$ and $(q+2)^{th}$ row of sub-pixels $G(q+2)$, the second scanning line GA2 to which the $(q-1)^{th}$ row of sub-pixels $G(q-1)$ corresponds is electrically connected to the first scanning line GA1 to which the $(q)^{th}$ row of sub-pixels $G(q)$ corresponds, and the second scanning line GA2 to which the $q^{th}$ row of sub-pixels $G(q)$ corresponds is electrically connected to the first scanning line GA1 to which the $(q+1)^{th}$ row of sub-pixels $G(q+1)$ corresponds, and so on, which will not be described in detail herein. It needs to be noted that q is an integer, and FIG. 7A and FIG. 7B show only part of rows of sub-pixels spx in the display panel.

During specific implementation, in embodiments of the disclosure, as shown in FIG. 6 to FIG. 8A, the first conductive layer 100 may further include: a plurality of first scanning connecting portions 131 which are insulated and spaced from the data lines and the first data transmission lines 711, and the second scanning line GA2 to which the $(q-1)^{th}$ row of sub-pixels G(q-1) corresponds is electrically connected to the first scanning line GA1 to which the $q^{th}$ row of sub-pixels G(q) corresponds through at least one first scanning connecting portion 131. A second insulating layer may further include a plurality of first scanning through holes 811 and a plurality of second scanning through holes 812. A first terminal of the first scanning connecting portion 131 is electrically connected to the corresponding first scanning line GA1 through at least one of the plurality of first scanning through holes 811, and a second terminal of the first scanning connecting portion 131 is electrically connected to the corresponding second scanning line GA2 through at least one of the plurality of second scanning through holes 812. Exemplarily, the first scanning line GA1 and the second scanning line GA2 which are electrically connected to each other correspond to one of the first scanning connecting portions 131. One of the first scanning connecting portions 131 may correspond to at least one first scanning through hole 811 and at least one second scanning through hole 812. For example, one of the first scanning connecting portions 131 may correspond to one of the first scanning through holes 811 and one of the second scanning through holes 812. The second scanning line GA2 to which the $(q-1)^{th}$ row of sub-pixels G(q-1) corresponds is electrically connected to the first scanning line GA1 to which the $q^{th}$ row of sub-pixels G(q) corresponds, the second scanning line GA2 and the first scanning line GA1 which are electrically connected to each other correspond to one of the first scanning connecting portions 131, a first terminal of the first scanning connecting portion 131 is electrically connected to the corresponding first scanning line GA1 through the corresponding first scanning through hole 811, and a second terminal of the first scanning connecting portion 131 is electrically connected to the corresponding second scanning line GA2 through the corresponding second scanning through hole 812. The second scanning line GA2 to which the $q^{th}$ row of sub-pixels G(q) corresponds is electrically connected to the first scanning line GA1 to which the $(q+1)^{th}$ row of sub-pixels G(q+1) corresponds, the second scanning line GA2 and the first scanning line GA1 which are electrically connected to each other correspond to one of the first scanning connecting portions 131, a first terminal of the first scanning connecting portion 131 is electrically connected to the corresponding first scanning line GA1 through the corresponding first scanning through hole 811, and a second terminal of the first scanning connecting portion 131 is electrically connected to the corresponding second scanning line GA2 through the corresponding second scanning through hole 812, and so on, which will not be described in detail herein. It needs to be noted that the second insulating layer may include: the second gate insulating layer 620 and the interlayer dielectric layer 630.

During specific implementation, in embodiments of the disclosure, as shown in FIG. 6 to FIG. 8A, all rows of sub-pixels spx may include rows of sub-pixels spx of a first type. At least one row of sub-pixels spx among the rows of sub-pixels spx of the first type corresponds to at least one first data connecting portion 211. Exemplarily, the rows of sub-pixels spx of the first type may include a part of rows of all the rows of sub-pixels spx. Besides, each of rows of sub-pixels spx among the rows of sub-pixels spx of the first type may correspond to at least one first data connecting portion 211. For example, each row of the part of rows of sub-pixels spx among the rows of sub-pixels spx of the first type may correspond to one of the first data connecting portions 211, and each row of the rest of rows of sub-pixels spx corresponds to two first data connecting portions. Exemplarily, the rows of sub-pixels spx of the first type may include the $q^{th}$ row of sub-pixels G(q) shown in FIG. 7A and FIG. 7B.

During specific implementation, in embodiments of the disclosure, as shown in FIG. 6 to FIG. 8A, as for the first scanning line GA1, the second scanning line GA2 and the first data connecting portion 211 to which the same row of sub-pixels spx corresponds, an orthographic projection of the first data connecting portion 211 on the base substrate does not overlap with orthographic projections of the first scanning connecting portion 131 to which the first scanning line GA1 corresponds on the base substrate 010 and an orthographic projection of the first scanning connecting portion 131 to which the second scanning line GA2 corresponds on the base substrate 010. In this way, the first data connecting portion 211 and the first scanning connecting portion 131 may be arranged at intervals, and thus a risk of a short circuit is reduced.

During specific implementation, in embodiments of the disclosure, as shown in FIG. 6 to FIG. 8A, as for the first scanning line GA1, the second scanning line GA2 and the first data connecting portion 211 to which the same row of sub-pixels spx corresponds, the orthographic projection of the first data connecting portion 211 is located between an orthographic projection of the first scanning through hole 811 to which the first scanning line GA1 corresponds on the base substrate 010 and an orthographic projection of the second scanning through hole 812 to which the second scanning line GA2 corresponds on the base substrate 010. Exemplarily, as for the first scanning line GA1, the second scanning line GA2 and the first data connecting portion 211 to which the same row of sub-pixels spx corresponds, a connected line between a center of the orthographic projection of the first scanning through hole 811 to which the first scanning line GA1 corresponds on the base substrate 010 and a center of the orthographic projection of the second scanning through hole 812 to which the second scanning line GA2 corresponds on the base substrate overlaps with the orthographic projection of the first data connecting portion 211 on the base substrate 010.

It needs to be noted that the centers of the above orthographic projections may be geometric centers of the orthographic projections. However, in an actual fabrication process, there is a certain deviation between formed shapes of the above all structures and the designed regular shapes in general. Besides, there may be other changes on shapes of the above actually fabricated structures compared with the designed shapes. Therefore, in embodiments of the disclosure, there may be a certain deviation amount between the centers of the above orthographic projections and the geometric centers of the above orthographic projections.

During specific implementation, in embodiments of the disclosure, as shown in FIG. 6 to FIG. 8A, the second conductive layer 200 may further include: a plurality of second data connecting portions 212. One of the second data transmission lines 712 is directly electrically connected to at least one second data connecting portion 212, and the second data connecting portion 212 is electrically connected to one of the second data lines 122 through the second data through hole 642. Exemplarily, one of the second data lines 122 corresponds to one of the second data transmission lines 712 and one of the second data connecting portions 212, and one of the second data connecting portions 212 corresponds to at least one second data through hole 642. Besides, the second data connecting portion 212 is directly electrically connected to the corresponding second data transmission line 712, and the second data connecting portion 212 is electrically connected to the corresponding second data line 122 through the corresponding second data through hole 642. Exemplarily, during actual application, one of the second data connecting portions 212 may correspond to one or two or three or more second data through holes 642, which can be designed and determined according to demands of actual application and is not limited here.

During specific implementation, in embodiments of the disclosure, as shown in FIG. 7A and FIG. 7B, projections of the first data connecting portions 211 and the second data connecting portions 212 on a straight line extending in the first direction F1 may be arranged alternately. As the first data lines 121 and the second data lines 122 are arranged alternately in the first direction F1, the projections of the first data connecting portions 211 and the second data connecting portions 212 on the straight line extending in the first direction F1 are arranged alternately, so that the first data connecting portions 211 electrically connected to the first data lines 121 can correspond to the second data connecting portions 212 electrically connected to the second data lines 122, and thus signal interference can be reduced.

During specific implementation, in embodiments of the disclosure, as shown in FIG. 6 to FIG. 8A, the orthographic projections of the first data connecting portions 211 and the second data connecting portions 212 on the base substrate 010 do not overlap with orthographic projections of the first scanning connecting portions 131, the first scanning lines GA1, the second scanning lines GA2 and the light-emitting control lines EM on the base substrate 010 respectively.

During specific implementation, in embodiments of the disclosure, as shown in FIG. 7A and FIG. 7B, the light-emitting control lines to which two adjacent rows of sub-pixels spx correspond may be electrically connected. Exemplarily, the light-emitting control lines to which the $(q-1)^{th}$ row of sub-pixels $G(q-1)$ and $(q-2)^{th}$ row of sub-pixels correspond are electrically connected, the light-emitting control lines to which the $q^{th}$ row of sub-pixels $G(q)$ and the $(q+1)^{th}$ row of sub-pixel $G(q+1)$ correspond are electrically connected, and the light-emitting control lines to which the $(q+2)^{th}$ row of sub-pixels $G(q+2)$ and $(q+3)^{th}$ row of sub-pixels correspond are electrically connected, and so on, which is not described in detail herein.

Figure 8A:
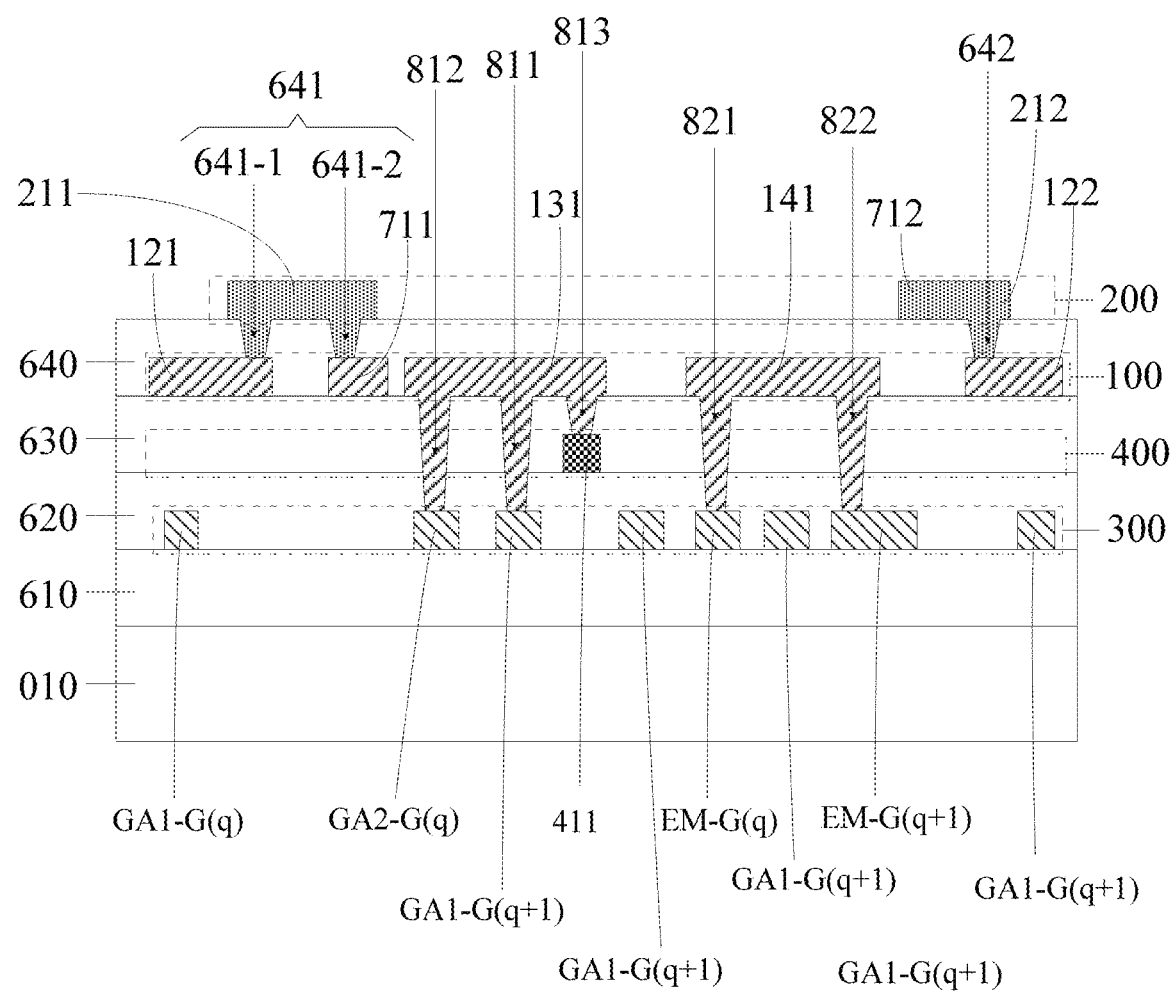
FIG. 8A is a schematic structural sectional view of the structure in the partial region of the display panels along a line AA' shown in FIG. 7A.

During specific implementation, in embodiments of the disclosure, as shown in FIG. 7A, FIG. 7B and FIG. 8A, the first conductive layer 100 may further include: a plurality of first light-emitting connecting portions 141 which are insulated and spaced from the data lines and the first data transmission lines 711, and the light-emitting control lines which are mutually electrically connected correspond to at least one first light-emitting connecting portion 141. The second insulating layer may include a plurality of first light-emitting through holes 821 and a plurality of second light-emitting through holes 822. A first terminal of each of the first light-emitting connecting portion 141 is electrically connected to one corresponding light-emitting control line through at least one of the plurality of first light-emitting through holes 821, and a second terminal of each of the first light-emitting connecting portions 141 is electrically connected to another corresponding light-emitting control line through at least one of the plurality of second light-emitting through holes 822. Exemplarily, the light-emitting control lines which are mutually electrically connected may correspond to one of the first light-emitting connecting portions 141, and one of the first light-emitting connecting portions 141 corresponds to at least one first light-emitting through hole 821 and at least one second light-emitting through hole 822. Besides, the first terminal of each of the first light-emitting connecting portions 141 is electrically connected to the corresponding light-emitting control line through the corresponding first light-emitting through hole 821, and the second terminal of each of the first light-emitting connecting portions 141 is electrically connected to another corresponding light-emitting control line through the corresponding second light-emitting through hole 822. For example, the first terminal of the first light-emitting connecting portion 141 is electrically connected to the light-emitting control line to which the $q^{th}$ row of sub-pixels $G(q)$ corresponds through the corresponding first light-emitting through hole 821, and the second terminal of the first light-emitting connecting portion 141 is electrically connected to the light-emitting control line to which the $(q+1)^{th}$ row of sub-pixels $G(q+1)$ corresponds through the corresponding second light-emitting through hole 822. Exemplarily, one of the first light-emitting connecting portions 141 may correspond to one or two or three or more first light-emitting through hole 821. One of the first light-emitting connecting portions 141 may correspond to one or two or three or more second light-emitting through holes 822, which can be designed and determined according to demands of actual application and is not limited here.

During specific implementation, in embodiments of the disclosure, as shown in FIG. 7A to FIG. 8A, the third conductive layer 300 may further include a plurality of first scanning transmission lines 311 and a plurality of first light-emitting transmission lines 321 which are located in the first non-display area A3, and the first scanning transmission lines 311 and the first light-emitting transmission lines 321 are arranged at intervals. Exemplarily, orthographic projections of the first scanning transmission lines 311 on the base substrate 010 may be spaced from orthographic projections of the first light-emitting transmission lines 321 on the base substrate 010. Furthermore, the orthographic projections of the first scanning transmission lines 311 on the base substrate 010 and the orthographic projections of the first light-emitting transmission lines 321 on the base substrate 010 may be arranged alternately. Furthermore, the first scanning transmission lines 311 and the first light-emitting transmission lines 321 may be arranged around the first non-display area A3 in an arc shape. Of course, it can be designed and determined according to demands of actual application and is not limited here.

During specific implementation, in embodiments of the disclosure, as shown in FIG. 7A to FIG. 8A, a part of first scanning lines GA1 and second scanning lines GA2 which are mutually electrically connected are directly and correspondingly electrically connected to one of the first scanning lines 311, and a part of light-emitting control lines which are mutually electrically connected are directly electrically connected to one of the first light-emitting transmission lines 321. In this way, in the third conductive layer 300, the first scanning lines GA1 may be directly electrically connected to the first scanning transmission lines 311, and the light-emitting control lines may be directly electrically connected to the first light-emitting transmission lines 321, so that design difficulty of these signal lines can be lowered.

During specific implementation, in embodiments of the disclosure, as shown in FIG. 7A to FIG. 8A, the fourth conductive layer 400 may further include a plurality of second scanning transmission lines 411 and a plurality of second light-emitting transmission lines 421 which are located in the first non-display area A3, and the second scanning transmission lines 411 and the second light-emitting transmission lines 421 are arranged at intervals. Exemplarily, orthographic projections of the second scanning transmission lines 411 on the base substrate 010 and orthographic projections of the second light-emitting transmission lines 421 on the base substrate 010 may be arranged at intervals. Furthermore, the orthographic projections of the second scanning transmission lines 411 on the base substrate 010 and the orthographic projections of the second light-emitting transmission lines 421 on the base substrate 010 may be arranged alternately. Furthermore, the second scanning transmission lines 411 and the second light-emitting transmission lines 421 may be arranged around the first non-display area A3 in an arc shape. Of course, it can be designed and determined according to demands of actual application and is not limited here.

During specific implementation, in embodiments of the disclosure, as shown in FIG. 7A to FIG. 8A, the interlayer dielectric layer 630 may further include a plurality of third scanning through holes 813 and a plurality of third light-emitting through holes 823. Apart from the above part of first scanning lines GA1 and second scanning lines GA2 which are mutually electrically connected, the rest of first scanning lines GA1 and second scanning lines GA2 which are mutually electrically connected correspond to one of the scanning transmission line 411, and the first scanning connecting portions 131 to which the rest of first scanning lines GA1 which are mutually electrically connected correspond are electrically connected to the second scanning transmission lines 411 through the third scanning through holes 813. In this way, the first scanning lines GA1 to which the same row of sub-pixels spx corresponds and which are divided by the notch area A2 can be electrically connected to through the second scanning transmission lines 411. Exemplarily, one of the second scanning transmission lines 411 may correspond to one or two or three or more third scanning through holes 813. It can be designed and determined according to demands of actual application and is not limited here.

During specific implementation, in embodiments of the disclosure, as shown in FIG. 7A to FIG. 8A, apart from the above part of light-emitting control lines which are mutually electrically connected, the rest of light-emitting control lines which are mutually electrically connected correspond to one of the second light-emitting transmission lines 421, and the first light-emitting connecting portion 141 is electrically connected to the second light-emitting transmission line 421 through the third light-emitting through hole 823. In this way, the light-emitting control lines to which the same row of sub-pixels spx correspond and which are divided by the notch area A2 can be electrically connected to the second light-emitting transmission line 421. Exemplarily, one of the second light-emitting transmission lines 421 may correspond to one or two or three or more third light-emitting through holes 823. It can be designed and determined according to demands of actual application and is not limited here.

Besides, the first scanning transmission lines 311, the second scanning transmission lines 411, the first light-emitting transmission lines 321 and the second light-emitting transmission lines 421 are all arranged in the first non-display area A3. The first scanning transmission lines 311 and the first light-emitting transmission lines 321 are arranged in the third conductive layer 300, and the second scanning transmission lines 411 and the second light-emitting transmission lines 421 are arranged in the fourth conductive layer 400, so that signal interference of the first scanning transmission lines 311, the second scanning transmission lines 411, the first light-emitting transmission lines 321 and the second light-emitting transmission lines 421 can be reduced.

Exemplarily, orthographic projections of the first scanning transmission lines 311 on the base substrate 010 and the orthographic projections of a part of the first data transmission lines 711 on the base substrate 010 may have an overlapping region. Furthermore, the orthographic projection of one of the first scanning transmission line 311 on the base substrate 010 may partially overlap with the orthographic projection of one of the first data transmission lines 711 on the base substrate 010. Exemplarily, orthographic projections of the first light-emitting transmission lines 321 on the base substrate 010 and the orthographic projections of the rest of first data transmission lines 711 on the base substrate 010 may have an overlapping region. Furthermore, the orthographic projection of one of the first light-emitting transmission lines 321 on the base substrate 010 may partially overlap with the orthographic projection of one of the rest of first data transmission lines 711 on the base substrate 010. In this way, an occupying area of the first non-display area can be reduced.

Exemplarily, orthographic projections of the second scanning transmission lines 411 on the base substrate 010 and orthographic projections of a part of second data transmission lines 712 on the base substrate 010 may have an overlapping region. Furthermore, the orthographic projection of one of the second scanning transmission lines 411 on the base substrate 010 may partially overlap with the orthographic projection of one of the second data transmission lines 712 on the base substrate 010. Exemplarily, the orthographic projections of the second light-emitting transmission lines 421 on the base substrate 010 and the orthographic projections of the rest of second data transmission lines 712 on the base substrate 010 may have an overlapping region. Furthermore, the orthographic projection of one of the second light-emitting transmission lines 421 on the base substrate 010 may partially overlap with the orthographic projection of one of the rest of second data transmission lines 712 on the base substrate 010. In this way, the occupying area of the first non-display area can be reduced.

During specific implementation, in embodiments of the disclosure, as shown in FIG. 7A to FIG. 8A, all the rows of sub-pixels spx may also include rows of sub-pixels spx of a second type, and the rows of sub-pixels spx of the second type are different from the rows of sub-pixels spx of the first type. Besides, at least one row of sub-pixels spx among the rows of sub-pixels spx of the second type corresponds to at least one second data connecting portion 212. Exemplarily, each row of sub-pixels spx among the rows of sub-pixels spx of the second type corresponds to at least one second data connecting portion 212. Exemplarily, each row of sub-pixels spx among the rows of sub-pixels spx of the second type corresponds to one second data connecting portion 212. It needs to be noted that the rows of sub-pixels spx of the second type may be a part of rows in the display panel, whose specific positions can be designed and determined according to demands of the actual application environments and are not limited here. Exemplarily, the rows of sub-pixels spx of the second type may include a first row of sub-pixels and a third row of sub-pixels in FIG. 7B.

During specific implementation, in embodiments of the disclosure, as shown in FIG. 7A to FIG. 8A, as for the first scanning line GA1, the second scanning line GA2 and the second data connecting portion 212 to which the same row of sub-pixels spx corresponds, the orthographic projection of the second data connecting portion 212 on the base substrate 010 does not overlap with orthographic projections of the first scanning connecting portion 131 to which the first scanning line GA1 corresponds on the base substrate 010 and the first scanning connecting portion 131 to which the second scanning line GA2 corresponds on the base substrate 010. In this way, the second data connecting portions 212 and the first scanning connecting portions 131 may be arranged at intervals so as to reduce a risk of a short circuit.

During specific implementation, in embodiments of the disclosure, as shown in FIG. 7A to FIG. 8A, as for the first scanning line GA1, the second scanning line GA2 and the second data connecting portion 212 to which the same row of sub-pixels spx corresponds, the orthographic projection of the second data connecting portion 212 on the base substrate is located between the orthographic projection of the first scanning through hole 811 to which the first scanning line GA1 corresponds and the orthographic projection of the second scanning through hole 812 to which the second scanning line GA2 corresponds on the base substrate 010. Exemplarily, as for the first scanning line GA1, the second scanning line GA2 and the second data connecting portion 212 to which the same row of sub-pixels corresponds, a connected line between a center of the orthographic projection of the second scanning through hole 812 to which the first scanning line GA1 corresponds on the base substrate 010 and a center of the orthographic projection of the second scanning through hole 812 to which the second scanning line GA2 corresponds on the base substrate overlaps with the orthographic projection of the second data connecting portion 212 on the base substrate 010.

During specific implementation, in embodiments of the disclosure, as shown in FIG. 7A to FIG. 8A, the orthographic projection of the second data connecting portion 212 on the base substrate 010 does not overlap with the orthographic projection of the first light-emitting connecting portion 141 on the base substrate 010, the orthographic projection of the first scanning connecting portion 131 on the base substrate 010, the orthographic projection of the first scanning line GA1 on the base substrate 010 and the orthographic projection of the second scanning line GA2 on the base substrate 010 respectively.

During specific implementation, in embodiments of the disclosure, as shown in FIG. 7A to FIG. 8A, as for the light-emitting control line EM, the second scanning line GA2 and the second data connecting portion 212 to which the same row of sub-pixels spx corresponds, the orthographic projection of the second data connecting portion 212 on the base substrate 010 is located between the orthographic projection of the second scanning through hole 812 to which the second scanning line GA2 corresponds on the base substrate 010 and the orthographic projection of the first light-emitting through hole 821 to which the light-emitting control line corresponds on the base substrate 010.

In actual application, the transistors in the sub-pixels spx generally need electrical connection, electrical connection of these transistors are related to features of the transistors, so if electrical connection of the transistors is uniform, the features of the transistors can be uniform. Through holes for electrical connection are formed through an etchant generally by using a wet etching method. However, when the through holes of the sub-pixels spx at an edge of the display area A1 are etched, through holes do not need to be etched outside the edge of the display area A1, so that an etching degree of the through holes of the sub-pixels spx at the edge of the display area A1 are different from an etching degree of through holes spx in the display area A1, and consequently, features of the transistors in the sub-pixels spx at the edge of the display area A1 and features of the transistors in the sub-pixels spx in the display area A1 are not uniform. In order to improve uniformity of the features of the transistors, during specific implementation, in embodiments of the disclosure, the display panel has the target insulating layer located between the first conductive layer and the base substrate and the functional layer located between the target insulating layer and the base substrate, at least one of the plurality of sub-pixels may include: a connecting through hole, the connecting through hole runs through the target insulating layer, and the first conductive layer is electrically connected to the functional layer through the connecting through hole. The first non-display area includes at least one auxiliary through hole, and the auxiliary through hole runs through the target insulating layer and is not filled with a conductive material. Besides, in the first non-display area, an auxiliary area is formed by rounding of at least two types of transmission lines among the plurality of data transmission lines, the plurality of scanning transmission lines and the plurality of light-emitting transmission lines, and the auxiliary through hole is located in the auxiliary area. Furthermore, exemplarily, an interval between two adjacent auxiliary through holes may be smaller than or approximately equal to an interval between two adjacent connecting through holes.

In actual application, a first connecting through hole is configured to realize electrical connection of the transistors in the sub-pixels spx, the electrical connection of these transistors is related to features of the transistors, if the electrical connection of the transistors is uniform, the features of the transistors can be uniform. The first connecting through hole is formed through an etchant generally by using the wet etching method. However, when the first connecting through hole of the sub-pixels spx at the edge of the display area A1 is etched, a first connecting through hole does not need to be etched outside the edge of the display area A1, so an etching degree of the first connecting through hole of the sub-pixel spx at the edge of the display area A1 is different from an etching degree of the first connecting through hole of the sub-pixels spx in the display area A1, and consequently, the features of the transistors in the sub-pixels spx at the edge of the display area A1 and the features of the transistors in the sub-pixels spx in the display area A1 are not uniform. In order to improve uniformity of the features of the transistors, during specific implementation, in embodiments of the disclosure, the functional layer may include a semiconductor layer. The target insulating layer may include: the first gate insulating layer, the second gate insulating layer and the interlayer dielectric layer. The connecting through hole may include the first connecting through hole. The auxiliary through hole may include a first auxiliary through hole. The first auxiliary through hole runs through the first gate insulating layer, the second gate insulating layer and the interlayer dielectric layer. Exemplarily, as shown in FIG. 7A to FIG. 8C, the display panel may further include at least one first auxiliary through hole 911 located in the first non-display area A3. The first auxiliary through hole 911 runs through the first gate insulating layer 610, the second gate insulating layer 620 and the interlayer dielectric layer 630, and the first auxiliary through hole 911 is not filled with a conductive material. Besides, in the first non-display area A3, the auxiliary area FB may be defined by at least two types of transmission lines among the plurality of data transmission lines, the plurality of scanning transmission lines and the plurality of light-emitting transmission lines, and the first auxiliary through hole 911 may be located in the auxiliary area FB. In this way, the first auxiliary through hole 911 may be formed outside the edge of the display area A1, namely, in the first non-display area A3, and an insulating layer through which the first auxiliary through hole 911 runs is the same as an insulating layer through which the first connecting through hole runs. Accordingly, the firsy auxiliary through hole 911 is also etched in the first non-display area A3, an etching effect of the first connecting through hole etched in the sub-pixels spx at the edge of the display area and an etching effect of the first connecting through hole etched in the sub-pixels spx in the display area are uniform, and the uniformity of the features of the transistors is improved.

During specific implementation, the first auxiliary through hole 911 may be filled with an insulating material. For example, the first auxiliary through hole 911 may be filled with a material of the interlayer insulating layer 640. In this way, when the interlayer insulating layer 640 is fabricated, the first auxiliary through hole 911 can be directly filled, so that flatness of the interlayer insulating layer 640 can be improved.

During specific implementation, which of transmission lines are specifically adopted to define the auxiliary area FB can be designed and determined according to demands of the actual application, which is not limited here.

Figure 8B:
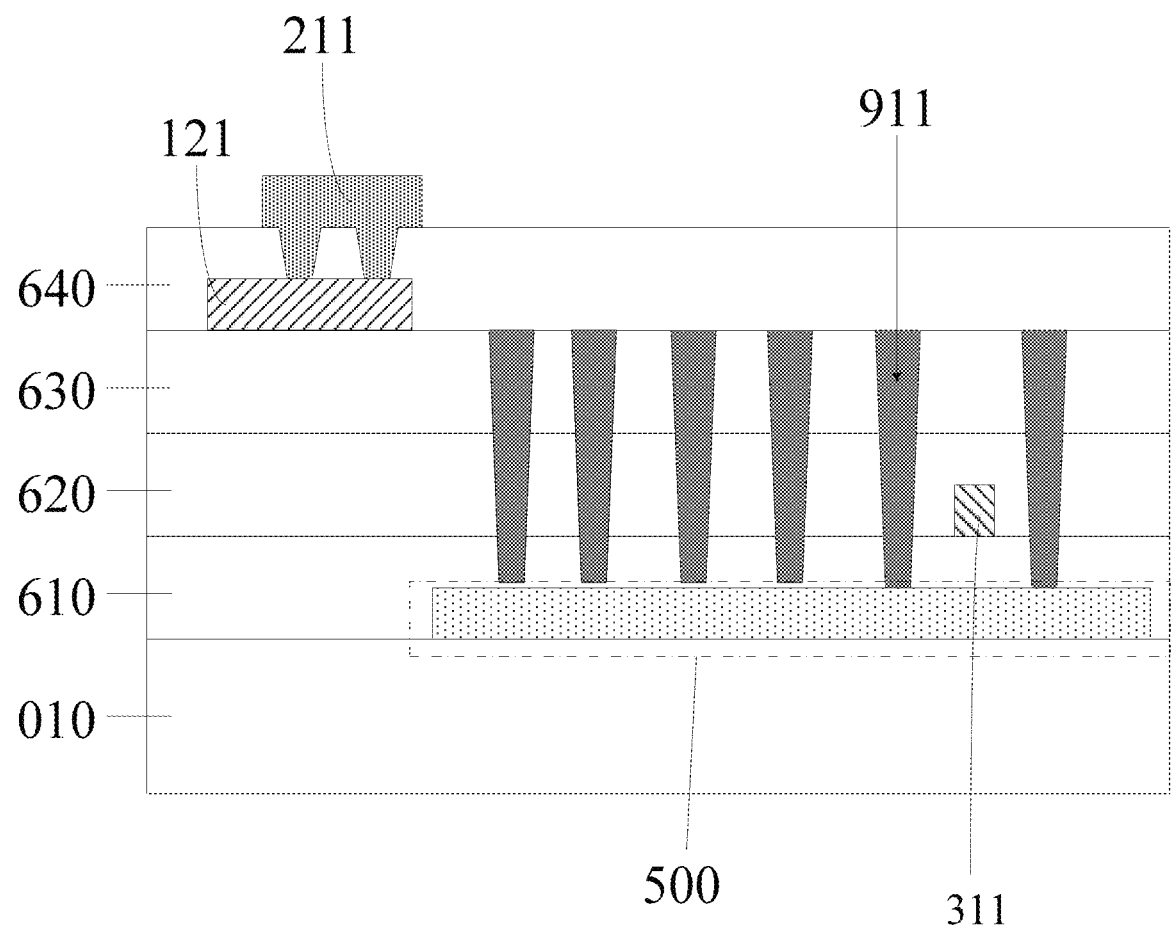
FIG. 8B is a schematic structural sectional view of the structure in the partial region of the display panels along a line BB' as shown in FIG. 7A.
Figure 8C:
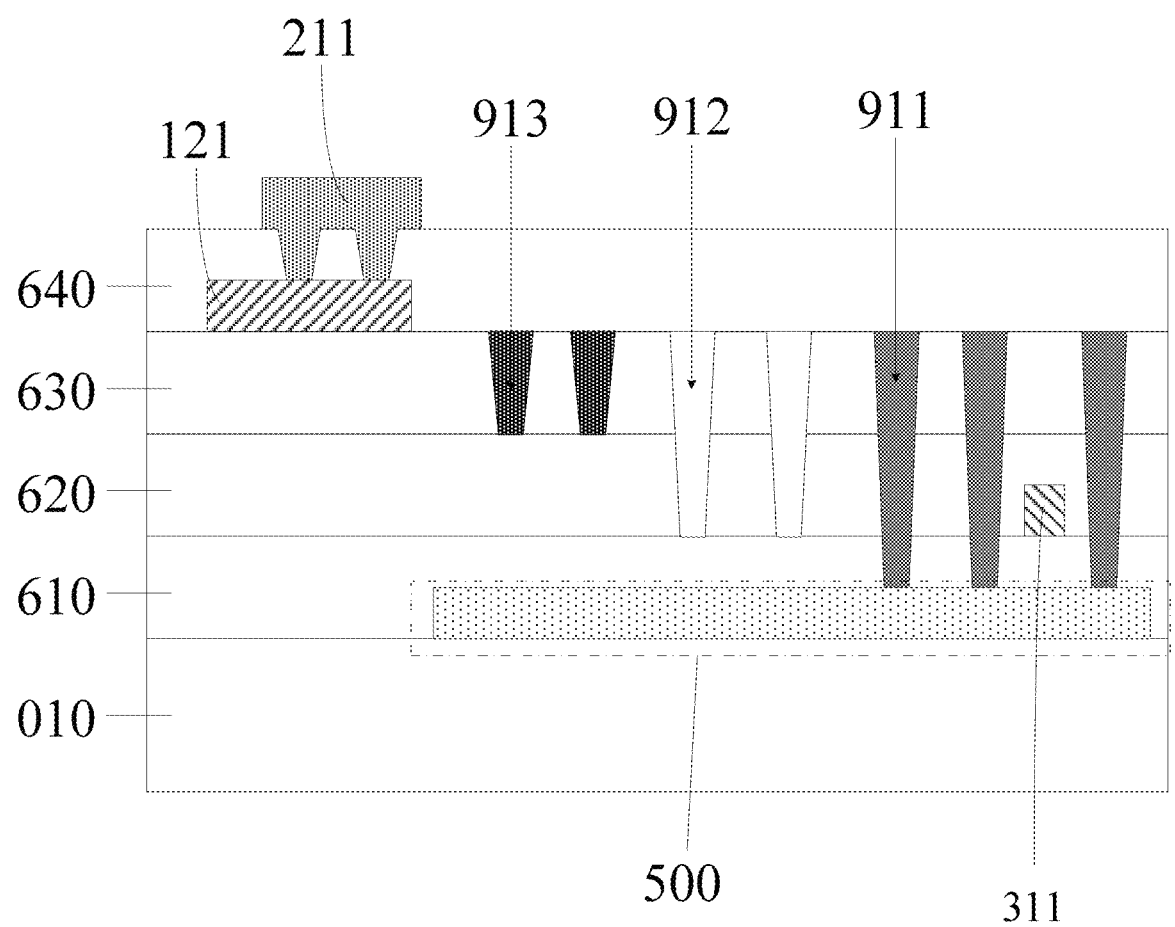
FIG. 8C is a schematic structural sectional view of the structure in the partial region of the display panels along a line BB' as shown in FIG. 7B.
Figure 9A:
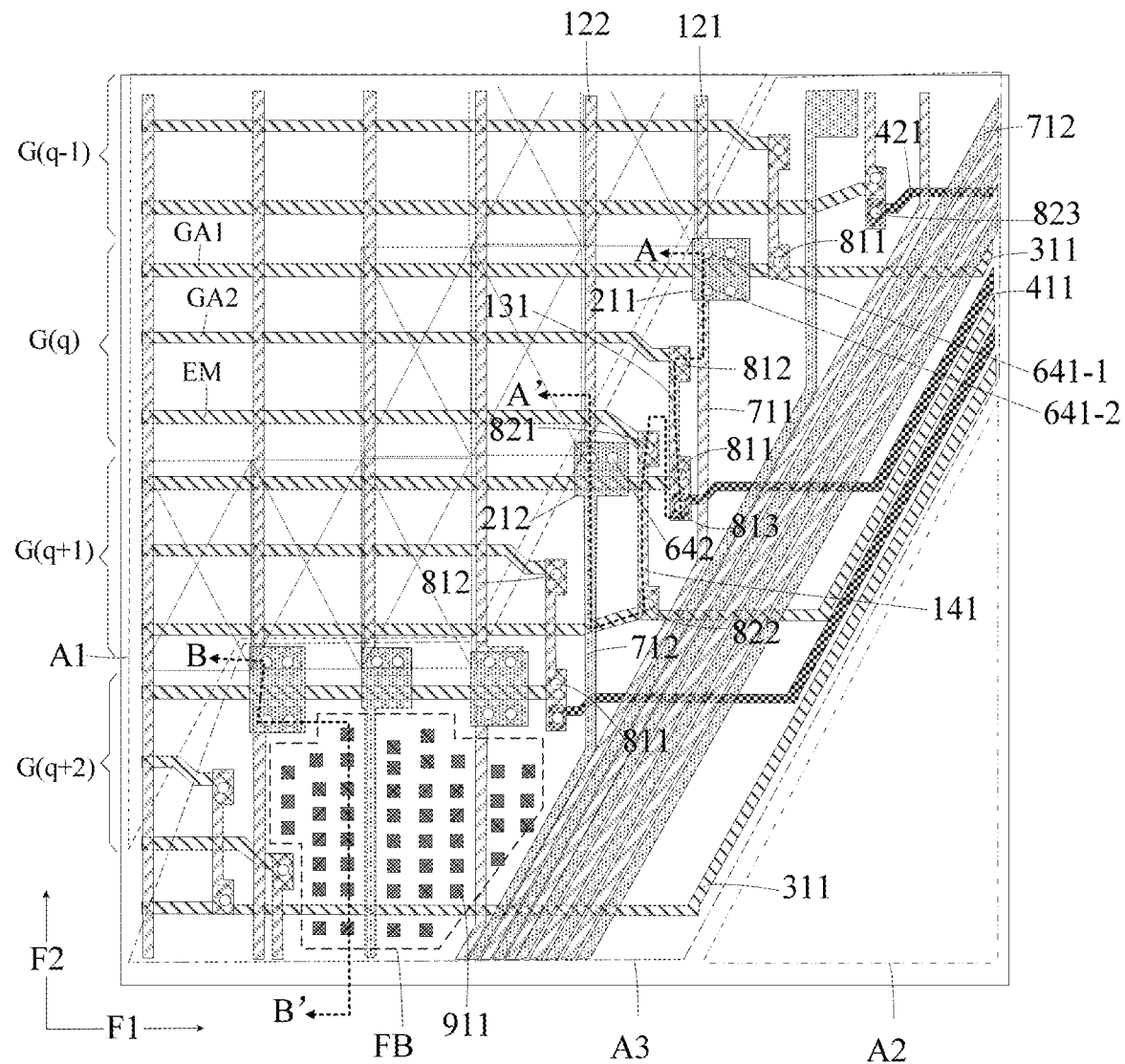
FIG. 9A is a schematic structural diagram of a layout of a partial region of some other display panels according to some embodiments of the disclosure.
Figure 9B:
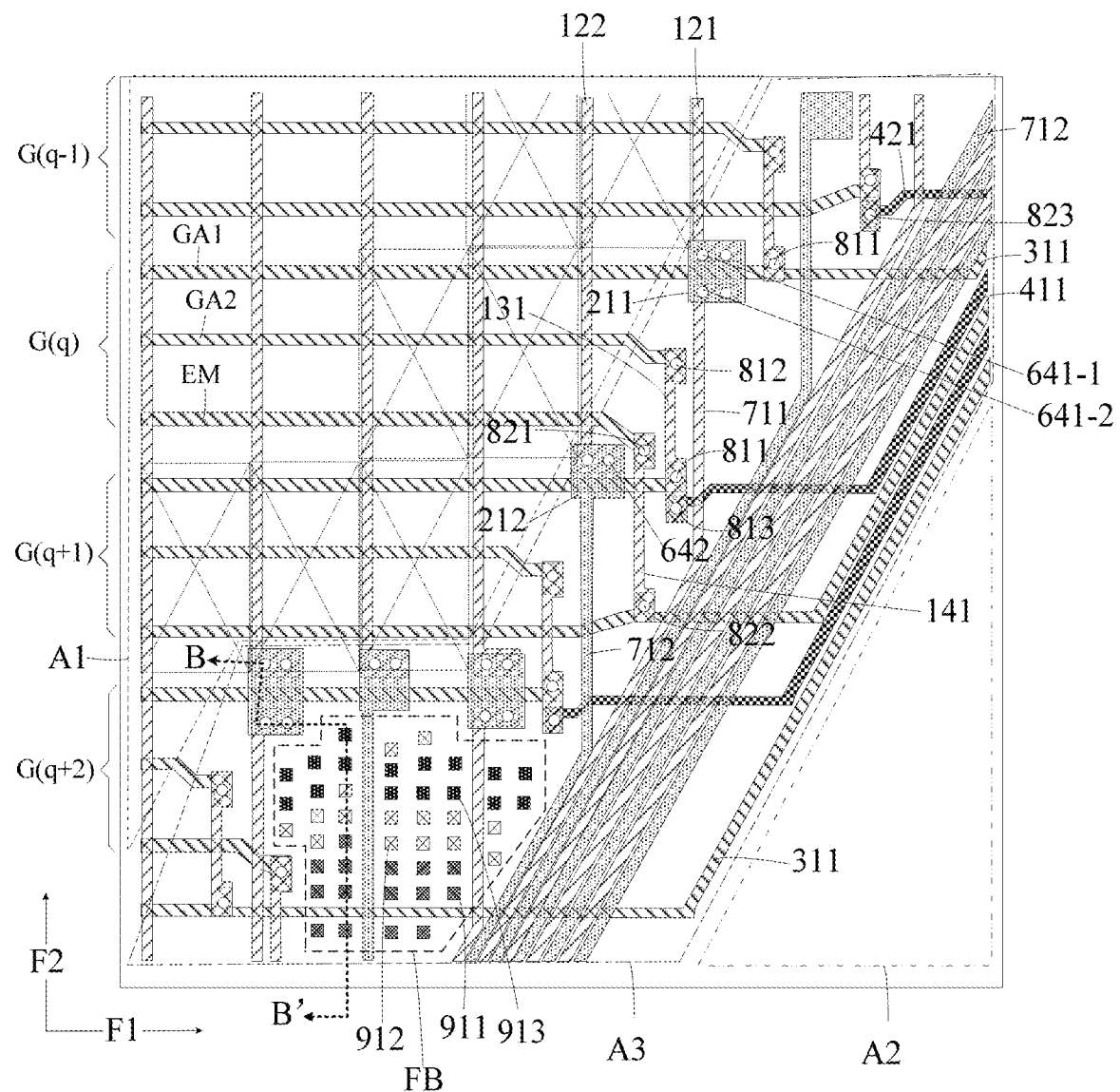
FIG. 9B is a schematic structural diagram of a layout of a partial region of some other display panels according to some embodiments of the disclosure.

It needs to be noted that when the semiconductor layer is patterned, the semiconductor layer in the first non-display area A3 is not etched off, so the semiconductor layer is still reserved in the first non-display area A3, as shown in FIG. 8B and FIG. 8C. In this way, a depth of the first auxiliary through hole 911 in a direction perpendicular to a plane where the base substrate is located is approximately the same as a depth of the first connecting through hole in a direction perpendicular to the plane where the base substrate is located. In this way, the degree of etching the first auxiliary through hole 911 through the etchant may be approximately the same as the degree of etching the first connecting through hole through the etchant so that the uniformity of the features of the transistors can be further improved.

Exemplarily, during specific implementation, in embodiments of the disclosure, a plurality of first auxiliary through holes 911 may be formed in the first non-display area A3. For example, a distribution density of the first auxiliary through holes 911 may be approximately the same as a distribution density of the first connecting through holes. In this way, the etching effect of the first connecting through hole etched in the sub-pixels spx at the edge of the display area and the etching effect of the first connecting through hole etched in the sub-pixels spx in the display area can be uniform, and the uniformity of the features of the transistors is improved.

Exemplarily, during specific implementation, in embodiments of the disclosure, the distribution density of the first auxiliary through hole 911 may be smaller than the distribution density of the first connecting through hole. Other routing wires or connecting portions are also arranged in the first non-display area A3, a whole occupying area of all the first auxiliary through holes 911 can be reduced by reducing the distribution density of the first auxiliary through holes 911, and thus the occupying area of the first non-display area A3 is reduced. Besides, the first auxiliary through holes 911 are formed, so that the etching effect of the first connecting through hole etched in the sub-pixels spx at the edge of the display area and the etching effect of the first connecting through hole etched in the sub-pixel spx in the display area can be uniform, and the uniformity of the features of the transistors is improved.

It needs to be noted that the distribution density of the first auxiliary through hole 911 may be the quantity of the first auxiliary through holes 911 in a unit area. The distribution density of the first connecting through hole may be the quantity of the first connecting through holes in an unit area. During actual application, the distribution density of the first auxiliary through hole 911 and the distribution density of the first connecting through hole can be designed and determined according to demands of the actual application environments, which is not limited here.

Exemplarily, during specific implementation, in embodiments of the disclosure, an interval between two adjacent first auxiliary through holes may be approximately equal to an interval between two adjacent first connecting through holes. In this way, design can be made by using the interval between the first connecting through holes without extra design of the interval between the first auxiliary through holes. Certainly, the interval between the two adjacent first auxiliary through holes may be smaller than the interval between two adjacent first connecting through holes. In this way, the first auxiliary through holes can be arranged more compactly, so that the occupying area of the first non-display area is reduced.

Exemplarily, during specific implementation, in embodiments of the disclosure, as shown in FIG. 7A to FIG. 8C, the orthographic projection of the first auxiliary through holes 911 on the base substrate 010 do not overlap with orthographic projections of the semiconductor layer, the first conductive layer 100, the third conductive layer 300 and the fourth conductive layer 400 on the base substrate 010. In this way, influence on the conductive layers and the semiconductor layer can be reduced during etching of the first auxiliary through holes 911.

In actual application, the second connecting through holes are also configured to realize electrical connection of the transistors in the sub-pixels spx, the electrical connection of these transistors is related to the features of the transistors, so if the electrical connection of the transistors is uniform, the features of the transistors can be uniform. The second connecting through holes are formed through the etchant generally by using the wet etching method. However, when the second connecting through holes of the sub-pixels spx at the edge of the display area A1 are etched, a second connecting through hole does not need to be etched outside the edge of the display area A1, so that the etching degree of the second connecting through holes of the sub-pixels spx at the edge of the display area A1 is different from the etching degree of the second connecting through holes of the sub-pixels spx in the display area A1, and consequently the features of the transistors in the sub-pixels spx at the edge of the display area A1 and the features of the transistors in the sub-pixels spx in the display area are not uniform. In order to improve the uniformity of the features of the transistors, during specific implementation, in embodiments of the disclosure, the functional layer includes the third conductive layer, the target insulating layer includes: the second gate insulating layer and the interlayer dielectric layer, the connecting through hole includes the second connecting through hole, the auxiliary through hole includes the second auxiliary through hole, and the second auxiliary through hole runs through the second gate insulating layer and the interlayer dielectric layer. Exemplarily, as shown in FIG. 7B and FIG. 8C, the display panel may further include at least one second auxiliary through hole 912 located in the first non-display area A3, the second auxiliary through hole 912 runs through the second gate insulating layer 620 and the interlayer dielectric layer 630, and the second auxiliary through hole 912 is not filled with the conductive material. Besides, the second auxiliary through hole 912 may be also located in the auxiliary through hole FB. During specific implementation, the second auxiliary through hole 912 may be filled with an insulating material. For example, the second auxiliary through hole 912 may be filled with the material of the interlayer insulating layer 640. In this way, when the interlayer insulating layer 640 is fabricated, the second auxiliary through hole 912 is directly filled, so that flatness of the interlayer insulating layer 640 can be improved.

Exemplarily, during specific implementation, in embodiments of the disclosure, a plurality of second auxiliary through holes 912 may be arranged in the first non-display area A3. For example, a distribution density of the second auxiliary through holes 912 may be approximately equal to the distribution density of the second connecting through holes. In this way, the etching effect of the second connecting through holes etched in the sub-pixels spx at the edge of the display area and the etching effect of the second connecting through holes etched in the sub-pixels spx in the display area can be uniform, and the uniformity of the features of the transistors is improved.

Exemplarily, during specific implementation, in embodiments of the disclosure, the distribution density of the second auxiliary through holes 912 may be smaller than the distribution density of the second connecting through holes. As other routing wires or connecting portions are further arranged in the first non-display area A3, the whole occupying area of all the second auxiliary through holes 912 can be reduced by reducing the distribution density of the second auxiliary through holes 912, and the occupying area of the first non-display area A3 is reduced. Besides, the second auxiliary through holes 912 are further formed, so that the etching effect of the second connecting through holes etched in the sub-pixels spx at the edge of the display area and the etching effect of the first connecting through holes etched in the sub-pixels spx in the display area can be uniform, and the uniformity of the features of the transistors is improved.

It needs to be noted that the distribution density of the second auxiliary through holes 912 may be the quantity of the second auxiliary through holes 912 in a unit area. The distribution density of the second connecting through holes may be the quantity of the second connecting through holes in a unit area. In actual application, the distribution density of the second auxiliary through holes 912 and the distribution density of the second connecting through holes can be designed and determined according to demands of the actual application environment, which is not limited here.

It needs to be noted that when the third conductive layer 300 is patterned, the third conductive layer 300 in the first non-display area A3 will be etched off, so the third conductive layer 300 will not be reserved in the first non-display area A3, as shown in FIG. 8C. In this way, a depth of the second auxiliary through hole 912 in the direction perpendicular to the plane where the base substrate is located is larger than the depth of the second connecting through hole in the direction perpendicular to the plane where the base substrate is located.

Exemplarily, during specific implementation, in embodiments of the disclosure, an interval between two adjacent second auxiliary through holes may be approximately equal to an interval between two adjacent second connecting through holes. In this way, design can be made by using the interval between the second connecting through holes without extra design of the interval between the second auxiliary through holes. Certainly, the interval between the two adjacent second auxiliary through holes may be smaller than the interval between the two adjacent second connecting through holes. In this way, the second auxiliary through holes may be arranged more compactly, and the occupying area of a second non-display area is reduced.

Exemplarily, during specific implementation, in embodiments of the disclosure, as shown in FIG. 7B, the orthographic projection of the second auxiliary through holes 912 on the base substrate 010 do not overlap with the orthographic projections of the first conductive layer 100, the third conductive layer 300 and the fourth conductive layer 400 on the base substrate 010. In this way, influence on the conductive layers and the semiconductor layer can be reduced during etching of the second auxiliary through holes 912.

In actual application, the third connecting through holes are also configured to realize electrical connection of the transistors in the sub-pixels spx, electrical connection of these transistors is related to the features of the transistors, so if electrical connection of the transistors is uniform, the features of the transistors can be uniform. The third connecting through holes are formed through the etchant generally by using the wet etching method. However, when the third connecting through holes of the sub-pixels spx at the edge of the display area A1 are etched, a third connecting through hole does not need to be etched outside the edge of the display area A1, so the etching degree of the third connecting through holes of the sub-pixels spx at the edge of the display area A1 is different from the etching degree of the third connecting through holes of the sub-pixels spx in the display area A1, and consequently the features of the transistors in the sub-pixels spx at the edge of the display area A1 and the features of the transistors in the sub-pixels spx in the display area are not uniform. In order to improve the uniformity of the features of the transistors, during specific implementation, in embodiments of the disclosure, the functional layer includes the fourth conductive layer, the target insulating layer includes: the interlayer dielectric layer, the connecting through hole includes the third connecting through hole, the auxiliary through hole includes the third auxiliary through hole, and the third auxiliary through hole runs through the interlayer dielectric layer. Exemplarily, as shown in FIG. 7B and FIG. 8C, the display panel may further include at least one third auxiliary through hole 913 located in the first non-display area A3, the third auxiliary through hole 913 runs through the interlayer dielectric layer 630, and the third auxiliary through hole 913 is not filled with a conductive material. Besides, the third auxiliary through hole 913 may be also located in the auxiliary area FB. During specific implementation, the third auxiliary through hole 913 may be filled with the insulating material. For example, the third auxiliary through hole 913 may be filled with the material of the interlayer insulating layer 640. In this way, when the interlayer insulating layer 640 is fabricated, the third auxiliary through hole 913 may be directly filled, so that flatness of the interlayer insulating layer 640 may be improved.

Exemplarily, during specific implementation, in embodiments of the disclosure, a plurality of third auxiliary through holes 913 may be arranged in the first non-display area A3. For example, a distribution density of the third auxiliary through holes 913 may be approximately equal to a distribution density of the third connecting through holes. In this way, the etching effect of the third connecting through holes etched in the sub-pixels spx at the edge of the display area and the etching effect of the third connecting through holes etched in the sub-pixels spx in the display area can be uniform, and the uniformity of the features of the transistors is improved.

Exemplarily, during specific implementation, in embodiments of the disclosure, the distribution density of the third auxiliary through holes 913 may be smaller than the distribution density of the third connecting through holes. As other routing wires or connecting portions are further arranged in the first non-display area A3, the whole occupying area of all the third auxiliary through holes 913 can be reduced by reducing the distribution density of the third auxiliary through holes 913, and the occupying area of the first non-display area A3 is reduced. Besides, the third auxiliary through holes 913 are further formed, so that the etching effect of the third connecting through holes etched in the sub-pixels spx at the edge of the display area and the etching effect of the first connecting through holes etched in the sub-pixels spx in the display area can be uniform, and the uniformity of the features of the transistors is improved.

It needs to be noted that the distribution density of the third auxiliary through holes 913 may be the quantity of the third auxiliary through holes 913 in a unit area. The distribution density of the third connecting through holes may be the quantity of the third connecting through holes in a unit area. In actual application, the distribution density of the third auxiliary through holes 913 and the distribution density of the third connecting through holes can be designed and determined according to demands of the actual application environments, which is not limited here.

It needs to be noted that when the fourth conductive layer 400 is patterned, the fourth conductive layer 400 in the first non-display area A3 will be etched off, so the fourth conductive layer 400 will not be reserved in the first non-display area A3, as shown in FIG. 8C. In this way, a depth of the third auxiliary through hole 913 in the direction perpendicular to the plane where the base substrate is located may be larger than a depth of the third connecting through hole in the direction perpendicular to the plane where the base substrate is located.

Exemplarily, during specific implementation, in embodiments of the disclosure, the interval between the two adjacent third auxiliary through holes may be approximately equal to the interval between the two adjacent third connecting through holes. In this way, design can be made by using the interval between the third connecting through holes without extra design of the interval between the third auxiliary through holes. Certainly, the interval between the two adjacent third auxiliary through holes may be smaller than the interval between the two adjacent third connecting through holes. In this way, the third auxiliary through holes can be arranged more compactly, and the occupying area of the first non-display area is reduced.

Exemplarily, during specific implementation, in embodiments of the disclosure, as shown in FIG. 7B, the orthographic projection of the third auxiliary through hole 913 on the base substrate 010 does not overlap with the orthographic projections of the first conductive layer 100 on the base substrate 010 and the fourth conductive layer 400 on the base substrate 010. In this way, influence on the conductive layers and the semiconductor layer can be reduced during etching of the third auxiliary through holes 913.

It needs to be noted that as shown in FIG. 8A, GA1-G(q) represents the first scanning line to which the $q^{th}$ row of sub-pixels corresponds. GA2-G(q) represents the second scanning line to which the $q^{th}$ row of sub-pixels corresponds. GA1-G(q+1) represents the first scanning line to which the $(q+1)^{th}$ row of sub-pixels corresponds. EM-G(q) represents the light-emitting control line to which the $q^{th}$ row of sub-pixels corresponds. EM-G(q+1) represents the light-emitting control line to which the (q+1)th row of sub-pixels corresponds. It is similar to the above and will not be described in detail.

It needs to be noted that due to limit of process conditions or other factors, "the same as" or "equal to" in the above features does not represent "completely the same as" or "completely equal to", there may be some deviations, so a relation of "the same as" or "equal to" between all the features just approximately meets the above conditions, which still falls within the protection scope of the disclosure. For example, the above "the same as" may be allowed within an error allowed range.

Embodiments of the disclosure further provide some other display panels, as shown in FIG. 9A to FIG. 10C, which are transformed according to a part of implementations in the above embodiments. Only distinguishing portions of the present embodiment from the above embodiment are set forth below, and the same portions of them are not described in detail herein.

During specific implementation, in the present embodiment\ of the disclosure, as shown in FIG. 9A to FIG. 10A, as for the first scanning line GA1 and the first data connecting portion 211 to which the same row of sub-pixels spx corresponds as well as the first data line 121 and the first data transmission line 711 which are electrically connected to each other by using the first data connecting portion 211, the orthographic projection of the first data connecting portion 211 on the base substrate 010 and the orthographic projection of the first scanning line GA1 on the base substrate 010 have an overlapping region, the orthographic projections of the first data line 121 and the first data transmission line 711 on the base substrate 010 do not overlap with the orthographic projection of the first scanning line GA1 on the base substrate 010. In this way, an effective overlap area can be prevented from being formed between the first scanning line GA1 and the first data line 121. Besides, as the first data connecting portion 211 is disposed on the second conductive layer 200, the interval between the first scanning line GA1 and the first data connecting portion 211 can be larger, coupling capacitance between the first scanning line GA1 and the first data connecting portion 211 can be small, thus signal interference can be reduced, and the display effect can be improved.

During specific implementation, in the present embodiment of the disclosure, as shown in FIG. 9A to FIG. 10A, as for the first scanning line GA1 and the first data connecting portion 211 to which the same row of sub-pixels spx corresponds, an orthographic projection of an edge region of the first data connecting portion 211 on the base substrate 010 and the orthographic projection of the first scanning line GA1 on the base substrate 010 have an overlapping region. Or, as for the first scanning line GA1 and the first data connecting portion 211 to which the same row of sub-pixels spx corresponds, an orthographic projection of a center region of the first data connecting portion 211 on the base substrate 010 and the orthographic projection of the first scanning line GA1 on the base substrate 010 have an overlapping region.

During specific implementation, in the present embodiment of the disclosure, as shown in FIG. 9A to FIG. 10A, a part of rows of sub-pixels spx among the rows of sub-pixels spx of the first type correspond to two of the first data connecting portions. For example, the $(q+2)^{th}$ row of sub-pixels G(q+2) in FIG. 9A and FIG. 9B may correspond to two of the first data connecting portions: 211a and 211b. As for the first scanning line GA1, the second scanning line GA2 and two of the first data connecting portions to which the same row of sub-pixels spx corresponds, the orthographic projections of the two first data connecting portions 211a and 211b on the base substrate 010 and the orthographic projection of the first scanning line GA1 on the base substrate 010 may have an overlapping region, and the orthographic projections of the two first data connecting portions 211a and 211b on the base substrate 010 do not overlap with the orthographic projection of the second scanning line GA2 on the base substrate 010.

During specific implementation, in embodiments of the disclosure, as shown in FIG. 9A to FIG. 10A, as for the first scanning line GA1, the second scanning line GA2 and two of the first data connecting portions 211a and 211b to which the same row of sub-pixels spx corresponds, the orthographic projection of the first one 211a of the two first data connecting portions on the base substrate 010 is close to the orthographic projection of the first scanning through hole 811 to which the first scanning line GA1 corresponds on the base substrate 010. Exemplarily, compared with the second one 211b of the two first data connecting portions, the orthographic projection of the first one 211a on the base substrate 010 may be closer to the orthographic projection of the first scanning through hole 811 to which the first scanning line GA1 corresponds on the base substrate 010.

During specific implementation, in embodiments of the disclosure, as shown in FIG. 9A to FIG. 10A, as for the first scanning line GA1, the second scanning line GA2 and two of the first data connecting portions to which the same row of sub-pixels spx corresponds, the orthographic projection of the second one 211b of the two first data connecting portions on the base substrate 010 are closer to the orthographic projection of the second scanning through hole 812 to which the second scanning line GA2 corresponds on the base substrate 010. Exemplarily, compared with the first one 211a of the two first data connecting portions, the orthographic projection of the second one 211b of the two first data connecting portions on the base substrate 010 may be closer to the orthographic projection of the second scanning through hole 812 to which the second scanning line GA2 corresponds on the base substrate 010.

During specific implementation, in the present embodiment of the disclosure, as shown in FIG. 9A to FIG. 10A, as for the first scanning line GA1 and the second data connecting portion 212 to which the same row of sub-pixels spx corresponds as well as the second data line 122 and the second data transmission line 712 which are electrically connected through the second data connecting portion 212, the orthographic projection of the second data connecting portion 212 on the base substrate 010 and the orthographic projection of the first scanning line GA1 on the base substrate 010 have an overlapping region, and orthographic projections of the second data line 122 and the second data transmission line 712 on the base substrate 010 do not overlap with the orthographic projection of the first scanning line GA1 on the base substrate 010.

During specific implementation, in the present embodiment of the disclosure, as shown in FIG. 9A to FIG. 10A, as for one row of sub-pixels corresponding to two of the first data connecting portions, the row of sub-pixels further corresponds to one second data connecting portion 212. As for the first scanning line GA1 and the second data connecting portion 212 to which the same row of sub-pixels corresponds as well as the second data line 122 and the second data transmission line 712 which are electrically connected through the second data connecting portion 212, the orthographic projection of the second data connecting portion 212 on the base substrate 010 and the orthographic projection of the first scanning line GA1 on the base substrate 010 have an overlapping region, and the orthographic projections of the second data line 122 and the second data transmission line 712 on the base substrate 010 do not overlap with the orthographic projection of the first scanning line GA1 on the base substrate 010.

Figure 10A:
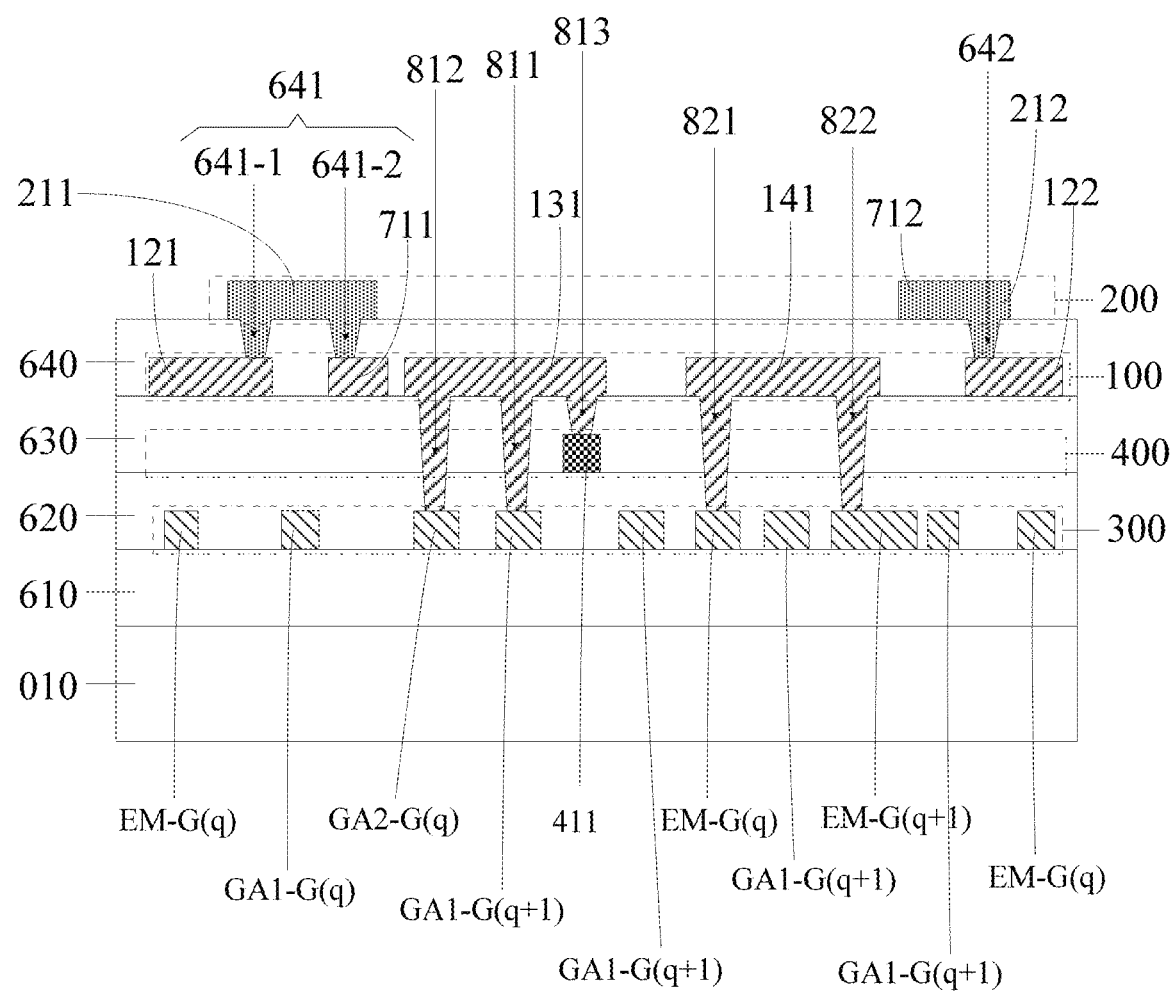
FIG. 10A is a schematic structural sectional view of the structure in the partial region of the display panels along a line AA' as shown in FIG. 9A.
Figure 10B:
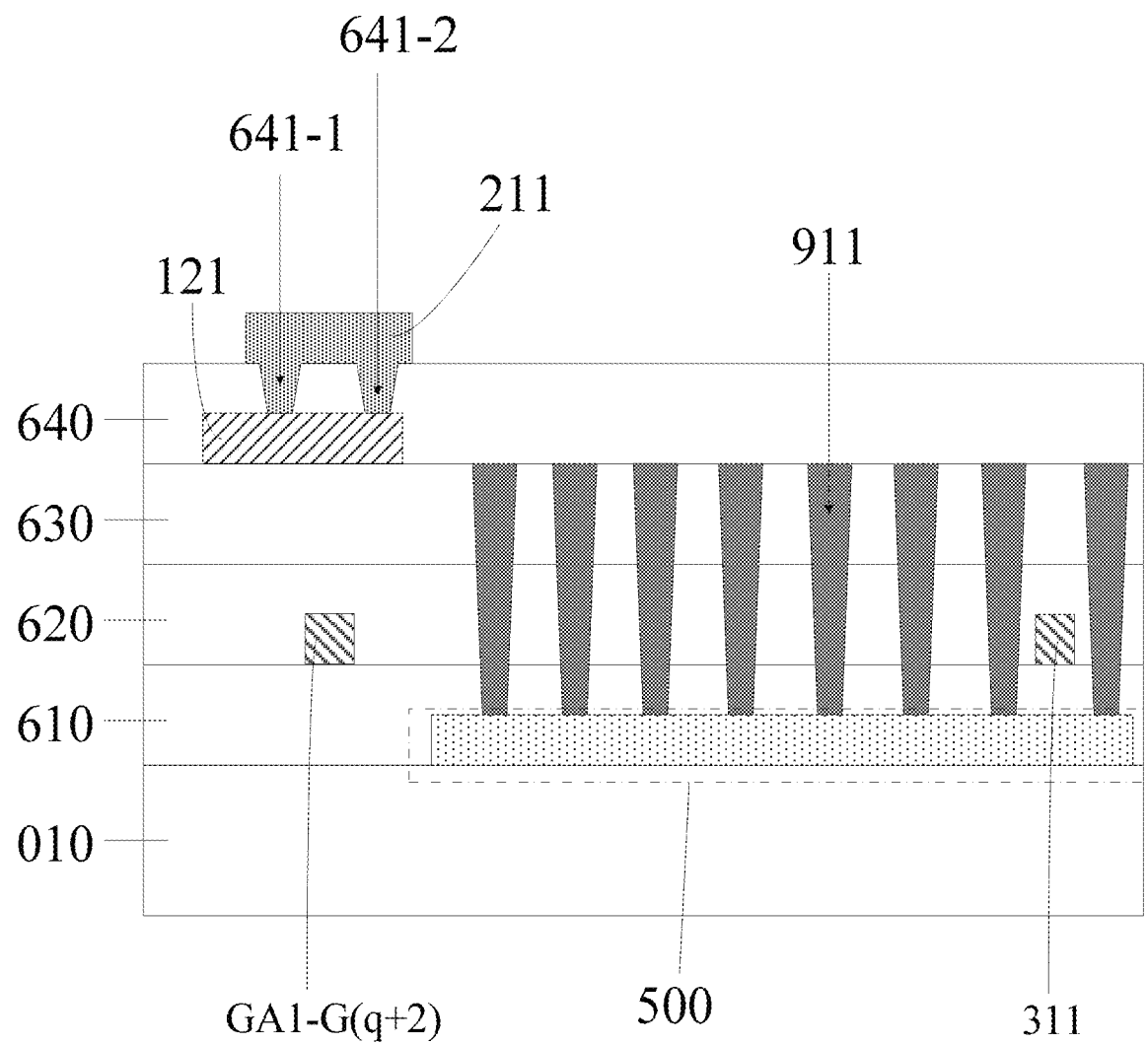
FIG. 10B is a schematic structural sectional view of the structure in the partial region of the display panels along a line BB' as shown in FIG. 9A.
Figure 10C:
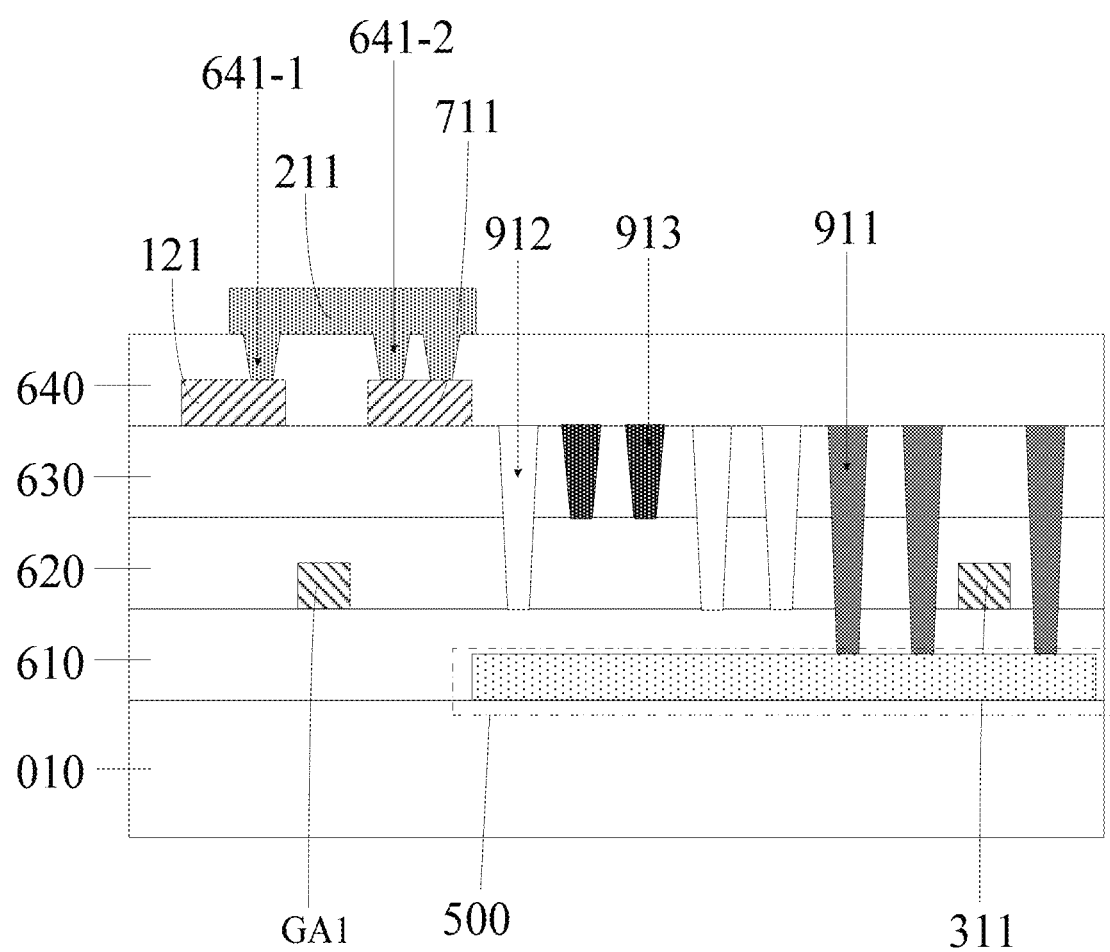
FIG. 10C is a schematic structural sectional view of the structure in the partial region of the display panels along a line BB' as shown in FIG. 9B.

It needs to be noted that as shown in FIG. 10B and FIG. 10C, the first auxiliary through hole 911, the second auxiliary through hole 912 and the third auxiliary through hole 913 are further formed in the display panel. Besides, arrangement modes of the first auxiliary through hole 911, the second auxiliary through hole 912 and the third auxiliary through hole 913 may refer to the above implementations and will not be described in detail herein.

Figure 11:
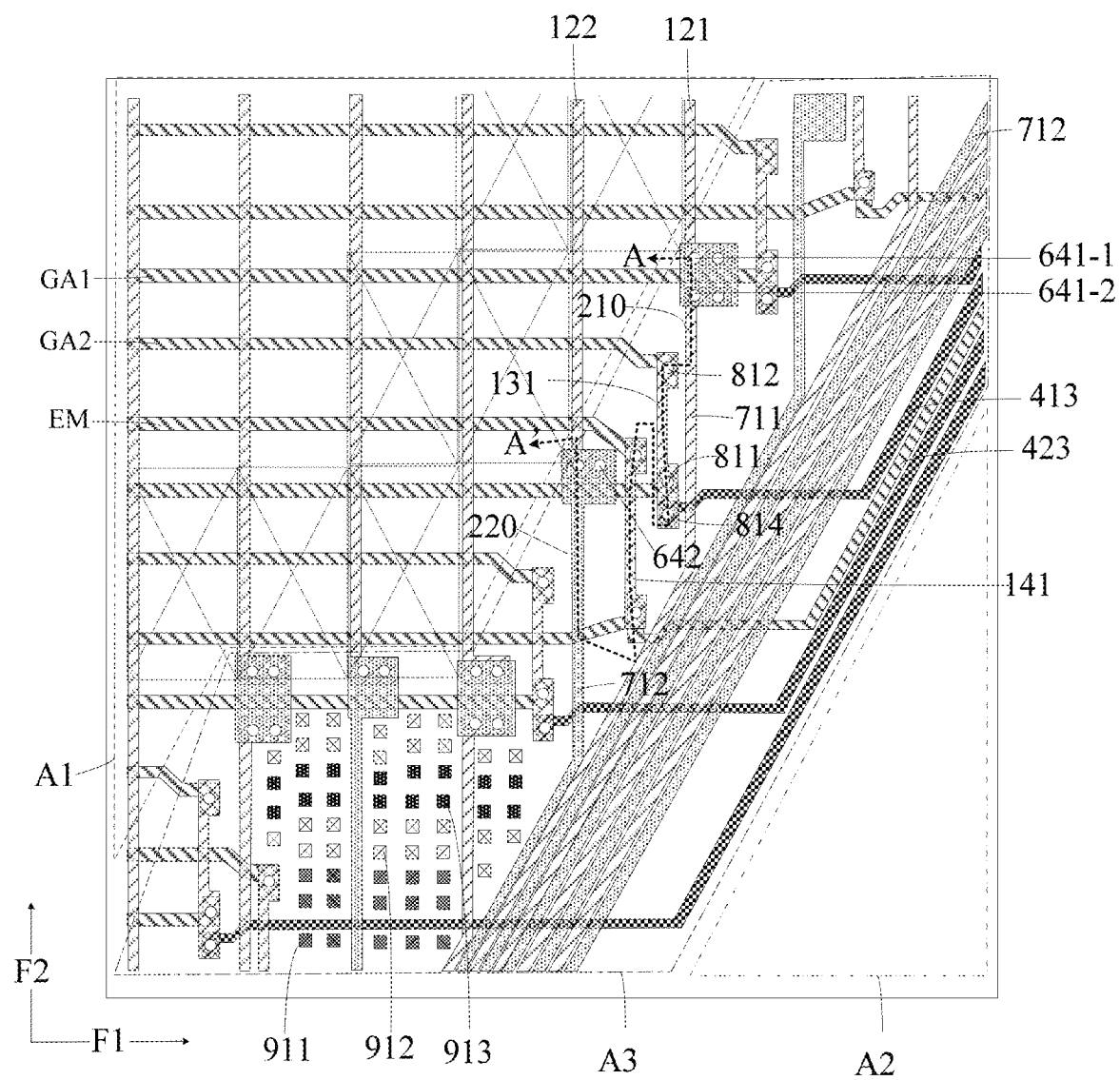
FIG. 11 is a schematic structural diagram of a layout of a partial region of some other display panels according to some embodiments of the disclosure.
Figure 12:
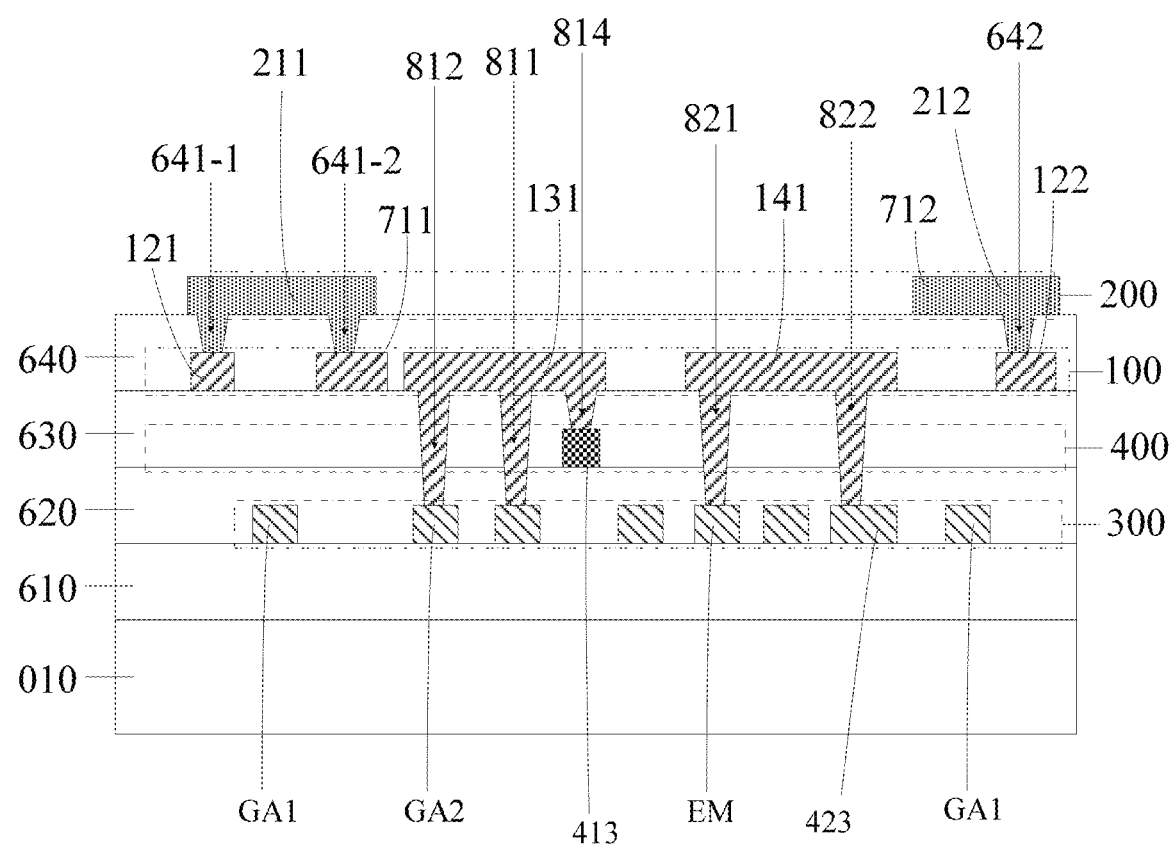
FIG. 12 is a schematic structural sectional view of the structure in the partial region of the display panels along a line AA' as shown in FIG. 11.

Embodiments of the disclosure further provides some other display panels, as shown in FIG. 11 and FIG. 12, which are transformed according to a part of implementations in the above embodiments. Only distinguishing portions of the present embodiment from the above embodiments are set forth below, and same portions of them are not described in detail herein.

During specific implementation, in the present embodiment of the disclosure, as shown in FIG. 11 and FIG. 12, the fourth conductive layer 400 may further include a plurality of third scanning transmission lines 413 located in the first non-display area A3. Besides, the interlayer dielectric layer 630 may further include a plurality of fourth scanning through holes 814, the first scanning line GA1 and the second scanning line GA2 which are electrically connected correspond to one of the third scanning transmission lines 413, and moreover, the first scanning connecting portion 131 is further electrically connected to the third scanning transmission line 413 through the fourth scanning through hole 814. The third conductive layer 300 may further include third light-emitting transmission lines 423 located in the first non-display area A3, and the light-emitting control lines which are mutually electrically connected are directly electrically connected to one third light-emitting transmission line 423. In this way, the third light-emitting transmission lines 423 may be arranged in the third conductive layer 300, and the third scanning transmission lines 413 may be arranged in the fourth conductive layer 400.

Exemplarily, in order to reduce signal interference, orthographic projections of the third scanning transmission lines 413 on the base substrate 010 do not overlap with the orthographic projections of the third light-emitting transmission lines 423 on the base substrate 010. Furthermore, the orthographic projections of the third scanning transmission lines 413 on the base substrate 010 and the orthographic projections of the third light-emitting transmission lines 423 on the base substrate 010 are arranged at intervals.

Furthermore, in order to reduce signal interference, the orthographic projections of the third scanning transmission lines 413 on the base substrate 010 and the orthographic projections of the second data transmission lines 712 on the base substrate 010 may have an overlapping region. Furthermore, the orthographic projections of the third scanning transmission lines 413 on the base substrate 010 may partially overlap with the orthographic projections of the second data transmission lines 712 on the base substrate 010. As the third scanning transmission lines are located in the fourth conductive layer 400 and the second data transmission lines 712 are disposed on the second conductive layer 200, not only can coupling capacitance between the third scanning transmission lines 413 and the second data transmission lines 712 be reduced, but also the occupying area of the first non-display area A3 can be reduced.

Furthermore, in order to reduce signal interference, the orthographic projections of the third light-emitting transmission lines 423 on the base substrate 010 and the orthographic projections of the first data transmission lines 711 on the base substrate 010 may have an overlapping region. Furthermore, the orthographic projections of the third light-emitting transmission lines 423 on the base substrate 010 may partially overlap with the orthographic projections of the first data transmission lines 711 on the base substrate 010. As the third light-emitting transmission lines 423 are disposed on the third conductive layer 300 and the first data transmission lines 711 are disposed on the first conductive layer 100, not only can the coupling capacitance between the third light-emitting transmission lines and the first data transmission lines 711 be reduced, but also the occupying area of the first non-display area A3 can be reduced.

It needs to be noted that arrangement modes of the first auxiliary through hole 911, the second auxiliary through hole 912 and the third auxiliary through hole 913 may refer to the above implementations and will not be described in detail herein.

Figure 13:
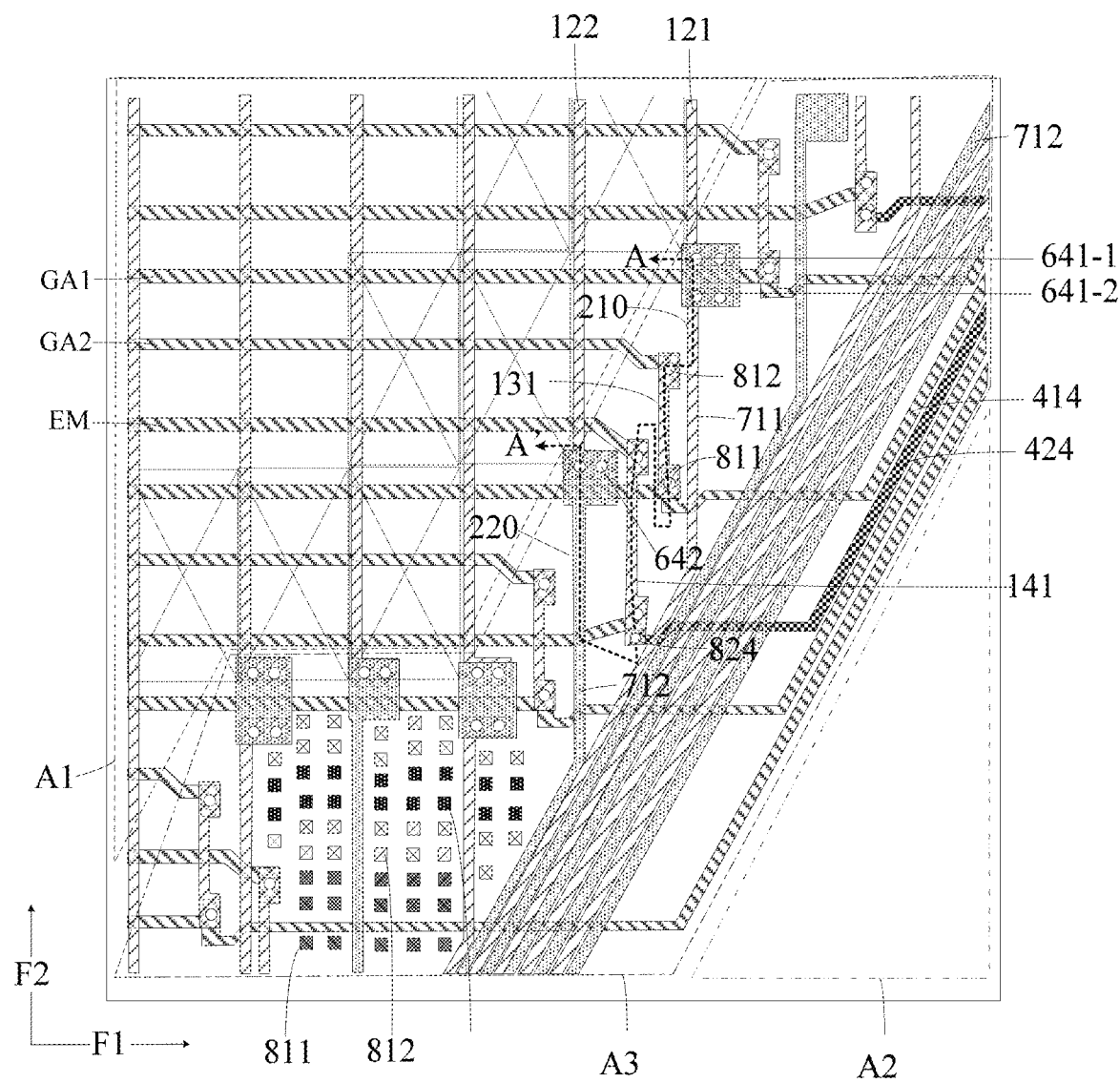
FIG. 13 is a schematic structural diagram of a layout of a partial region of some other display panels according to some embodiments of the disclosure.
Figure 14:
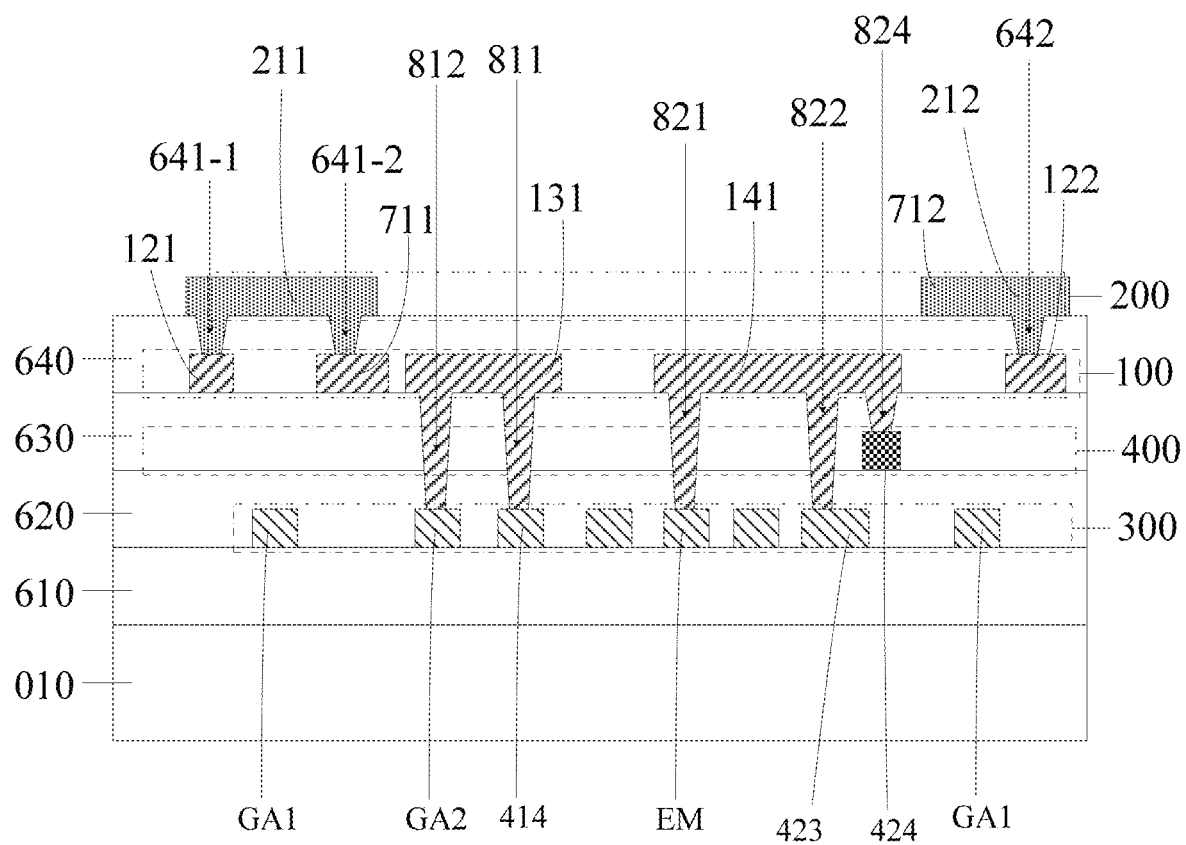
FIG. 14 is a schematic structural sectional view of the structure in the partial region of the display panels along a line BB' as shown in FIG. 13.

Embodiments of the disclosure further provided some other display panels, as shown in FIG. 13 and FIG. 14, which are transformed according to a part of implementations in the above embodiments. Only distinguishing portions of the present embodiment from the above embodiments are set forth below, and same portions of them are not described in detail herein.

During specific implementation, in the present embodiment of the disclosure, as shown in FIG. 13 and FIG. 14, the fourth conductive layer 400 may further include a plurality of fourth light-emitting transmission lines 424 located in the first non-display area A3, and the interlayer dielectric layer 630 may further include a plurality of fourth light-emitting through holes 824, and the light-emitting control lines EM which are mutually electrically connected correspond to one fourth light-emitting transmission line 424. Besides, the first light-emitting connecting portion 141 is further electrically connected to the fourth light-emitting transmission line 424 through the fourth light-emitting through hole 824, the third conductive layer 300 may further include the fourth scanning transmission line 414 located in the first non-display area A3, and the first scanning line GA1 and the second scanning line GA2 which are mutually electrically connected are directly electrically connected to one fourth scanning transmission line 414. In this way, the fourth scanning transmission lines 414 are arranged in the third conductive layer 300, and the fourth light-emitting transmission lines 424 are arranged in the fourth conductive layer 400.

Exemplarily, in order to reduce signal interference, as shown in FIG. 13 and FIG. 14, orthographic projections of the fourth scanning transmission lines 414 on the base substrate 010 may not overlap with orthographic projections of the fourth light-emitting transmission lines 424 on the base substrate 010. Exemplarily, the orthographic projections of the fourth scanning transmission lines 414 on the base substrate 010 and the orthographic projections of the fourth light-emitting transmission lines 424 on the base substrate 010 may be arranged at intervals.

Furthermore, in order to reduce signal interference, the orthographic projections of the fourth scanning transmission lines 414 on the base substrate 010 and the orthographic projections of the first data transmission lines 711 on the base substrate 010 may have an overlapping region. Furthermore, the orthographic projections of the fourth scanning transmission lines 414 on the base substrate 010 may partially overlap with the orthographic projections of the first data transmission lines 711 on the base substrate 010. As the fourth scanning transmission lines are disposed on the third conductive layer 300, and the first data transmission lines 711 are disposed on the first conductive layer 100, not only can coupling capacitance between the fourth scanning transmission lines and the first data transmission lines 711 be reduced, and the occupying area of the first non-display area A3 can be reduced.

Furthermore, in order to reduce signal interference, the orthographic projections of the fourth light-emitting transmission lines 424 on the base substrate 010 and the orthographic projections of the second data transmission lines 712 on the base substrate 010 may have an overlapping region. Furthermore, the orthographic projections of the fourth light-emitting transmission lines 424 on the base substrate 010 may partially overlap with the orthographic projections of the second data transmission lines 712 on the base substrate 010. As the fourth light-emitting transmission lines 424 are disposed on the fourth conductive layer 400 and the second data transmission lines 712 are disposed on the second conductive layer 200, not only can coupling capacitance between the fourth light-emitting transmission lines and the second data transmission lines 712 be larger, but also the occupying area of the first non-display area A3 can be reduced.

It needs to be noted that arrangement modes of the first auxiliary through hole 911, the second auxiliary through hole 912 and the third auxiliary through hole 913 may refer to the above implementation and will not be described in detail herein.

Based on the same inventive concept, embodiments of the disclosure further provide a display apparatus, including the above display panel provided by embodiments of the disclosure. A principle of solving problem of the display apparatus is similar to that of the aforementioned display panel, so implementation of the display apparatus may refer to implementation of the aforementioned display panel, and repetitions are not described in detail herein.

During specific implementation, in embodiments of the disclosure, the display apparatus may be: a mobile phone, a tablet PC, a TV, a display, a laptop, a digital photo frame, a navigator and any other product or component with a display function. Other essentially components of the display apparatus can be understood by those ordinarily skilled in the art, which is neither described in detail herein, nor supposed to limit the disclosure.

According to the display panel and the display apparatus provided by the embodiments of the disclosure, the first data connecting portions are arranged in the second conductive layer, so that the data lines and the first data transmission lines in the first conductive layer can be mutually electrically connected through the first data connecting portions in the second conductive layer. Accordingly, not only can the data lines to which the same column of sub-pixels corresponds and which are divided by the notch area be electrically connected, but also interference with the third conductive layer and the fourth conductive layer due to the first data connecting portions can be reduced, thus signal stability can be improved, and the display effect can be improved.

Although the preferred embodiments of the disclosure have been described, once those skilled in the art learn basic creative concepts, other variations and modifications may be made to these embodiments. Therefore, the appended claims are intended to be constructed to include the preferred embodiments and all variations and modifications falling into the scope of the disclosure.

Obviously, those skilled in the art may make various modifications and variations to the embodiments of the disclosure without departing from the spirit and scope of the embodiments of the disclosure. Thus, if these modifications and variations of the embodiments of the disclosure fall into the scope of the claims and their equivalent technology of the disclosure, the disclosure is also intended to include these modifications and variations.

The invention claimed is:

1. A display panel, comprising:
a base substrate, comprising a notch area, a display area and a first non-display area, wherein the first non-display area is located between the notch area and the display area;
a first conductive layer, disposed on the base substrate;
a target insulating layer, disposed between the first conductive layer and the base substrate; and
a functional layer, disposed between the target insulating layer and the base substrate; wherein
in the display area, a plurality of sub-pixels, a plurality of data lines, a plurality of scanning lines and a plurality of light-emitting control lines are provided, wherein at least one of the plurality of sub-pixels comprises a connecting through hole, the connecting through hole runs through the target insulating layer, and the first conductive layer is electrically connected to the functional layer through the connecting through hole;
in the first non-display area, at least one auxiliary through hole, a plurality of data transmission lines, a plurality of scanning transmission lines and a plurality of light-emitting transmission lines are provided, wherein at least one of the plurality of data lines is electrically connected to at least one of the plurality of data transmission lines, at least one of the plurality of scanning lines is electrically connected to at least one of the plurality of scanning transmission lines, and at least one of the plurality of light-emitting control lines is electrically connected to at least one of the plurality of light-emitting transmission lines; and
in the first non-display area, an auxiliary region is formed by rounding of at least two types of transmission lines among the plurality of data transmission lines, the plurality of scanning transmission lines and the plurality of light-emitting transmission lines, and the auxiliary through hole is located in the auxiliary region, runs through the target insulating layer and is not filled with a conductive material;
wherein the display panel further comprises:
a first gate insulating layer, disposed between the semiconductor layer and the first conductive layer;
a third conductive layer, disposed between the first gate insulating layer and the first conductive layer;
a second gate insulating layer, disposed between the third conductive layer and the first conductive layer;
a fourth conductive layer, disposed between the second gate insulating layer and the first conductive layer; and
an interlayer dielectric layer, disposed between the fourth conductive layer and the first conductive layer; wherein
at least one of the plurality of sub-pixels comprises: a first connecting through hole, a second connecting through hole and a third connecting through hole; wherein the first connecting through hole runs through the first gate insulating layer, the second gate insulating layer and the interlayer dielectric layer; the second connecting through hole runs through the second gate insulating layer and the interlayer dielectric layer; and the third connecting through hole runs through the interlayer dielectric layer;
the first conductive layer is electrically connected to the semiconductor layer through the first connecting through hole;
the first conductive layer is electrically connected to the third conductive layer through the second connecting through hole;
the first conductive layer is electrically connected to the fourth conductive layer through the third connecting through hole; and
the auxiliary through hole is filled with an insulating material.

2. The display panel according to claim 1, further comprising:
an interlayer insulating layer, disposed on a side of the first conductive layer facing away from the base substrate, wherein
the auxiliary through hole is filled with a material of the interlayer insulating layer.

3. The display panel according to claim 2, wherein the functional layer comprises the semiconductor layer;
the target insulating layer comprises: the first gate insulating layer, the second gate insulating layer and the interlayer dielectric layer;
the connecting through hole comprises the first connecting through hole; and
the auxiliary through hole comprises a first auxiliary through hole, wherein the first auxiliary through hole runs through the first gate insulating layer, the second gate insulating layer and the interlayer dielectric layer, and a material filling the first auxiliary through hole runs through the first gate insulating layer, the second gate insulating layer and the interlayer dielectric layer;
wherein a distribution density of the first auxiliary through hole is smaller than or approximately equal to a distribution density of the first connecting through hole; or
wherein an orthographic projection of the first auxiliary through hole on the base substrate does not overlap with orthographic projections of the semiconductor layer, the third conductive layer, the fourth conductive layer and the first conductive layer on the base substrate.

4. The display panel according to claim 2, wherein the functional layer comprises the third conductive layer;
the target insulating layer comprises: the second gate insulating layer and the interlayer dielectric layer;
the connecting through hole comprises the second connecting through hole; and
the auxiliary through hole comprises a second auxiliary through hole, wherein the second auxiliary through hole runs through the second gate insulating layer and the interlayer dielectric layer, and a material filling in the second auxiliary through hole runs through the second gate insulating layer and the interlayer dielectric layer;

wherein a distribution density of the second auxiliary through hole is smaller than or approximately equal to a distribution density of the second connecting through hole; or wherein an orthographic projection of the second auxiliary through hole on the base substrate does not overlap with the orthographic projections of the third conductive layer, the fourth conductive layer and the first conductive layer on the base substrate.

5. The display panel according to claim 2, wherein the functional layer comprises the fourth conductive layer;

the target insulating layer comprises: the interlayer dielectric layer;

the connecting through hole comprises the third connecting through hole; and the auxiliary through hole comprises a third auxiliary through hole, wherein the third auxiliary through hole runs through the interlayer dielectric layer, and a material filling the third auxiliary through hole runs through the interlayer dielectric layer;

wherein a distribution density of the third auxiliary through hole is smaller than or approximately equal to a distribution density of the third connecting through hole; or wherein an orthographic projection of the third auxiliary through hole on the base substrate does not overlap with the orthographic projections of the fourth conductive layer and the first conductive layer on the base substrate.

6. The display panel according to claim 1, wherein the plurality of data transmission lines comprise a plurality of first data transmission lines; the first conductive layer comprises the plurality of data lines and the plurality of first data transmission lines; and the interlayer insulating layer has a plurality of first data through holes; and the display panel further comprises:

a second conductive layer, disposed on a side of the interlayer insulating layer facing away from the base substrate and comprising a plurality of first data connecting portions; wherein at least one of the plurality of first data connecting portions is electrically connected to at least one of the plurality of data lines and at least one of the plurality of first data transmission lines respectively through at least one of the first data through holes.

7. The display panel according to claim 6, wherein the plurality of data transmission lines comprise a plurality of second data transmission lines;

the second conductive layer further comprises: the plurality of second data transmission lines, wherein the plurality of second data transmission lines and the plurality of first data connecting portions are arranged at intervals;

the interlayer insulating layer further comprises: a plurality of second data through holes; and the plurality of data lines comprise a plurality of first data lines and a plurality of second data lines, wherein one of the first data lines is electrically connected to one of the first data transmission lines through a corresponding first data connecting portion, and one of the second data lines is electrically connected to one of the second data transmission lines through a corresponding second data through hole.

8. The display panel according to claim 7, wherein the third conductive layer comprises the plurality of scanning lines and the plurality of light-emitting control lines, and the plurality of scanning lines comprise a plurality of first scanning lines and a plurality of second scanning lines;

the display area further comprises the plurality of sub-pixels, wherein one row of sub-pixels corresponds to one of the first scanning lines and one of the second scanning lines, and in every two adjacent rows of sub-pixels, the second scanning line to which a first row of sub-pixels corresponds is electrically connected to the first scanning line to which the second row of sub-pixels corresponds; and one row of sub-pixels corresponds to one of the light-emitting control lines; and the light-emitting control lines to which two adjacent rows of sub-pixels correspond are electrically connected to each other.

9. The display panel according to claim 8, wherein the first conductive layer further comprises: a plurality of first scanning connecting portions which are insulated and spaced from the data lines and the first data transmission lines; a second scanning line to which a $(q-1)^{th}$ row of sub-pixels corresponds and a first scanning line to which a $q^{th}$ row of sub-pixels corresponds are electrically connected through at least one of the first scanning connection portions, and q is an integer;

a second insulating layer comprises a plurality of first scanning through holes and a plurality of second scanning through holes; and a first terminal of one of the plurality of first scanning connecting portions is electrically connected to a corresponding first scanning line through at least one of the plurality of first scanning through holes, and a second terminal of the one of the plurality of first scanning connecting portions is electrically connected to a corresponding second scanning line through at least one of the plurality of second scanning through holes.

10. The display panel according to claim 9, wherein all rows of sub-pixels comprise rows of sub-pixels of a first type; at least one row of sub-pixels among the rows of sub-pixels of the first type corresponds to at least one of the first data connecting portions; and as for a first scanning line, a second scanning line and a first data connecting portion to which a same row of sub-pixels corresponds, an orthographic projection of the first data connecting portion on the base substrate does not overlap with orthographic projections of a first scanning connection portion to which the first scanning line corresponds on the base substrate and a first scanning connecting portion to which the second scanning line corresponds on the base substrate.

11. The display panel according to claim 10, wherein as for the first scanning line, the second scanning line and the first data connecting portion to which the same row of sub-pixels corresponds, the orthographic projection of the first data connecting portion on the base substrate is located between an orthographic projection of a first scanning through hole to which the first scanning line corresponds on the base substrate and an orthographic projection of a second scanning through hole to which the second scanning line corresponds on the base substrate; or wherein as for the first scanning line, the second scanning line and the first data connecting portion to which the same row of sub-pixels corresponds, a connected line between a center of the orthographic projection of the first scanning through hole to which the first scanning line corresponds on the base substrate and a center of the orthographic projection of the second scanning through hole to which the second scanning line corresponds on the base substrate overlaps with the orthographic projection of the first data connecting portion on the base substrate.

12. The display panel according to claim 10, wherein as for the first scanning line and the first data connecting portion to which the same row of sub-pixels corresponds as well as a first data line and a first data transmission line which are electrically connected to each other by using the first data connecting portion, the orthographic projection of the first data connecting portion on the base substrate and the orthographic projection of the first scanning line on the base substrate have an overlapping region, and orthographic projections of the first data line on the base substrate and the first data transmission line on the base substrate do not overlap with the orthographic projection of the first scanning line on the base substrate.

13. The display panel according to claim 12, wherein as for the first scanning line and the first data connecting portion to which the same row of sub-pixels corresponds, an orthographic projection of an edge region of the first data connecting portion on the base substrate and the orthographic projection of the first scanning line on the base substrate have an overlapping region; or
wherein as for the first scanning line and the first data connecting portion to which the same row of sub-pixels corresponds, an orthographic projection of a center region of the first data connecting portion on the base substrate and the orthographic projection of the first scanning line on the base substrate have an overlapping region.

14. The display panel according to claim 10, wherein a part of rows of sub-pixels in the rows of sub-pixels of the first type correspond to two of the first data connecting portions, as for the first scanning line, the second scanning line and the two first data connecting portions to which the same row of sub-pixels corresponds, orthographic projections of the two first data connecting portions on the base substrate and an orthographic projection of the first scanning line on the base substrate have an overlapping region, and the orthographic projections of the two first data connecting portions on the base substrate do not overlap with an orthographic projection of the second scanning line on the base substrate.

15. The display panel according to claim 14, wherein as for the first scanning line, the second scanning line and two first data connecting portions to which the same row of sub-pixels corresponds,
an orthographic projection of a first one of the two first data connecting portions on the base substrate is close to an orthographic projection of the first scanning through hole to which the first scanning line corresponds on the base substrate; and/or
an orthographic projection of a second one of the two first data connecting portions on the base substrate is close to an orthographic projection of the second scanning through hole to which the second scanning line corresponds on the base substrate.

16. The display panel according to claim 10, wherein the second conductive layer further comprises: a plurality of second data connecting portions, wherein one of the second data transmission lines is directly electrically connected to at least one of the second data connecting portions, and the second data connecting portion is electrically connected to one of the second data lines through a corresponding second data through hole.

17. The display panel according to claim 16, wherein the first data lines and the second data lines are arranged alternately in a first direction; and
projections of the first data connecting portions and the second data connecting portions on a straight line extending in the first direction are arranged alternately.

18. The display panel according to claim 17, wherein all the rows of sub-pixels comprise rows of sub-pixels of a second type, and the rows of sub-pixels of the second type are different from the rows of sub-pixels of the first type;
at least one row of sub-pixels among the rows of sub-pixels of the second type corresponds to at least one of the second data connecting portions; and
as for the first scanning line and a second data connecting portion to which the same row of sub-pixels corresponds as well as a second data line and a second data transmission line which are electrically connected by using the second data connecting portion, an orthographic projection of the second data connecting portion on the base substrate and an orthographic projection of the first scanning line on the base substrate have an overlapping region, and orthographic projections of the second data line and the second data transmission line on the base substrate do not overlap with an orthographic projection of the first scanning line on the base substrate.

19. The display panel according to claim 18, wherein as for the row of sub-pixels corresponding to two of the first data connecting portions, the row of sub-pixels further corresponds to one of the second data connecting portions; and
as for the first scanning line and the second data connecting portion to which the same row of sub-pixels corresponds as well as the second data line and the second data transmission line which are electrically connected by using the second data connecting portion, the orthographic projection of the second data connecting portion on the base substrate and the orthographic projection of the first scanning line on the base substrate have an overlapping region, and the orthographic projections of the second data line and the second data transmission line on the base substrate do not overlap with the orthographic projection of the first scanning line on the base substrate.

20. The display panel according to claim 8, wherein the first conductive layer further comprises: a plurality of first light-emitting connecting portions insulated and spaced from the data lines and the first data transmission lines, and the light-emitting control lines which are electrically connected to one another correspond to at least one of the first light-emitting connecting portions;
the second insulating layer comprises: a plurality of first light-emitting through holes and a plurality of second light-emitting through holes; and
a first terminal of one of the first light-emitting connecting portions is electrically connected to one corresponding light-emitting control line through at least one of the plurality of first light-emitting through holes, and a second terminal of the one of the first light-emitting connecting portions is electrically connected to another corresponding light-emitting control line through at least one of the plurality of second light-emitting through holes.

21. The display panel according to claim 20, wherein the plurality of scanning transmission lines comprise: a plurality of first scanning transmission lines and a plurality of second scanning transmission lines, and the light-emitting transmission lines comprise a plurality of first light-emitting transmission lines and a plurality of second light-emitting transmission lines;
- the third conductive layer further comprises the plurality of first scanning transmission lines and the plurality of first light-emitting transmission lines located in the first non-display area, and the first scanning transmission lines and the first light-emitting transmission lines are arranged at intervals;
- a part of the first scanning lines and the second scanning lines which are electrically connected to one another are directly electrically connected to one of the first scanning transmission lines, and a part of the light-emitting control lines which are electrically connected to one another are directly electrically connected to one of the first light-emitting transmission lines;
- the fourth conductive layer further comprises the plurality of scanning transmission lines and the plurality of second light-emitting transmission lines located in the first non-display area, and the second scanning transmission lines and the second light-emitting transmission lines are arranged at intervals;
- the interlayer dielectric layer further comprises a plurality of third scanning through holes and a plurality of third light-emitting through holes;
- the rest of first scanning lines and second scanning lines which are electrically connected to one another correspond to one of the second scanning transmission lines, and the first scanning connecting portion is further electrically connected to the second scanning transmission line through the third scanning through hole; and
- the rest of light-emitting control lines which are electrically connected to one another correspond to one of the second light-emitting transmission lines, and the first light-emitting connecting portion is further electrically connected to the second light-emitting transmission line through the third light-emitting through holes;

or
- wherein as for a light-emitting control line, a second scanning line and a second data connecting portion to which the same row of sub-pixels corresponds, an orthographic projection of the second data connecting portion on the base substrate is located between an orthographic projection of a second scanning through hole to which the second scanning line corresponds on the base substrate and an orthographic projection of a first light-emitting through hole to which the light-emitting control line corresponds on the base substrate.

22. The display panel according to claim 20, wherein the plurality of scanning transmission lines comprise: a plurality of third scanning transmission lines, and the light-emitting transmission lines comprise a plurality of third light-emitting transmission lines;
- the fourth conductive layer comprises the plurality of third scanning transmission lines located in the first non-display area;
- the interlayer dielectric layer comprises a plurality of fourth scanning through holes;
- the first scanning lines and the second scanning lines which are electrically connected to one another correspond to one of the third scanning transmission lines, and the first scanning connecting portion is further electrically connected to the third scanning transmission line through the fourth scanning through holes; and
- the third conductive layer further comprises the third light-emitting transmission lines located in the first non-display area, and the light-emitting control lines which are electrically connected to one another are directly electrically connected to one of the third light-emitting transmission lines;

or wherein the plurality of scanning transmission lines comprise: a plurality of fourth scanning transmission lines, and the light-emitting transmission lines comprise a plurality of fourth light-emitting transmission lines;
- the fourth conductive layer comprises the plurality of fourth light-emitting transmission lines located in the first non-display area;
- the interlayer dielectric layer comprises a plurality of fourth light-emitting through holes;
- the light-emitting control lines which are electrically connected to one another correspond to one of the fourth light-emitting transmission lines, and the first light-emitting connecting portion is further electrically connected to the fourth light-emitting transmission line through the fourth light-emitting through holes; and
- the third conductive layer further comprises the fourth scanning transmission lines located in the first non-display area, and the first scanning lines and the second scanning lines which are electrically connected to one another are directly electrically connected to one of the fourth scanning transmission lines.

* * * * *